United States Patent
Yoshitake et al.

(10) Patent No.: US 10,572,990 B2
(45) Date of Patent: Feb. 25, 2020

(54) PATTERN INSPECTION APPARATUS, PATTERN POSITION MEASUREMENT APPARATUS, AERIAL IMAGE MEASUREMENT SYSTEM, METHOD FOR MEASURING AERIAL IMAGE, PATTERN POSITION REPAIRING APPARATUS, METHOD FOR REPAIRING PATTERN POSITION, AERIAL IMAGE DATA PROCESSING APPARATUS, METHOD FOR PROCESSING AERIAL IMAGE DATA, PATTERN EXPOSURE APPARATUS, METHOD FOR EXPOSING PATTERN, METHOD FOR MANUFACTURING MASK, AND MASK MANUFACTURING SYSTEM

(71) Applicant: NuFlare Technology, Inc., Yokohama-shi (JP)

(72) Inventors: Shusuke Yoshitake, Yokohama (JP); Manabu Isobe, Hiratsuka (JP); Thomas Scheruebl, Jena (DE); Dirk Beyer, Weimar (DE); Sven Heisig, Leipzig (DE)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/482,243

(22) Filed: Apr. 7, 2017

(65) Prior Publication Data

US 2018/0293720 A1 Oct. 11, 2018

(51) Int. Cl.
*G03F 1/42* (2012.01)
*G06T 7/00* (2017.01)
(Continued)

(52) U.S. Cl.
CPC ............... *G06T 7/001* (2013.01); *G03F 1/42* (2013.01); *G03F 1/70* (2013.01); *G03F 1/72* (2013.01);
(Continued)

(58) Field of Classification Search
CPC ..... G06T 7/12; G06T 7/74; G03F 1/42; G03F 1/70; G03F 1/72; G03F 1/84; G03F 7/20; H01L 21/0274; H01L 21/67259
(Continued)

(56) References Cited

U.S. PATENT DOCUMENTS

| 2011/0188734 A1* | 8/2011 | Tsuchiya | G06T 7/0002 |
| | | | 382/149 |
| 2012/0140060 A1* | 6/2012 | Tsuchiya | G01N 21/95607 |
| | | | 348/126 |

(Continued)

OTHER PUBLICATIONS

Office Action dated Dec. 12, 2018 in counterpart Taiwanese Application No. 106122266, along with an English translation.
(Continued)

*Primary Examiner* — Isiaka O Akanbi
(74) *Attorney, Agent, or Firm* — Oblon, McClelland, Maier & Neustadt, L.L.P.

(57) ABSTRACT

A pattern inspection apparatus includes: an optical image acquiring mechanism to acquire optical image data of a corresponding divided pattern for each of masks for multiple patterning has been formed; a position deviation map generating processing circuitry to generate position deviation maps regarding the corresponding divided pattern; a difference position value map generating processing circuitry to generate one difference position value map defining a difference value between relative position deviation amounts of the each minimum element of the position deviation maps; a region specifying processing circuitry to specify at least one region having the difference value exceeding a threshold
(Continued)

of distance between patterns laying side-by-side by using the difference position value map; and an output mechanism to output at least coordinates, a type of defect, and information of a reference image of each region specified for the each region specified.

11 Claims, 19 Drawing Sheets

(51) Int. Cl.

| | | |
|---|---|---|
| G06T 7/12 | (2017.01) | |
| G06T 7/73 | (2017.01) | |
| G03F 1/70 | (2012.01) | |
| G03F 1/72 | (2012.01) | |
| G03F 1/84 | (2012.01) | |
| G03F 7/20 | (2006.01) | |
| H01L 21/027 | (2006.01) | |
| H01L 21/67 | (2006.01) | |

(52) U.S. Cl.
CPC .................. *G03F 1/84* (2013.01); *G03F 7/20* (2013.01); *G06T 7/12* (2017.01); *G06T 7/74* (2017.01); *H01L 21/0274* (2013.01); *H01L 21/67259* (2013.01); *G06T 2207/10016* (2013.01); *G06T 2207/10032* (2013.01); *G06T 2207/10148* (2013.01); *G06T 2207/10152* (2013.01); *G06T 2207/30148* (2013.01); *G06T 2207/30204* (2013.01)

(58) Field of Classification Search
USPC ..................................... 356/401, 237.2–237.6
See application file for complete search history.

(56) References Cited

U.S. PATENT DOCUMENTS

| | | | | |
|---|---|---|---|---|
| 2013/0044205 | A1* | 2/2013 | Matsumoto | G06K 9/00 348/86 |
| 2013/0216120 | A1* | 8/2013 | Inoue | G06T 7/0004 382/144 |
| 2013/0250095 | A1* | 9/2013 | Inoue | G06T 7/0004 348/94 |
| 2014/0300893 | A1* | 10/2014 | Ogawa | G01N 21/9501 356/239.1 |
| 2014/0307254 | A1* | 10/2014 | Yamashita | G01N 21/95607 356/237.5 |
| 2015/0204796 | A1* | 7/2015 | Nagahama | G01N 21/8806 356/237.5 |

OTHER PUBLICATIONS

Office Action dated Sep. 23, 2019 in corresponding Korean Patent Application No. 10-2018-0033944 (with English Translation), 26 pages.

\* cited by examiner

PATTERN INSPECTION APPARATUS, PATTERN POSITION MEASUREMENT APPARATUS, AERIAL IMAGE MEASUREMENT SYSTEM, METHOD FOR MEASURING AERIAL IMAGE, PATTERN POSITION REPAIRING APPARATUS, METHOD FOR REPAIRING PATTERN POSITION, AERIAL IMAGE DATA PROCESSING APPARATUS, METHOD FOR PROCESSING AERIAL IMAGE DATA, PATTERN EXPOSURE APPARATUS, METHOD FOR EXPOSING PATTERN, METHOD FOR MANUFACTURING MASK, AND MASK MANUFACTURING SYSTEM

BACKGROUND OF THE INVENTION

Field of the Invention

The present invention relates to a pattern inspection apparatus, an aerial image measurement system, a method for measuring an aerial image, a pattern position repairing apparatus, a method for repairing a pattern position, an aerial image data processing apparatus, a method of processing an aerial image data, a pattern exposure apparatus, a method for exposing a pattern, a method for manufacturing a mask, and a mask manufacturing system, and more particularly, to an apparatus and a method for inspecting a mask on which a pattern divided into a plurality of parts for multiple patterning is formed.

Related Art

A lithographic technology responsible for the progress of micronization of semiconductor devices is a very important process for generating a unique pattern among the semiconductor manufacturing processes. Recently, in accordance with highly dense integration of LSI, the circuit line width required for a semiconductor device decreases every year. In order to form a desired circuit pattern in such a semiconductor device, a plate with highly precise design pattern (also called a reticle or mask) is necessary.

Here, in accordance with the micronization of the circuit line width, while an exposure light source having a shorter wavelength is required, for example, as an extendible technique for ArF immersion, double patterning technique has attracted attention in recent years. The double patterning is a technique for exposing a wafer coated with a resist using a first mask, coating the wafer with a resist again after the developing process, the etching process, and the like, and exposing the same area of the wafer using a second mask. Such a technology has an advantage of being able to be used as an extension of the current technology. In such a technology, in order to acquire a desired pattern on a wafer, two masks are required. Instead of using two masks, a case may be considered in which three or more masks are used. In other words, multiple patterning including double patterning has been proposed.

According to the extendible means of the ArF immersion, the wavelength of the exposure light source is not changed but is 193 nm, and accordingly, there is no change in the resolution. In other words, according to the extendible technique such as the double-patterning, while the size of the pattern formed on the wafer decreases according to the processing technology, the pattern line width of the mask is limited by the resolution of the exposure light source. However, in accordance with the micronization of the wafer circuit line width, the sensitivity for a defect of the pattern on the mask becomes strict, and accordingly, depending on the pattern shape, a defect dimension to be detected is very small. For this reason, it is necessary to increase the performance of a pattern inspection apparatus inspecting a defect of a lithographic mask used for manufacturing the LSI.

As an inspection technique, an inspection method has been known in which an optical image acquired by capturing a pattern formed on a mask used for lithography at a predetermined magnification using an optical zoom system is compared with designed data or an optical image acquired by capturing the same pattern on the mask. For example, as the pattern inspection method, there are a "die-to-die (die-die) inspection" for comparing optical image data acquired by capturing the same pattern located at mutually-different places on the same mask and a "die-to-database (die-database) inspection" for inputting drawing data (designed pattern data) acquired by converting pattern-design CAD data into a device input format used for input by a drawing device when a pattern is formed on a mask to a pattern inspection apparatus, generating designed image data (reference image) based thereon, and comparing the designed image data with an optical image data acquired by capturing the pattern. In an inspection method used in such a pattern inspection apparatus, a mask is mounted on a stage, and a light beam scans the entire mask as the stage moves, whereby the inspection is performed. A light beam is emitted to the mask by a light source and an illumination optical system. Light that is transmitted through the mask or reflected from the mask forms an image on a sensor through the optical system. An image captured by the sensor is fed to a pattern comparison circuit as measured data. After the position adjustment between images, the pattern comparison circuit compares the measured data with the reference data by employing an appropriate algorithm and determines the presence of a pattern defect in the case of no match.

In the pattern inspection, in addition to a pattern defect (shape defect) inspection, a measurement of a position deviation of the pattern is required. For measurement of a pattern position, a pattern position measurement device which is an exclusive measurement device is used. The pattern position measurement device can move the mask mounted on the stage highly accurately controlled to the illumination optical system, after defining a reference of a pattern of a mask to be measured by alignment operation by using a mark included in a pattern, to acquire an optical image including an arbitrary pattern specified in advance as a condition for measurement, and can acquire a position of the pattern with respect to the pattern reference included in the acquired image.

Such a measurement device exclusive for a use of measuring a pattern position deviation can measure the pattern position highly accurately. However, the device measures the patterns one by one with a limited field of view of a measurement device. Therefore, total measurement time becomes longer by increasing the number of measurement points. In addition, the position deviation of the coordinates defined by each specific pattern on the entire mask as a total sum of local position deviations measured with extremely high accuracy can be measured. However, in such a case, a position deviation of a pattern located far from the specific patterns cannot be measured. Recently, a final target pattern dimension decreases, and accordingly, there is concern that a local position deviation of a pattern on a mask causes a defect on a final wafer pattern. For this reason, at the time of performing a pattern defect inspection, in a case where a position deviation of the inspected pattern can be measured at high accuracy together, the inspection accuracy becomes high, and there are significant advantages in terms of costs and an inspection time. For this reason, the number of requests for the inclusion of such a measurement function in a pattern inspection apparatus has increased. Under the current situation, a pattern inspection apparatus can measure position deviations of all patterns in a specific region to be inspected. However, a pattern position measurement device exclusive for a use of calculation of pattern positions on an entire mask is superior in terms of accuracy in each mask position deviation which is acquired for each.

However, incase where the multiple patterning is executed, as described above, at least two masks are required. Even when an abnormality is not detected in a case where such a pattern inspection is made by a pattern inspection apparatus by using each mask, there are cases where the positional accuracy is influenced according to superimposition of the mask patterns. As a result, there is concern that a defect in a pattern printed onto the wafer may be caused.

BRIEF SUMMARY OF THE INVENTION

According to one aspect of the present invention, a pattern inspection apparatus includes:

an optical image acquiring mechanism configured to acquire optical image data of a corresponding divided pattern for each of a plurality of masks on each of which the corresponding divided pattern of divided patterns acquired by dividing a pattern into a plurality of parts for multiple patterning has been formed, the each of the plurality of masks being aligned to the coordinate defined by alignment marks formed as a part of the corresponding divided pattern;

a position deviation map generating processing circuitry configured to generate position deviation maps in each of which a position deviation at a center coordinate of each minimum element of a corresponding map of the position deviation maps is defined regarding the corresponding divided pattern formed on a corresponding mask of the plurality of masks, the position deviation at the center coordinate of the each minimum element being represented as a deviation from the coordinate defined by the alignment marks formed as the part of the corresponding divided pattern formed on the each of the plurality of masks, by using a position deviation amount of the corresponding divided pattern acquired by comparing the optical image data of the corresponding divided pattern formed on each of the plurality of masks with design pattern data of the corresponding divided pattern formed on each of the plurality of masks each aligned to the coordinate defined by the alignment marks;

a difference position value map generating processing circuitry configured to generate one difference position value map defining a difference value between relative position deviation amounts of the each minimum element of the position deviation maps each aligned with the alignment marks as a reference acquired by comparing the optical image data and the design pattern data of the corresponding divided pattern, corresponding to the plurality of the masks each having the corresponding divided pattern formed thereon;

a region specifying processing circuitry configured to specify at least one region having the difference value exceeding a threshold of distance between patterns laying side-by-side by using the difference position value map; and an output mechanism configured to output at least coordinates, a type of defect, and information of a reference image of each region specified for the each region specified.

According to another aspect of the present invention, a pattern position measurement apparatus includes:

an optical image acquiring mechanism configured to acquire optical image data of a corresponding divided pattern for each of a plurality of masks on each of which the corresponding divided pattern of divided patterns acquired by dividing a pattern into a plurality of parts for multiple patterning has been formed, the each of the plurality of masks being aligned to the coordinate defined by alignment marks formed as a part of the corresponding divided pattern;

a pattern position measurement processing circuitry configured to measure, as a pattern position, a position of a center of gravity of a pattern acquired from position information of an arbitral pattern edge designated in advance as a measuring condition, by using the optical image data of the corresponding divided pattern formed on each of the plurality of masks being aligned to the coordinate defined by the alignment marks acquired by the pattern image acquiring mechanism;

a position deviation map generating processing circuitry configured to generate position deviation maps in each of which a position deviation at a center coordinate of each minimum element of a corresponding map of the position deviation maps is defined regarding the corresponding divided pattern formed on a corresponding mask of the plurality of masks, the position deviation at the center coordinate of the each minimum element being represented as a deviation from the coordinate defined by the alignment marks formed as the part of the corresponding divided pattern formed on the each of the plurality of masks, by using a position deviation amount of the corresponding divided pattern acquired by comparing a position of a pattern acquired from the optical image data of the corresponding divided pattern formed on each of the plurality of masks with a position of a pattern acquired from design pattern data of the corresponding divided pattern formed on each of the plurality of masks each aligned to the coordinate defined by the alignment marks;

a difference position value map generating processing circuitry configured to generate one difference position value map defining a difference value between relative position deviation amounts of the each minimum element of the position deviation maps each aligned with the alignment marks as a reference acquired by comparing the optical image data and the design pattern data of the corresponding divided pattern, corresponding to the plurality of the masks each having the corresponding divided pattern formed thereon;

a region specifying processing circuitry configured to specify at least one region having the difference value exceeding a threshold of distance between patterns laying side-by-side by using the difference position value map; and an output mechanism configured to output at least design coordinates of the objective patterns for pattern position measurement, position deviation of the measured pattern against the design position of the objective pattern, and information of a captured image of each region specified for the each region specified.

According to further another aspect of the present invention, an aerial image measurement system includes:

a storage device configured to receive position deviation maps each acquired by comparing optical image data of corresponding divided pattern with design pattern data of the corresponding divided pattern for each of a plurality of masks on each of which the corresponding divided pattern of divided patterns acquired by dividing a pattern into a plurality of parts for multiple patterning has been formed, the plurality of masks each being aligned to the coordinate defined by alignment marks formed as a part of the corresponding divided pattern, and specific region information output by a pattern inspection apparatus or a pattern position measurement apparatus capable of outputting the specific region information of a specific region having a difference value between relative position deviation amounts of each minimum element of the position deviation maps acquired from the plurality of masks on each of which the corresponding divided pattern has been formed exceeding a threshold of distance between patterns laying side-by-side as input and store the position deviation maps and the specific region information;

an image capturing mechanism configured to capture aerial images of the plurality of masks on each of which the corresponding divided pattern has been formed for the specific region specified based on the specific region information by using a plurality of illumination conditions and a plurality of focus conditions;

an output mechanism configured to output the aerial images for the specific region of the plurality of masks on each of which the corresponding divided pattern has been formed; and a calculation processing circuitry configured to calculate edge position information defining an edge position of a wafer pattern acquired through lithographic processes with the corresponding divided pattern for each of the plurality of masks, based on the aerial images of the plurality of masks captured for the specific region, wherein the aerial image measurement system is connected to a control computer including an exposure determining processing circuitry configured to determine whether or not an inter-pattern distance between the edge position of the wafer pattern of the corresponding divided pattern which has been formed on one of the plurality of masks and the edge position of the wafer pattern of the corresponding divided pattern which has been formed on another one of the plurality of masks calculated for the specific region is in an allowed range in a case where the edge position of the wafer pattern of the corresponding divided pattern which has been formed on the one of the plurality of masks and the edge position of the wafer pattern of the corresponding divided pattern which has been formed on the another one of the plurality of masks calculated for the specific region by the calculation processing circuitry is composed to be overlaid by using the alignment marks of the one of the plurality of masks and the alignment marks of the another one of the plurality of masks as a reference.

According to further aspect of the present invention, a method for measuring an aerial image, the method includes:

receiving specific region information output by a pattern inspection apparatus or a pattern position measurement apparatus capable of outputting the specific region information of a specific region having a difference value between relative position deviation amounts of each minimum element of position deviation maps each acquired by comparing optical image data of a corresponding divided pattern with design pattern data of the corresponding divided pattern for each of a plurality of masks on each of which the corresponding divided pattern of divided patterns acquired by dividing a pattern into a plurality of parts for multiple patterning has been formed, the plurality of masks each being aligned to the coordinate defined by alignment marks formed as a part of the corresponding divided pattern, exceeding a threshold of distance between patterns laying side-by-side as input;

capturing aerial images of the plurality of masks on each of which the corresponding divided pattern has been formed for the specific region specified based on the specific region information by using a plurality of illumination conditions and a plurality of focus conditions;

calculating edge position information defining an edge position of a wafer pattern acquired through lithographic processes with the corresponding divided pattern for each of the plurality of masks, based on measured aerial images of the plurality of masks, on each of which the corresponding divided pattern has been formed, captured for the specific region; and outputting the edge position information of the wafer pattern used for determining whether or not an inter-pattern distance between the edge position of the wafer pattern of the corresponding divided pattern which has been formed on one of the plurality of masks and the edge position of the wafer pattern of the corresponding divided pattern which has been formed on another one of the plurality of masks calculated for the specific region is in an allowed range in a case where the edge position of the wafer pattern of the corresponding divided pattern which has been formed on the one of the plurality of masks and the edge position of the wafer pattern of the corresponding divided pattern which has been formed on the another one of the plurality of masks calculated for the specific region is composed to be overlaid by using the alignment marks of the one of the plurality of masks and the alignment marks of the another one of the plurality of masks as a reference.

According to further aspect of the present invention, a pattern position repairing apparatus includes:

an aerial image measurement system including:

an output mechanism configured to output specific region information output by a pattern inspection apparatus or a pattern position measurement apparatus capable of outputting the specific region information of a specific region having a difference value between relative position deviation amounts of each minimum element of position deviation maps each acquired by comparing optical image data of a corresponding divided pattern and design pattern data of the corresponding divided pattern for each of a plurality of masks on each of which the corresponding divided pattern of divided patterns acquired by dividing a pattern into a plurality of parts for multiple patterning has been formed, the plurality of masks each being aligned to the coordinate defined by alignment marks formed as a part of the corresponding divided pattern, exceeding a threshold of distance between patterns laying side-by-side and aerial images of the plurality of masks, on each of which the corresponding divided pattern has been formed, captured for the specific region specified based on the specific region information by using a plurality of illumination conditions and a plurality of focus conditions; and a calculation processing circuitry configured to calculate edge position information defining an edge position of a wafer pattern acquired through lithographic processes with the corresponding divided pattern for each of the plurality of masks, based on the aerial images of the plurality of masks captured for the specific region of each of the divided patterns;

a control computer including:
  an inter-pattern distance determination processing circuitry used for determining whether or not an inter-pattern distance between the edge position of one of a plurality of wafer patterns and the edge position of another one of the plurality of wafer patterns in the specific region is in an allowed range in a case where the edge position of the one of the plurality of wafer patterns and the edge position of the another one of the plurality of wafer patterns in the specific region calculated by the calculation processing circuitry is composed so as to be overlaid by using the alignment marks of one of the plurality of masks and the alignment marks of another one of the plurality of masks as a reference;
  a repairing mechanism configured to repair center positions of the defected patterns in the specific region, the defected patterns being a part of the corresponding divided pattern to be arranged in the specific region and being formed on each of the plurality of masks, by repairing the edge position of the corresponding divided pattern formed on at least one mask of the plurality of masks by repairing a shape of the corresponding divided pattern formed on the at least one mask on which the defected patterns are formed using a charged particle beam, the at least one mask of the plurality of masks being selected by the control computer including the inter-pattern distance determination processing circuitry, for the specific region having the inter-pattern distance between the edge position of the one of the plurality of wafer patterns and the edge position of the another one of the plurality of wafer patterns in the specific region determined to be out of the allowed range by the inter-pattern distance determination processing circuitry; and
  an output mechanism configured to acquire and output a secondary electron image generated due to a charged particle beam for the defected patterns repaired after repairing a shape of the corresponding divided pattern formed on the at least one mask.

According to further aspect of the present invention, a method for repairing a pattern position, the method includes using a pattern position repairing apparatus including a repairing mechanism capable of repairing center positions of the defected patterns in a specific region, the defected patterns being a part of a corresponding divided pattern to be arranged in the specific region and being formed on each of a plurality of masks, by repairing edge position of the corresponding divided pattern formed on at least one mask of the plurality of masks by repairing a shape of the corresponding divided pattern formed on the at least one mask on which the defected patterns are formed using a charged particle beam, for the specific region being determined to be out of an allowed range by a control computer capable of determining whether or not an inter-pattern distance between an edge position of one of a plurality of wafer patterns and the edge position of another one of the plurality of wafer patterns in the specific region is in the allowed range in a case where the edge position of the one of the plurality of wafer patterns and the edge position of the another one of the plurality of wafer patterns in the specific region is composed so as to be overlaid by using alignment mark of one of the plurality of masks and the alignment marks of another one of the plurality of masks as a reference based on:
  specific region information output by a pattern inspection apparatus or a pattern position measurement apparatus capable of outputting the specific region information of a specific region having a difference value between relative position deviation amounts of each minimum element of position deviation maps each acquired by comparing optical image data of a corresponding divided pattern and design pattern data of the corresponding divided pattern for each of the plurality of masks on each of which the corresponding divided pattern of divided patterns acquired by dividing a pattern into a plurality of parts for multiple patterning has been formed, the plurality of masks each being aligned to the coordinate defined by the alignment marks formed as a part of the corresponding divided pattern, exceeding a threshold of distance between patterns laying side-by-side;
  aerial images captured for the specific region specified output by an aerial image measurement system capable of outputting
    the aerial images of the plurality of masks, on each of which the corresponding divided pattern has been formed, captured for the specific region specified based on the specific region information by using a plurality of illumination conditions and a plurality of focus conditions and
    edge position information defining an edge position of a wafer pattern acquired through lithographic processes with the corresponding divided pattern for each of the plurality of masks, based on the aerial images of the plurality of masks captured for the specific region of each of the divided patterns; and
  the edge position information of each wafer pattern in the divided patterns formed on the plurality of masks, output by the aerial image measurement system.

According to further aspect of the present invention, an aerial image data processing apparatus includes:
  a storage device configured to receive and store
  specific region information output by a pattern inspection apparatus or a pattern position measurement apparatus capable of outputting the specific region information of a specific region having a difference value between relative position deviation amounts of each minimum element of position deviation maps each acquired by comparing optical image data of a corresponding divided pattern and design pattern data of the corresponding divided pattern for each of a plurality of masks on each of which the corresponding divided pattern of divided patterns acquired by dividing a pattern into a plurality of parts for multiple patterning has been formed, the plurality of masks each being aligned to the coordinate defined by alignment marks formed as a part of the corresponding divided pattern, exceeding a threshold of distance between patterns laying side-by-side,
  aerial images of the plurality of masks captured for the specific region specified based on the specific region information by using a plurality of illumination conditions and a plurality of focus conditions, and
  edge position information defining an edge position of a wafer pattern acquired through lithographic processes with the corresponding divided pattern for each of the plurality of masks, calculated based on the aerial images of the plurality of masks captured for the specific region of each of the divided patterns;
  an inter-pattern distance determination processing circuitry configured to determine whether or not an inter-pattern distance between the edge position of the wafer pattern of the corresponding divided pattern which has been formed on one of the plurality of masks and the edge position of the wafer pattern of the corresponding divided pattern which has been formed on another one of the plurality of masks calculated in the specific region is in an allowed range in a case where the edge position of the wafer pattern of the corresponding divided pattern which has been formed on the one of the plurality of masks and the edge position of the wafer pattern of the corresponding divided pattern which has been formed on the another one of the plurality of masks calculated in the specific region is composed so as to be overlaid by using the alignment marks of the one of the plurality of masks and the alignment marks of the another one of the plurality of masks as a reference; and an output mechanism configured to output information of each combination of an illumination condition and a focus condition for the divided patterns formed on the plurality of masks so that the inter-pattern distance between the edge position of the wafer pattern of the corresponding divided pattern which has been formed on the one of the plurality of masks and the edge position of the wafer pattern of the corresponding divided pattern which has been formed on the another one of the plurality of masks is determined to be within the allowed range by the inter-pattern distance determination processing circuitry.

According to further aspect of the present invention, a method for processing aerial image data, the method includes:

receiving specific region information output by a pattern inspection apparatus or a pattern position measurement apparatus capable of outputting the specific region information of a specific region having a difference value between relative position deviation amounts of each minimum element of position deviation maps each acquired by comparing optical image data of a corresponding divided pattern and design pattern data of the corresponding divided pattern for each of a plurality of masks on each of which the corresponding divided pattern of divided patterns acquired by dividing a pattern into a plurality of parts for multiple patterning has been formed, the plurality of masks each being aligned to the coordinate defined by alignment marks formed as a part of the corresponding divided pattern, exceeding a threshold of distance between patterns laying side-by-side;

capturing aerial images for the specific region specified based on the specific region information by using a plurality of illumination conditions and a plurality of focus conditions;

calculating edge position information defining an edge position of a wafer pattern acquired through lithographic processes with the corresponding divided pattern for each of the plurality of masks, based on the aerial images of the plurality of masks captured for the specific region of each of the divided patterns;

determining whether or not an inter-pattern distance between the edge position of the wafer pattern of the corresponding divided pattern which has been formed on one of the plurality of masks and the edge position of the wafer pattern of the corresponding divided pattern which has been formed on another one of the plurality of masks calculated in the specific region is in an allowed range in a case where the edge position of the wafer pattern of the corresponding divided pattern which has been formed on the one of the plurality of masks and the edge position of the wafer pattern of the corresponding divided pattern which has been formed on the another one of the plurality of masks calculated in the specific region is composed so as to be overlaid by using the alignment marks of the one of the plurality of masks and the alignment marks of the another one of the plurality of masks as a reference; and outputting information of each combination of an illumination condition and a focus condition for the divided patterns formed on the plurality of masks so that the inter-pattern distance between the edge position of the wafer pattern of the corresponding divided pattern which has been formed on the one of the plurality of masks and the edge position of the wafer pattern of the corresponding divided pattern which has been formed on the another one of the plurality of masks is determined to be within the allowed range.

According to further aspect of the present invention, a pattern exposure apparatus includes:

a storage device configured to receive and store information of combinations of an illumination condition and a focus condition each of which can be applicable to one of divided patterns acquired by dividing a pattern into a plurality of parts for multiple patterning and formed on a plurality of masks, the combinations being combinations of an illumination condition and a focus condition so that an inter-pattern distance between an edge position of a wafer pattern of the one of the divided patterns and an edge position of a wafer pattern of the another one of the divided patterns is determined to be within an allowed range in a case where edge positions of wafer patterns calculated based on aerial images of the divided patterns captured using a plurality of illumination conditions and a plurality of focus condition for the plurality of masks is composed to be overlaid by using alignment marks drawn as parts of the divided patterns; and an exposure mechanism configured to execute exposure with the illumination condition or the focus condition for each of the plurality of masks used for the exposure being limited based on the information of the combinations in a case that the pattern is printed to a wafer by using a multiple-patterning technique by using the plurality of masks.

According to further aspect of the present invention, a method for exposing a pattern, the method includes:

receiving information of combinations of an illumination condition and a focus condition for each of which can be applicable to one of divided patterns acquired by dividing a pattern into a plurality of parts for multiple patterning and formed on a plurality of masks, the combinations being combinations of an illumination condition and a focus condition so that an inter-pattern distance between an edge position of a wafer pattern of the one of the divided patterns and an edge position of a wafer pattern of the another one of the divided patterns is determined to be within an allowed range in a case where edge positions of wafer patterns calculated based on aerial images of the divided patterns captured using a plurality of illumination conditions and a plurality of focus conditions for the plurality of masks is composed to be overlaid by using alignment marks drawn as parts of the divided patterns; and executing exposure with the illumination conditions or the focus conditions for each of the plurality of masks used for the exposure being limited based on the information of the combinations in a case that the pattern is printed to a wafer by using a multiple-patterning technique by using the plurality of masks.

According to further aspect of the present invention, a method for manufacturing a mask on which a corresponding divided pattern of divided patterns acquired by dividing a pattern into a plurality of parts for multiple patterning is formed, the method includes:

receiving specific region information output by a pattern inspection apparatus or a pattern position measurement apparatus capable of outputting the specific region information of a specific region having a difference value between relative position deviation amounts of each minimum element of position deviation maps each acquired by comparing optical image data of a corresponding divided pattern with design pattern data of the corresponding divided pattern for each of a plurality of masks on each of which the corresponding divided pattern of divided patterns acquired by dividing a pattern into a plurality of parts for multiple patterning has been formed, the plurality of masks each being aligned to the coordinate defined by alignment marks formed as a part of the corresponding divided pattern, exceeding a threshold of distance between patterns laying side-by-side as input;

capturing aerial images of the plurality of masks on each of which the corresponding divided pattern has been formed for the specific region specified based on the specific region information by using a plurality of illumination conditions and a plurality of focus conditions;

calculating edge position information defining an edge position of a wafer pattern acquired through lithographic processes with the corresponding divided pattern for each of the plurality of masks, based on aerial images of the plurality of masks, on each of which the corresponding divided pattern has been formed, captured for the specific region;

determining whether or not an inter-pattern distance between the edge position of the wafer pattern of the corresponding divided pattern which has been formed on one of the plurality of masks and the edge position of the wafer pattern of the corresponding divided pattern which has been formed on another one of the plurality of masks calculated for the specific region is in an allowed range in a case where the edge position of the wafer pattern of the corresponding divided pattern which has been formed on the one of the plurality of masks and the edge position of the wafer pattern of the corresponding divided pattern which has been formed on the another one of the plurality of masks is composed to be overlaid by using the alignment marks of the one of the plurality of masks and the alignment marks of the another one of the plurality of masks as a reference; and outputting information of each combination of an illumination condition and a focus condition for the divided patterns formed on the plurality of masks so that the inter-pattern distance between the edge position of the wafer pattern of the corresponding divided pattern which has been formed on the one of the plurality of masks and the edge position of the wafer pattern of the corresponding divided pattern which has been formed on the another one of the plurality of masks is determined to be within the allowed range.

According to further aspect of the present invention, a mask manufacturing system includes:

a pattern inspection apparatus including:

an optical image acquiring mechanism configured to acquire optical image data of a corresponding divided pattern for each of a plurality of masks on each of which the corresponding divided pattern of divided patterns acquired by dividing a pattern into a plurality of parts for multiple patterning has been formed, the each of the plurality of masks being aligned to the coordinate defined by alignment marks formed as a part of the corresponding divided pattern;

a position deviation map generating processing circuitry configured to generate position deviation maps in each of which a position deviation at a center coordinate of each minimum element of a corresponding map of the position deviation maps is defined regarding the corresponding divided pattern formed on a corresponding mask of the plurality of masks, the position deviation at the center coordinate of the each minimum element being represented as a deviation from the coordinate defined by the alignment marks formed as the part of the corresponding divided pattern formed on the each of the plurality of masks, by using a position deviation amount of the corresponding divided pattern acquired by comparing the optical image data of the corresponding divided pattern formed on each of the plurality of masks with design pattern data of the corresponding divided pattern formed on each of the plurality of masks each aligned to the coordinate defined by the alignment marks;

a difference position value map generating processing circuitry configured to generate one difference position value map defining a difference value between relative position deviation amounts of the each minimum element of the position deviation maps each aligned with the alignment marks as a reference acquired by comparing the optical image data and the design pattern data of the corresponding divided pattern, corresponding to the plurality of the masks each having the corresponding divided pattern formed thereon;

a region specifying processing circuitry configured to specify at least one specific region having the difference value exceeding a threshold of distance between patterns laying side-by-side by using the difference position value map; and an output mechanism configured to output specific region information of at least coordinates, a type of defect, and information of a reference image of each specific region specified for the each specific region specified;

an aerial image measurement system including:

a storage device configured to receive the specific region information output from the pattern inspection apparatus as input and store the specific region information;

an image capturing mechanism configured to capture aerial images of the plurality of masks on each of which the corresponding divided pattern has been formed for the specific region specified based on the specific region information by using a plurality of illumination conditions and a plurality of focus conditions;

an output mechanism configured to output the aerial images for the specific region of the plurality of masks on each of which the corresponding divided pattern has been formed; and a calculation processing circuitry configured to calculate edge position information defining an edge position of a wafer pattern acquired through lithographic processes with the corresponding divided pattern for each of the plurality of masks, based on the aerial images of the plurality of masks captured for the specific region, wherein the aerial image measurement system is connected to a control computer including an exposure determining processing circuitry configured to determine whether or not an inter-pattern distance between the edge position of the wafer pattern of the corresponding divided pattern which has been formed on one of the plurality of masks and the edge position of the wafer pattern of the corresponding divided pattern which has been formed on another one of the plurality of masks calculated for the specific region is in an allowed range in a case where the edge position of the wafer pattern of the corresponding divided pattern which has been formed on the one of the plurality of masks and the edge position of the wafer pattern of the corresponding divided pattern which has been formed on the another one of the plurality of masks calculated for the specific region by the calculation processing circuitry is composed to be overlaid by using the alignment marks of the one of the plurality of masks and the alignment marks of the another one of the plurality of masks as a reference;

a data managing apparatus including:

a data recording device capable of storing information output from the pattern inspection apparatus and the aerial image measurement system for the plurality of masks; and a pattern position repairing apparatus including:

a storage device configured to receive and store information of the divided patterns acquired by dividing the pattern into the plurality of parts for the multiple patterning and formed on the plurality of masks, selected arbitrary by the data managing apparatus and the edge position information defining the edge position of the wafer pattern acquired through lithographic processes with the corresponding divided pattern for the each of the plurality of masks, based on the aerial images of the plurality of masks captured for the specific region by the aerial image measurement system;

an inter-pattern distance determination processing circuitry configured to select data of the divided patterns formed on the plurality of masks and determine a repairability of a pattern shape for at least one mask among the plurality of masks on each of which the corresponding divided pattern of the divided patterns has been formed, based on the edge position information of the wafer pattern calculated in the plurality of illumination conditions and the plurality of focus conditions in a case where an inter-pattern distance between the edge position of the wafer pattern of the corresponding divided pattern which has been formed on the one of the plurality of masks and the edge position of the wafer pattern of the corresponding divided pattern which has been formed on the another one of the plurality of masks is determined to be out of the allowed range in the plurality of illumination conditions and the plurality of focus conditions, the edge position of the wafer pattern of the corresponding divided pattern which has been formed on the one of the plurality of masks and the edge position of the wafer pattern of the corresponding divided pattern which has been formed on the another one of the plurality of masks calculated for the specific region being composed to be overlaid by using the alignment marks of the one of the plurality of masks and the alignment marks of the another one of the plurality of masks as a reference;

a repairing mechanism configured to repair some edge positions of the defected patterns in the specific region, the defected patterns being a part of the corresponding divided pattern to be arranged in the specific region and being formed on each of the plurality of masks, by repairing a shape of the corresponding divided pattern formed on the at least one mask by using a charged particle beam for the at least one mask determined to be repairable based on information of the each of the defected patterns formed on the plurality of masks and configuring the specific region, and the edge position information defining the edge position of the wafer pattern for each of the plurality of masks, calculated based on the aerial images; and an output mechanism configured to acquire a secondary electron image generated due to a charged particle beam for the defected patterns repaired and output the secondary electron image after the repairing, wherein the data recording device can further store output data of the pattern position repairing apparatus.

According to further aspect of the present invention, a method for manufacturing a mask, the method includes:

acquiring optical image data of a corresponding divided pattern for each of a plurality of masks on each of which the corresponding divided pattern of divided patterns acquired by dividing a pattern into a plurality of parts for multiple patterning has been formed, the each of the plurality of masks being aligned to the coordinate defined by alignment marks formed as a part of the corresponding divided pattern by using a pattern inspection apparatus;

generating position deviation maps in each of which a position deviation at a center coordinate of each minimum element of a corresponding map of the position deviation maps is defined regarding the corresponding divided pattern formed on a corresponding mask of the plurality of masks, the position deviation at the center coordinate of the each minimum element being represented as a deviation from the coordinate defined by the alignment marks formed as the part of the corresponding divided pattern formed on the each of the plurality of masks, by using a position deviation amount of the corresponding divided pattern acquired by comparing the optical image data of the corresponding divided pattern formed on each of the plurality of masks with design pattern data of the corresponding divided pattern formed on each of the plurality of masks each aligned to the coordinate defined by the alignment marks by using the pattern inspection apparatus;

generating a difference position value map defining a difference value between relative position deviation amounts of the each minimum element of the position deviation maps each aligned with the alignment marks as a reference acquired by comparing the optical image data and the design pattern data of the corresponding divided pattern, corresponding to the plurality of the masks each having the corresponding divided pattern formed thereon by using the pattern inspection apparatus;

specifying at least one specific region having the difference value exceeding a threshold of distance between patterns laying side-by-side using the difference position value map by using the pattern inspection apparatus;

outputting specific region information of at least coordinates, a type of defect, and information of a reference image of each specific region specified for the each specific region by using the pattern inspection apparatus;

storing the specific region information of the specific region output from the pattern inspection apparatus for the plurality of masks on each of which the corresponding divided pattern of divided patterns acquired by dividing a pattern into a plurality of parts for multiple patterning has been formed by using an aerial image measurement system;

capturing aerial images of the plurality of masks for the specific region specified based on the specific region information by using a plurality of illumination conditions and a plurality of focus conditions by using the aerial image measurement system;

calculating edge position information defining an edge position of a wafer pattern acquired through lithographic processes with the corresponding divided pattern for each of the plurality of masks, based on the aerial images of the plurality of masks captured for the specific region by using the aerial image measurement system;

determining whether or not an inter-pattern distance between the edge position of the wafer pattern of the corresponding divided pattern which has been formed on one of the plurality of masks and the edge position of the wafer pattern of the corresponding divided pattern which has been formed on another one of the plurality of masks calculated for the specific region is in an allowed range in a case where the edge position of the wafer pattern of the corresponding divided pattern which has been formed on the one of the plurality of masks and the edge position of the wafer pattern of the corresponding divided pattern which has been formed on the another one of the plurality of masks calculated for the specific region is composed to be overlaid by using the alignment marks of the one of the plurality of masks and the alignment marks of the another one of the plurality of masks as a reference by using the aerial image measurement system, and repairing some edge positions of the defected patterns in the specific region, the defected patterns being a part of the corresponding divided pattern to be arranged in the specific region and being formed on each of the plurality of masks, by repairing a shape of the corresponding divided pattern formed on the at least one mask by using a charged particle beam for the at least one mask determined to be repairable based on information of the each of the defected patterns formed on the plurality of masks and configuring the specific region, and the edge position information defining the edge position of the wafer pattern for each of the plurality of masks, calculated based on the aerial images by using a pattern position repairing apparatus.

According to further aspect of the present invention, a method for manufacturing a mask, the method includes:

acquiring optical image data of a corresponding divided pattern for each of a plurality of masks on each of which the corresponding divided pattern of divided patterns acquired by dividing a pattern into a plurality of parts for multiple patterning has been formed, the each of the plurality of masks being aligned to the coordinate defined by alignment marks formed as a part of the corresponding divided pattern by using a pattern position measurement apparatus and measuring, as a pattern position, a position of a center of gravity of a pattern acquired from position information of an arbitral pattern edge designated in advance as a measuring condition, in the optical image data of the corresponding divided pattern acquired by using the pattern position measurement apparatus;

generating position deviation maps in each of which a position deviation at a center coordinate of each minimum element of a corresponding map of the position deviation maps is defined regarding the corresponding divided pattern formed on a corresponding mask of the plurality of masks, the position deviation at the center coordinate of the each minimum element being represented as a deviation from the coordinate defined by the alignment marks formed as the part of the corresponding divided pattern formed on the each of the plurality of masks, by using a position deviation amount of the corresponding divided pattern acquired by comparing a position of the arbitral pattern included in the optical image data of the corresponding divided pattern formed on each of the plurality of masks with a position of a pattern acquired from design pattern data of the corresponding divided pattern formed on each of the plurality of masks each aligned to the coordinate defined by the alignment marks by using the pattern position measurement apparatus;

generating a difference position value map defining a difference value between relative position deviation amounts of the each minimum element of the position deviation maps each aligned with the alignment marks as a reference acquired by comparing the optical image data and the design pattern data of the corresponding divided pattern, corresponding to the plurality of the masks each having the corresponding divided pattern formed thereon by using the pattern position measurement apparatus;

specifying at least one specific region having the difference value exceeding a threshold of distance between patterns laying side-by-side using the difference position value map by using the pattern position measurement apparatus;

outputting specific region information of at least design coordinates of the objective patterns for pattern position measurement, position deviation of the measured pattern against the design position of the objective pattern, and information of a captured image of each specific region specified for the each specific region by using the pattern position measurement apparatus;

storing the specific region information of the specific region output from the pattern position measurement apparatus for the plurality of masks on each of which the corresponding divided pattern of divided patterns acquired by dividing a pattern into a plurality of parts for multiple patterning has been formed by using an aerial image measurement system;

capturing aerial images of the plurality of masks for the specific region specified based on the specific region information by using a plurality of illumination conditions and a plurality of focus conditions by using the aerial image measurement system;

calculating edge position information defining an edge position of a wafer pattern acquired through lithographic processes with the corresponding divided pattern for each of the plurality of masks, based on the aerial images of the plurality of masks captured for the specific region by using the aerial image measurement system;

determining whether or not an inter-pattern distance between the edge position of the wafer pattern of the corresponding divided pattern which has been formed on one of the plurality of masks and the edge position of the wafer pattern of the corresponding divided pattern which has been formed on another one of the plurality of masks calculated for the specific region is in an allowed range in a case where the edge position of the wafer pattern of the corresponding divided pattern which has been formed on the one of the plurality of masks and the edge position of the wafer pattern of the corresponding divided pattern which has been formed on the another one of the plurality of masks calculated for the specific region is composed to be overlaid by using the alignment marks of the one of the plurality of masks and the alignment marks of the another one of the plurality of masks as a reference by using the aerial image measurement system, and repairing some edge positions of the defected patterns in the specific region, the defected patterns being a part of the corresponding divided pattern to be arranged in the specific region and being formed on each of the plurality of masks, by repairing a shape of the corresponding divided pattern formed on the at least one mask by using a charged particle beam for the at least one mask determined to be repairable based on information of the each of the defected patterns formed on the plurality of masks and configuring the specific region, and the edge position information defining the edge position of the wafer pattern for each of the plurality of masks, calculated based on the aerial images by using a pattern position repairing apparatus.

According to further aspect of the present invention, a method for manufacturing a mask on which a corresponding divided pattern of divided patterns acquired by dividing a pattern into a plurality of parts for multiple patterning is formed, the method includes:

a step for capturing aerial images of a specific region common to a plurality of masks on each of which a corresponding divided pattern of divided patterns acquired by dividing a pattern into a plurality of parts for multiple patterning has been formed, by using a plurality of illumination conditions and a plurality of focus conditions by using an aerial image measurement system;

a step for calculating edge position information defining an edge position of a wafer pattern acquired through lithographic processes with the corresponding divided pattern for each of the plurality of masks, based on the aerial images of the plurality of masks captured for the specific region by using the aerial image measurement system;

a step for determining whether or not an inter-pattern distance between the edge position of the wafer pattern of the corresponding divided pattern which has been formed on one of the plurality of masks and the edge position of the wafer pattern of the corresponding divided pattern which has been formed on another one of the plurality of masks calculated for the specific region is in an allowed range in a case where the edge position of the wafer pattern of the corresponding divided pattern which has been formed on the one of the plurality of masks and the edge position of the wafer pattern of the corresponding divided pattern which has been formed on the another one of the plurality of masks calculated for the specific region is composed to be overlaid by using the alignment marks of the one of the plurality of masks and the alignment marks of the another one of the plurality of masks as a reference; and a step for repairing a shape of a defected pattern in the specific region of the corresponding divided pattern formed on at least one mask among the plurality of masks on each of which the corresponding divided pattern of divided patterns has been formed, using a charged particle beam in a case where the inter-pattern distance is determined to be out of the allowed range, in the step for determining whether or not the inter-pattern distance is in the allowed range by using a pattern position repairing apparatus, wherein each step is repeated at least two or more times.

According to further aspect of the present invention, a pattern exposure apparatus includes:

a storage device configured to receive and store:

output data from a pattern inspection apparatus including:

an optical image acquiring mechanism configured to acquire optical image data of a corresponding divided pattern for each of a plurality of masks on each of which the corresponding divided pattern of divided patterns acquired by dividing a pattern into a plurality of parts for multiple patterning has been formed, the each of the plurality of masks being aligned to the coordinate defined by alignment marks formed as a part of the corresponding divided pattern;

a position deviation map generating processing circuitry configured to generate position deviation maps in each of which a position deviation at a center coordinate of each minimum element of a corresponding map of the position deviation maps is defined regarding the corresponding divided pattern formed on a corresponding mask of the plurality of masks, the position deviation at the center coordinate of the each minimum element being represented as a deviation from the coordinate defined by the alignment marks formed as the part of the corresponding divided pattern formed on the each of the plurality of masks, by using a position deviation amount of the corresponding divided pattern acquired by comparing the optical image data of the corresponding divided pattern formed on each of the plurality of masks with design pattern data of the corresponding divided pattern formed on each of the plurality of masks each aligned to the coordinate defined by the alignment marks;

a difference position value map generating processing circuitry configured to generate one difference position value map defining a difference value between relative position deviation amounts of the each minimum element of the position deviation maps each aligned with the alignment marks as a reference acquired by comparing the optical image data and the design pattern data of the corresponding divided pattern, corresponding to the plurality of the masks each having the corresponding divided pattern formed thereon;

a region specifying processing circuitry configured to specify at least one specific region having the difference value exceeding a threshold of distance between patterns laying side-by-side by using the difference position value map; and an output mechanism configured to output specific region information of at least coordinates, a type of defect, and information of a reference image of each specific region specified for the each specific region specified;

output data from an aerial image measurement system including:

a storage device configured to receive the specific region information output from the pattern inspection apparatus as input and store the specific region information;

an image capturing mechanism configured to capture aerial images of the plurality of masks on each of which the corresponding divided pattern has been formed for the specific region specified based on the specific region information by using a plurality of illumination conditions and a plurality of focus conditions;

an output mechanism configured to output the aerial images for the specific region of the plurality of masks on each of which the corresponding divided pattern has been formed; and a calculation processing circuitry configured to calculate edge position information defining an edge position of a wafer pattern acquired through lithographic processes with the corresponding divided pattern for each of the plurality of masks, based on the aerial images of the plurality of masks captured for the specific region, wherein the aerial image measurement system is connected to a control computer including an exposure determining processing circuitry configured to determine whether or not an inter-pattern distance between the edge position of the wafer pattern of the corresponding divided pattern which has been formed on one of the plurality of masks and the edge position of the wafer pattern of the corresponding divided pattern which has been formed on another one of the plurality of masks calculated for the specific region is in an allowed range in a case where the edge position of the wafer pattern of the corresponding divided pattern which has been formed on the one of the plurality of masks and the edge position of the wafer pattern of the corresponding divided pattern which has been formed on the another one of the plurality of masks calculated for the specific region by the calculation processing circuitry is composed to be overlaid by using the alignment marks of the one of the plurality of masks and the alignment marks of the another one of the plurality of masks as a reference;

output data from a data managing apparatus including:
a data recording device capable of storing information output from the pattern inspection apparatus and the aerial image measurement system for the plurality of masks;

output data from a pattern position repairing apparatus including:
an inter-pattern distance determination processing circuitry configured to receive information of the divided patterns acquired by dividing the pattern into the plurality of parts for the multiple patterning and formed on the plurality of masks, selected arbitrary by the data managing apparatus and the edge position information defining the edge position of the wafer pattern acquired through lithographic processes with the corresponding divided pattern for the each of the plurality of masks, based on the aerial images of the plurality of masks captured for the specific region by the aerial image measurement system, select data of the divided patterns formed on the plurality of masks, and determine a repairability of a pattern shape for at least one mask among the plurality of masks on each of which the corresponding divided pattern of the divided patterns has been formed, based on the edge position information of the wafer pattern calculated in the plurality of illumination conditions and the plurality of focus conditions in a case where an inter-pattern distance between the edge position of the wafer pattern of the corresponding divided pattern which has been formed on the one of the plurality of masks and the edge position of the wafer pattern of the corresponding divided pattern which has been formed on the another one of the plurality of masks is determined to be out of the allowed range in the plurality of illumination conditions and the plurality of focus conditions, the edge position of the wafer pattern of the corresponding divided pattern which has been formed on the one of the plurality of masks and the edge position of the wafer pattern of the corresponding divided pattern which has been formed on the another one of the plurality of masks calculated for the specific region being composed to be overlaid by using the alignment marks of the one of the plurality of masks and the alignment marks of the another one of the plurality of masks as a reference;
a repairing mechanism configured to repair some edge positions of the defected patterns in the specific region, the defected patterns being a part of the corresponding divided pattern to be arranged in the specific region and being formed on each of the plurality of masks, by repairing a shape of the corresponding divided pattern formed on the at least one mask by using a charged particle beam for the at least one mask determined to be repairable based on information of the each of the defected patterns formed on the plurality of masks and configuring the specific region, and the edge position information defining the edge position of the wafer pattern for each of the plurality of masks, calculated based on the aerial images; and
an output mechanism configured to acquire a secondary electron image generated due to a charged particle beam for the defected patterns repaired and output the secondary electron image after the repairing; and
information of each combination of an illumination condition and a focus condition for the divided patterns formed on the plurality of masks so that the inter-pattern distance between the edge position of the wafer pattern of the corresponding divided pattern which has been formed on the one of the plurality of masks and the edge position of the wafer pattern of the corresponding divided pattern which has been formed on the another one of the plurality of masks is determined to be within the allowed range in a case where the edge position of the wafer pattern of the corresponding divided pattern which has been formed on the one of the plurality of masks and the edge position of the wafer pattern of the corresponding divided pattern which has been formed on the another one of the plurality of masks calculated based on the aerial images of the plurality of masks captured for the specific region of each of the divided patterns using a plurality of illumination conditions and a plurality of focus conditions is composed so as to be overlaid by using the alignment marks of the one of the plurality of masks and the alignment marks of the another one of the plurality of masks as a reference; and
an exposure mechanism configured to execute exposure in a state that a plurality of illumination conditions or a plurality of focus conditions being applicable to the divided patterns formed on the plurality of masks being limited based on any one of the output data from the pattern inspection apparatus, the output data from the aerial image measurement system, the output data from the data managing apparatus, and the output data from the pattern position repairing apparatus in a case that the pattern is printed to a wafer by using a multiple-patterning technique by using the plurality of masks.

According to further aspect of the present invention, a pattern exposure apparatus includes:
a storage device configured to receive and store:
output data from a pattern position measurement apparatus including:
an optical image acquiring mechanism configured to acquire optical image data of a corresponding divided pattern for each of a plurality of masks on each of which the corresponding divided pattern of divided patterns acquired by dividing a pattern into a plurality of parts for multiple patterning has been formed, the each of the plurality of masks being aligned to the coordinate defined by alignment marks formed as a part of the corresponding divided pattern;
a pattern position measurement processing circuitry configured to measure, as a pattern position, a position of a center of gravity of a pattern acquired from position information of an arbitral pattern edge designated in advance as a measuring condition, by using the optical image data of the corresponding divided pattern formed on each of the plurality of masks being aligned to the coordinate defined by the alignment marks acquired by the pattern image acquiring mechanism;

a position deviation map generating processing circuitry configured to generate position deviation maps in each of which a position deviation at a center coordinate of each minimum element of a corresponding map of the position deviation maps is defined regarding the corresponding divided pattern formed on a corresponding mask of the plurality of masks, the position deviation at the center coordinate of the each minimum element being represented as a deviation from the coordinate defined by the alignment marks formed as the part of the corresponding divided pattern formed on the each of the plurality of masks, by using a position deviation amount of the corresponding divided pattern acquired by comparing a position of a pattern acquired from the optical image data of the corresponding divided pattern formed on each of the plurality of masks with a position of a pattern acquired from design pattern data of the corresponding divided pattern formed on each of the plurality of masks each aligned to the coordinate defined by the alignment marks;

a difference position value map generating processing circuitry configured to generate one difference position value map defining a difference value between relative position deviation amounts of the each minimum element of the position deviation maps each aligned with the alignment marks as a reference acquired by comparing the optical image data and the design pattern data of the corresponding divided pattern, corresponding to the plurality of the masks each having the corresponding divided pattern formed thereon;

a region specifying processing circuitry configured to specify at least one specific region having the difference value exceeding a threshold of distance between patterns laying side-by-side by using the difference position value map; and an output mechanism configured to output specific region information of at least design coordinates of the objective patterns for pattern position measurement, position deviation of the measured pattern against the design position of the objective pattern, and information of a captured image of each specific region specified for the each specific region specified;

output data from an aerial image measurement system including:

a storage device configured to receive the specific region information output from the pattern position measurement apparatus as input and store the specific region information;

an image capturing mechanism configured to capture aerial images of the plurality of masks on each of which the corresponding divided pattern has been formed for the specific region specified based on the specific region information by using a plurality of illumination conditions and a plurality of focus conditions;

an output mechanism configured to output the aerial images for the specific region of the plurality of masks on each of which the corresponding divided pattern has been formed; and a calculation processing circuitry configured to calculate edge position information defining an edge position of a wafer pattern acquired through lithographic processes with the corresponding divided pattern for each of the plurality of masks, based on the aerial images of the plurality of masks captured for the specific region, wherein the aerial image measurement system is connected to a control computer including an exposure determining processing circuitry configured to determine whether or not an inter-pattern distance between the edge position of the wafer pattern of the corresponding divided pattern which has been formed on one of the plurality of masks and the edge position of the wafer pattern of the corresponding divided pattern which has been formed on another one of the plurality of masks calculated for the specific region is in an allowed range in a case where the edge position of the wafer pattern of the corresponding divided pattern which has been formed on the one of the plurality of masks and the edge position of the wafer pattern of the corresponding divided pattern which has been formed on the another one of the plurality of masks calculated for the specific region by the calculation processing circuitry is composed to be overlaid by using the alignment marks of the one of the plurality of masks and the alignment marks of the another one of the plurality of masks as a reference;

output data from a data managing apparatus including:

a data recording device capable of storing information output from the pattern position measurement apparatus and the aerial image measurement system for the plurality of masks;

output data from a pattern position repairing apparatus including:

an inter-pattern distance determination processing circuitry configured to receive information of the divided patterns acquired by dividing the pattern into the plurality of parts for the multiple patterning and formed on the plurality of masks, selected arbitrary by the data managing apparatus and the edge position information defining the edge position of the wafer pattern acquired through lithographic processes with the corresponding divided pattern for the each of the plurality of masks, based on the aerial images of the plurality of masks captured for the specific region by the aerial image measurement system, select data of the divided patterns formed on the plurality of masks, and determine a repairability of a pattern shape for at least one mask among the plurality of masks on each of which the corresponding divided pattern of the divided patterns has been formed, based on the edge position information of the wafer pattern calculated in the plurality of illumination conditions and the plurality of focus conditions in a case where an inter-pattern distance between the edge position of the wafer pattern of the corresponding divided pattern which has been formed on the one of the plurality of masks and the edge position of the wafer pattern of the corresponding divided pattern which has been formed on the another one of the plurality of masks is determined to be out of the allowed range in the plurality of illumination conditions and the plurality of focus conditions, the edge position of the wafer pattern of the corresponding divided pattern which has been formed on the one of the plurality of masks and the edge position of the wafer pattern of the corresponding divided pattern which has been formed on the another one of the plurality of masks calculated for the specific region being composed to be overlaid by using the alignment marks of the one of the plurality of masks and the alignment marks of the another one of the plurality of masks as a reference;

a repairing mechanism configured to repair some edge positions of the defected patterns in the specific region, the defected patterns being a part of the corresponding divided pattern to be arranged in the specific region and being formed on each of the plurality of masks, by repairing a shape of the corresponding divided pattern formed on the at least one mask by using a charged particle beam for the at least one mask determined to be repairable based on information of the each of the defected patterns formed on the plurality of masks and configuring the specific region, and the edge position information defining the edge position of the wafer pattern for each of the plurality of masks, calculated based on the aerial images; and an output mechanism configured to acquire a secondary electron image generated due to a charged particle beam for the defected patterns repaired and output the secondary electron image after the repairing; and information of each combination of an illumination condition and a focus condition for the divided patterns formed on the plurality of masks so that the inter-pattern distance between the edge position of the wafer pattern of the corresponding divided pattern which has been formed on the one of the plurality of masks and the edge position of the wafer pattern of the corresponding divided pattern which has been formed on the another one of the plurality of masks is determined to be within the allowed range in a case where the edge position of the wafer pattern of the corresponding divided pattern which has been formed on the one of the plurality of masks and the edge position of the wafer pattern of the corresponding divided pattern which has been formed on the another one of the plurality of masks calculated based on the aerial images of the plurality of masks captured for the specific region of each of the divided patterns using a plurality of illumination conditions and a plurality of focus conditions is composed so as to be overlaid by using the alignment marks of the one of the plurality of masks and the alignment marks of the another one of the plurality of masks as a reference; and an exposure mechanism configured to execute exposure in a state that a plurality of illumination conditions or a plurality of focus conditions being applicable to the divided patterns formed on the plurality of masks being limited based on any one of the output data from the pattern position measurement apparatus, the output data from the aerial image measurement system, the output data from the data managing apparatus, and the output data from the pattern position repairing apparatus in a case that the pattern is printed to a wafer by using a multiple-patterning technique by using the plurality of masks.

According to further aspect of the present invention, a method for exposing a pattern, the method includes:

a step for acquiring optical image data of a corresponding divided pattern for each of a plurality of masks on each of which the corresponding divided pattern of divided patterns acquired by dividing a pattern into a plurality of parts for multiple patterning has been formed, the each of the plurality of masks being aligned to the coordinate defined by alignment marks formed as a part of the corresponding divided pattern by using a pattern inspection apparatus;

a step for generating position deviation maps in each of which a position deviation at a center coordinate of each minimum element of a corresponding map of the position deviation maps is defined regarding the corresponding divided pattern formed on a corresponding mask of the plurality of masks, the position deviation at the center coordinate of the each minimum element being represented as a deviation from the coordinate defined by the alignment marks formed as the part of the corresponding divided pattern formed on the each of the plurality of masks, by using a position deviation amount of the corresponding divided pattern acquired by comparing the optical image data of the corresponding divided pattern formed on each of the plurality of masks with design pattern data of the corresponding divided pattern formed on each of the plurality of masks each aligned to the coordinate defined by the alignment marks by using the pattern inspection apparatus;

a step for generating a difference position value map defining a difference value between relative position deviation amounts of the each minimum element of the position deviation maps each aligned with the alignment marks as a reference acquired by comparing the optical image data and the design pattern data of the corresponding divided pattern, corresponding to the plurality of the masks each having the corresponding divided pattern formed thereon by using the pattern inspection apparatus;

a step for specifying at least one specific region having the difference value exceeding a threshold of distance between patterns laying side-by-side using the difference position value map by using the pattern inspection apparatus;

a step for outputting specific region information of at least coordinates, a type of defect, and information of a reference image of each specific region specified for the each specific region by using the pattern inspection apparatus;

a step for receiving and storing the specific region information output from the pattern inspection apparatus by using an aerial image measurement system;

a step for capturing aerial images of the plurality of masks for the specific region specified based on the specific region information by using a plurality of illumination conditions and a plurality of focus conditions by using the aerial image measurement system;

a step for outputting the aerial images for the specific region of the plurality of masks on each of which the corresponding divided pattern of divided patterns has been formed; and a step for calculating edge position information defining an edge position of a wafer pattern acquired through lithographic processes with the corresponding divided pattern for each of the plurality of masks, based on the aerial images of the plurality of masks captured for the specific region by using the aerial image measurement system;

a step for determining whether or not an inter-pattern distance between the edge position of the wafer pattern of the corresponding divided pattern which has been formed on one of the plurality of masks and the edge position of the wafer pattern of the corresponding divided pattern which has been formed on another one of the plurality of masks calculated for the specific region is in an allowed range in a case where the edge position of the wafer pattern of the corresponding divided pattern which has been formed on the one of the plurality of masks and the edge position of the wafer pattern of the corresponding divided pattern which has been formed on the another one of the plurality of masks calculated for the specific region is composed to be overlaid by using the alignment marks of the one of the plurality of masks and the alignment marks of the another one of the plurality of masks as a reference by using the aerial image measurement system;

a step for storing information output from the pattern inspection apparatus and the aerial image measurement system for the plurality of masks by using a data managing apparatus;

a step for inputting information of the divided patterns formed on the plurality of masks, divided for multiple patterning, and stored in a data recording device arbitrary selected by the data managing apparatus and edge position information defining the edge position of the wafer pattern for each of the plurality of masks, calculated based on the aerial images of the plurality of masks captured by using the aerial image measurement system to a storage device;

a step for selecting data of the divided patterns formed on the plurality of masks and determining a repairability of a pattern shape for at least one mask among the plurality of masks on each of which the corresponding divided pattern of the divided patterns has been formed, based on the edge position information of the wafer pattern calculated in the plurality of illumination conditions and the plurality of focus conditions in a case where an inter-pattern distance between the edge position of the wafer pattern of the corresponding divided pattern which has been formed on the one of the plurality of masks and the edge position of the wafer pattern of the corresponding divided pattern which has been formed on the another one of the plurality of masks is determined to be out of the allowed range in the plurality of illumination conditions and the plurality of focus conditions, the edge position of the wafer pattern of the corresponding divided pattern which has been formed on the one of the plurality of masks and the edge position of the wafer pattern of the corresponding divided pattern which has been formed on the another one of the plurality of masks calculated for the specific region being composed to be overlaid by using the alignment marks of the one of the plurality of masks and the alignment marks of the another one of the plurality of masks as a reference by using the data managing apparatus;

a step for repairing some edge positions of the defected patterns in the specific region, the defected patterns being a part of the corresponding divided pattern to be arranged in the specific region and being formed on each of the plurality of masks, by repairing a shape of the corresponding divided pattern formed on the at least one mask by using a charged particle beam for the at least one mask determined to be repairable based on information of the each of the defected patterns formed on the plurality of masks and configuring the specific region, and the edge position information defining the edge position of the wafer pattern for each of the plurality of masks, calculated based on the aerial images by using the pattern position repairing apparatus;

a step for acquiring a secondary electron image generated due to a charged particle beam for the defected patterns repaired and output the secondary electron image after the repairing;

a step for inputting information of each combination of an illumination condition and a focus condition for the divided patterns formed on the plurality of masks so that the inter-pattern distance between the edge position of the wafer pattern of the corresponding divided pattern which has been formed on the one of the plurality of masks and the edge position of the wafer pattern of the corresponding divided pattern which has been formed on the another one of the plurality of masks is determined to be within the allowed range in a case where the edge position of the wafer pattern of the corresponding divided pattern which has been formed on the one of the plurality of masks and the edge position of the wafer pattern of the corresponding divided pattern which has been formed on the another one of the plurality of masks calculated based on the aerial images of the plurality of masks captured for the specific region of each of the divided patterns using a plurality of illumination conditions and a plurality of focus conditions is composed so as to be overlaid by using the alignment marks of the one of the plurality of masks and the alignment marks of the another one of the plurality of masks as a reference by using the data managing apparatus; and a step for executing, by using an exposure apparatus, exposure in a state that a plurality of illumination conditions or a plurality of focus conditions being applicable to the divided patterns formed on the plurality of masks being limited based on any one of the output data from the pattern inspection apparatus, the output data from the aerial image measurement system, the output data from the data managing apparatus, and the output data from the pattern position repairing apparatus in a case that the pattern is printed to a wafer by using a multiple-patterning technique by using the plurality of masks.

DETAILED DESCRIPTION OF THE INVENTION

Hereinafter, contents relating to multiple patterning will be described in embodiments.

Embodiment 1

Figure 1:
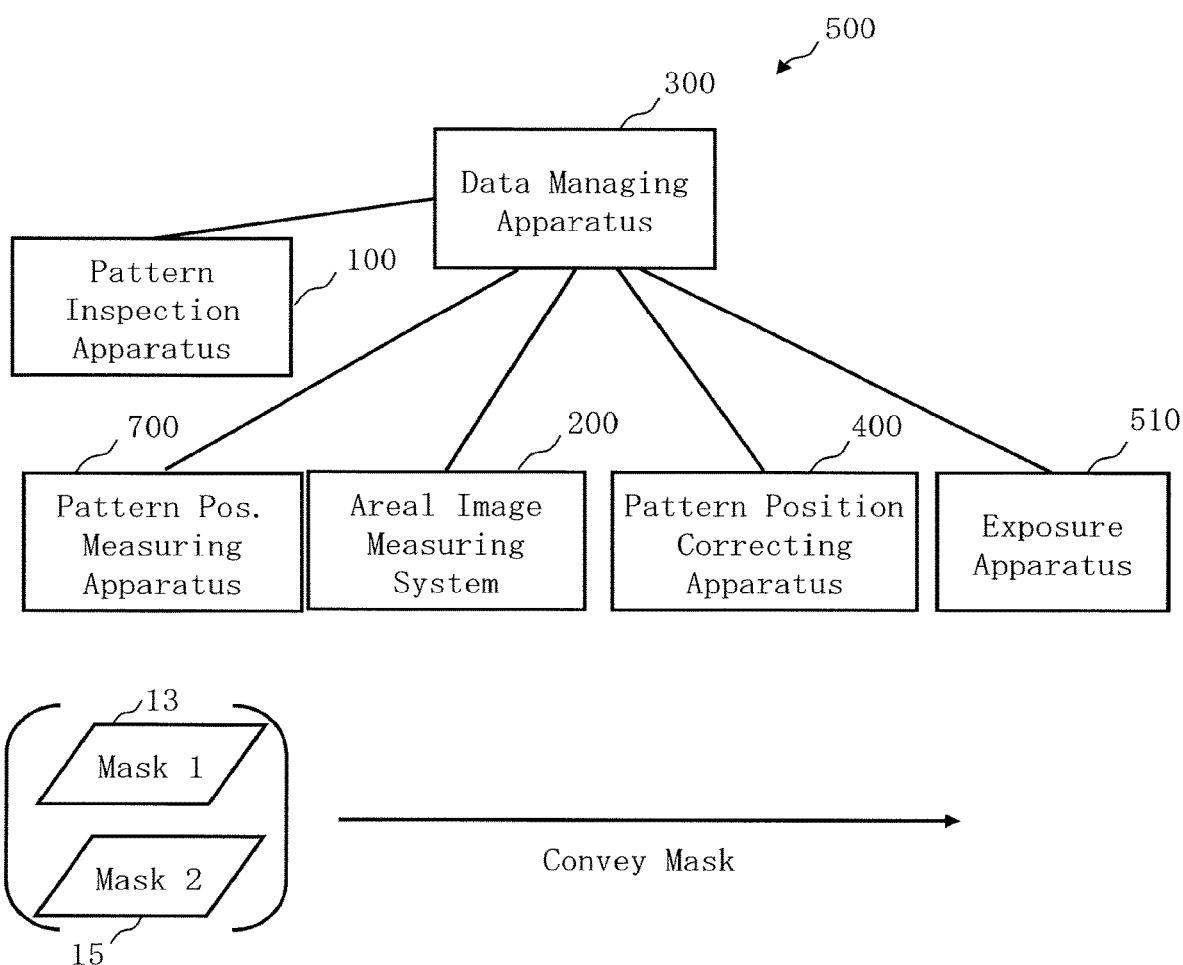
FIG. 1 is a configuration diagram that illustrates a mask manufacturing system according to Embodiment 1.

FIG. 1 is a configuration diagram that illustrates the configuration of a manufacturing system and a manufacturing method of a mask, on which patterns divided into a plurality of parts for multiple patterning are formed, according to Embodiment 1. In the case illustrated in FIG. 1, the manufacturing system 500 of a mask according to Embodiment 1 includes: a pattern inspection apparatus 100; a pattern position measurement apparatus 700; an aerial image measurement system 200; a data managing apparatus 300; and a pattern position repairing apparatus 400. The pattern inspection apparatus 100, the pattern position measurement apparatus 700, the aerial image measurement system 200, and the pattern position repairing apparatus 400 are connected to the data managing apparatus 300 through a bus network not illustrated in the diagram. Thus, the pattern inspection apparatus 100, the pattern position measurement apparatus 700, the aerial image measurement system 200, and the pattern position repairing apparatus 400 are interconnected through the data managing apparatus 300 to be communicable with each other. The data managing apparatus 300 is communicably connected with the exposure apparatus 510 that prints patterns onto a wafer or the like using a plurality of masks, on which patterns divided into a plurality of parts for multiple patterning are formed, by actually using a multiple-patterning technique. The manufacturing system 500 of a mask may be provided with only either one of the pattern inspection apparatus 100 or the pattern position measurement apparatus 700.

Figure 2:
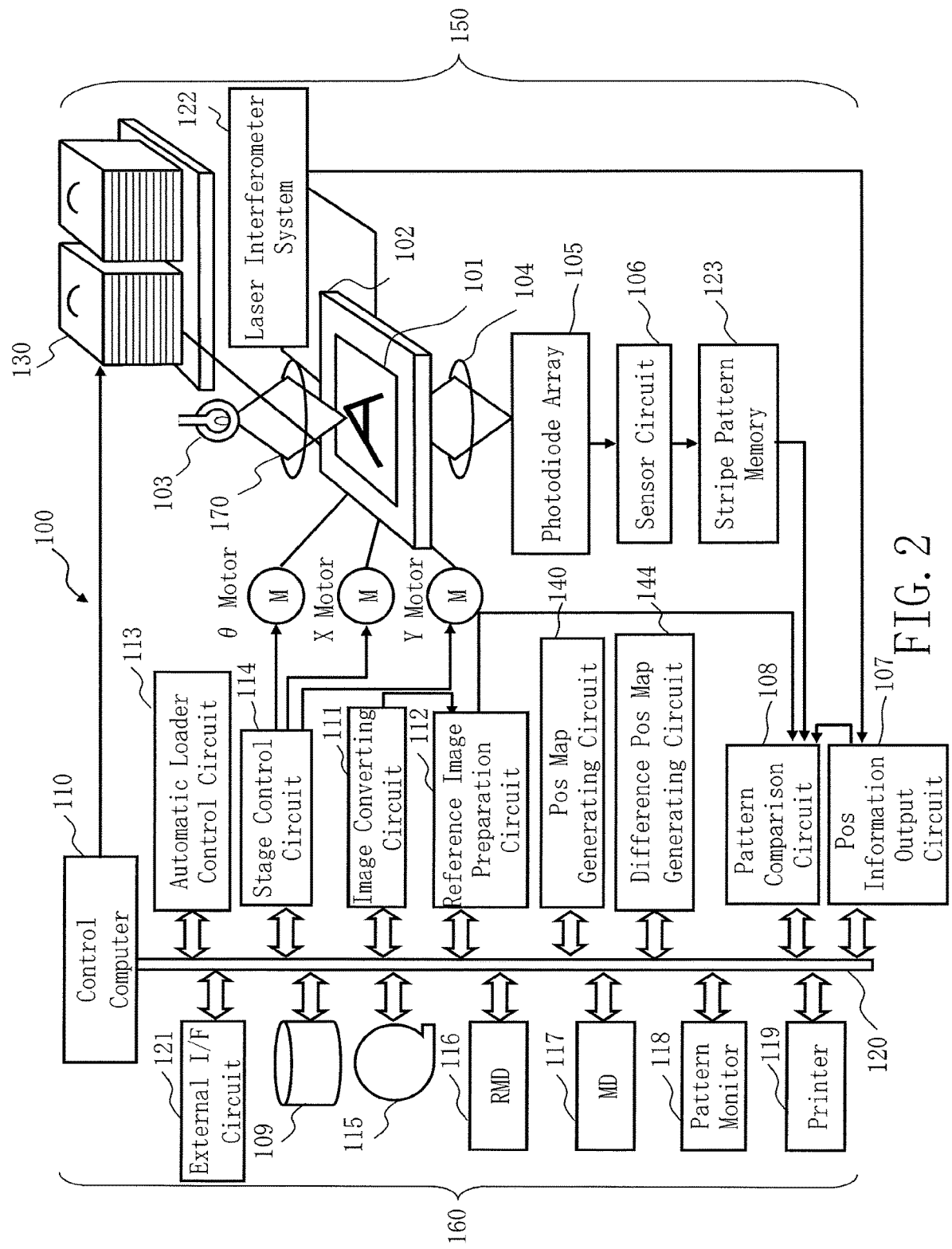
FIG. 2 is a configuration diagram that illustrates a pattern inspection apparatus according to Embodiment 1.

FIG. 2 is a configuration diagram that illustrates a pattern inspection apparatus according to Embodiment 1. In the case illustrated in FIG. 2, the pattern inspection apparatus 100, for example, inspecting a defect of a pattern formed onto a mask includes: an optical image acquiring mechanism 150; and a control system circuit 160 (control unit).

The optical image acquiring mechanism 150 includes: a light source 103; an illumination optical system 170; a movable XYθ stage 102; an optical zoom system 104; and a photodiode array 105 (an example of a sensor); a sensor circuit 106; a stripe pattern memory 123; and a laser interferometer system 122. On the XYθ stage 102, a mask 101 is mounted. An example of the mask 101 includes a photomask used for exposure that prints a pattern onto a wafer. Here, a plurality of masks on which patterns divided into a plurality of parts for multiple patterning are formed is included. The plurality of divided patterns is configured by a plurality of figures all of which are inspection targets. The mask 101, for example, is mounted on the XYθ stage 102 with the mask surface down, which patterns are formed.

In the control system circuit 160, a control computer 110 serving as a computer is connected to a position information output circuit 107, a pattern comparison circuit 108, an image converting circuit 111, a reference image preparation circuit 112, an automatic loader control circuit 113, a stage control circuit 114, a position deviation map (pos map) generating circuit 140, a difference position value map (difference pos map) generating circuit 144, a magnetic disk device 109, a magnetic tape device 115, a removable memory device (RMD) 116, a monitor device (MD) 117, a pattern monitor 118, a printer 119, and an external interface (I/F) circuit 121 (output mechanism) through a bus network 120. In addition, the sensor circuit 106 is connected to the stripe pattern memory 123, and the stripe pattern memory 123 is connected to the pattern comparison circuit 108. The XYθ stage 102 is driven by an X-axis motor, a Y-axis motor, and a θ-axis motor. The XYθ stage 102 is an example of a stage.

In the pattern inspection apparatus 100, an inspection optical system having a high magnification is configured by the light source 103, the XYθ stage 102, the illumination optical system 170, the optical zoom system 104, the photodiode array 105, and the sensor circuit 106. The XYθ stage 102 is driven by the stage control circuit 114 under the control of the control computer 110. The XYθ stage 102 can be moved by a same drive system of three-axis (X-Y-θ) motors that are driven in the X direction, the Y direction, and the θ direction. As the X-axis motor, the Y-axis motor, and the θ motor, for example, stepping motors may be used. The XYθ stage 102 can be moved in the horizontal direction and the rotation direction by the motors of the axes XYθ. Then, the moving position of the XYθ stage 102 is measured by the laser interferometer system 122 and is supplied to the position information output circuit 107.

Here, in FIG. 2, components necessary for the description of Embodiment 1 are illustrated. Generally, it is apparent that any other component that is not necessary may be included in the pattern inspection apparatus 100.

Figure 3A:
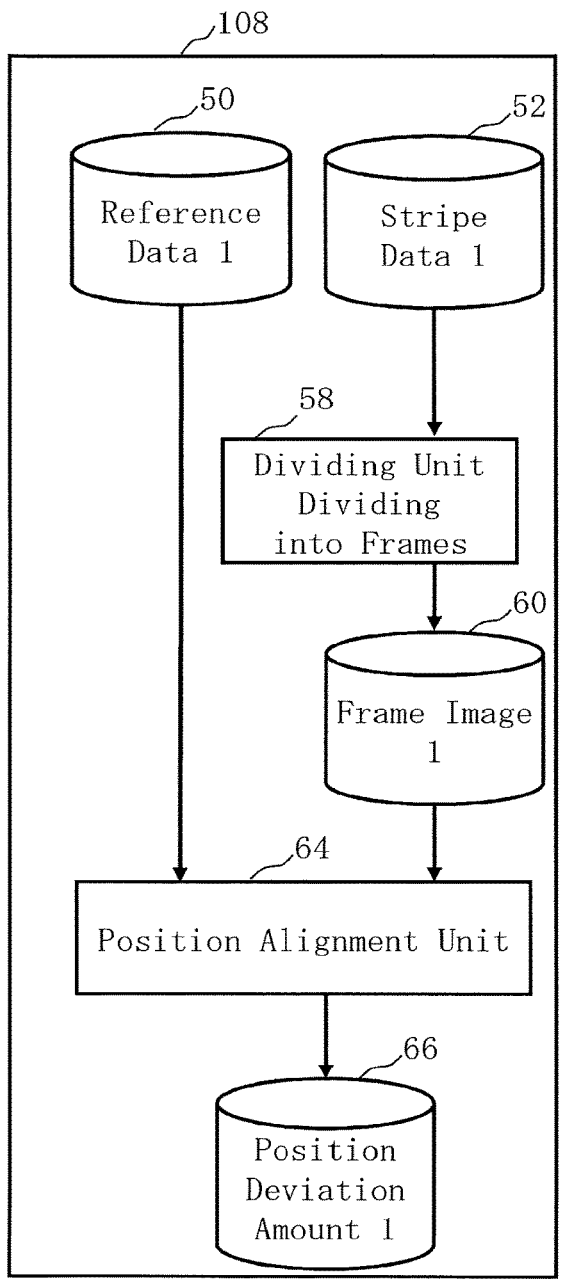
FIGS. 3A and 3B are diagrams that illustrate the internal configuration of a pattern comparison circuit according to Embodiment 1.
Figure 3B:
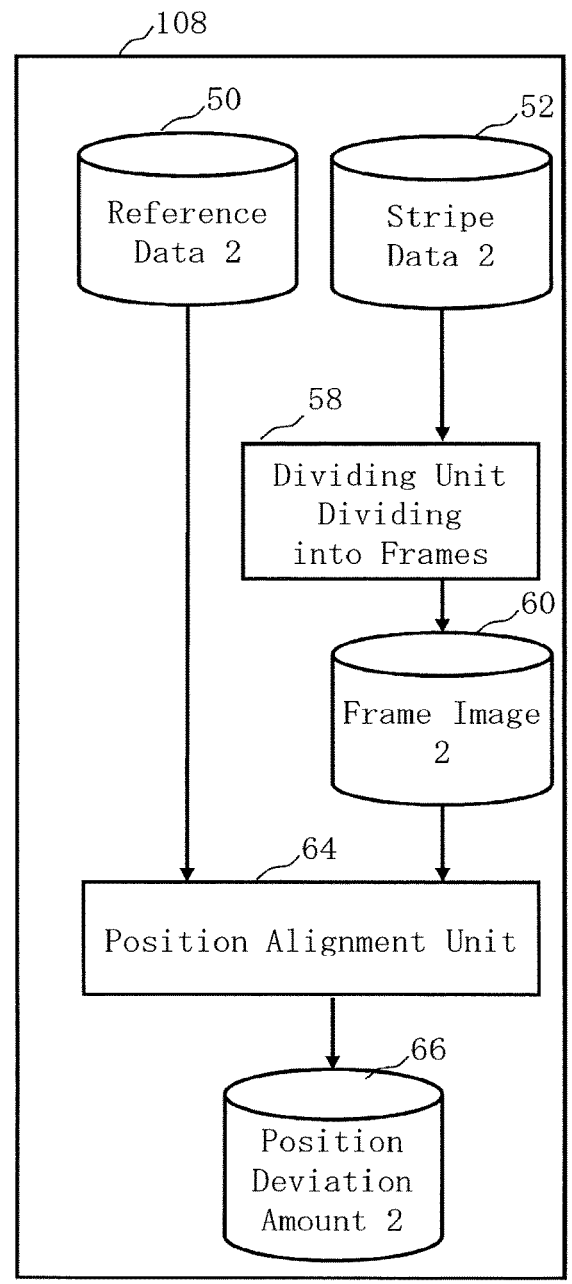

FIGS. 3A and 3B are diagrams that illustrate the internal configuration of a pattern comparison circuit according to Embodiment 1. In the case illustrated in FIGS. 3A and 3B, inside the pattern comparison circuit 108, storage devices 50, 52, 60, and 66, a dividing unit 58 dividing the image data into frames, and a position alignment unit 64 are arranged. Each of "xxx units" such as the dividing unit 58 dividing the image data into frames and the position alignment unit 64 includes a processing circuitry. The processing circuitry includes an electric circuit, a quantum circuit, a computer, a processor, a circuit board, or a semiconductor device, for example. Each of the "xxx units" may use the common processing circuitry (same processing circuitry), or may use different processing circuitries (separated processing circuitries). Input data or a calculated result that is necessary for the pattern comparison circuit 108 is stored each time in a memory not illustrated in the drawing. FIG. 3A illustrates the flow of the process of a mask 1. FIG. 3B illustrates the flow of the process of a mask 2.

Figure 4:
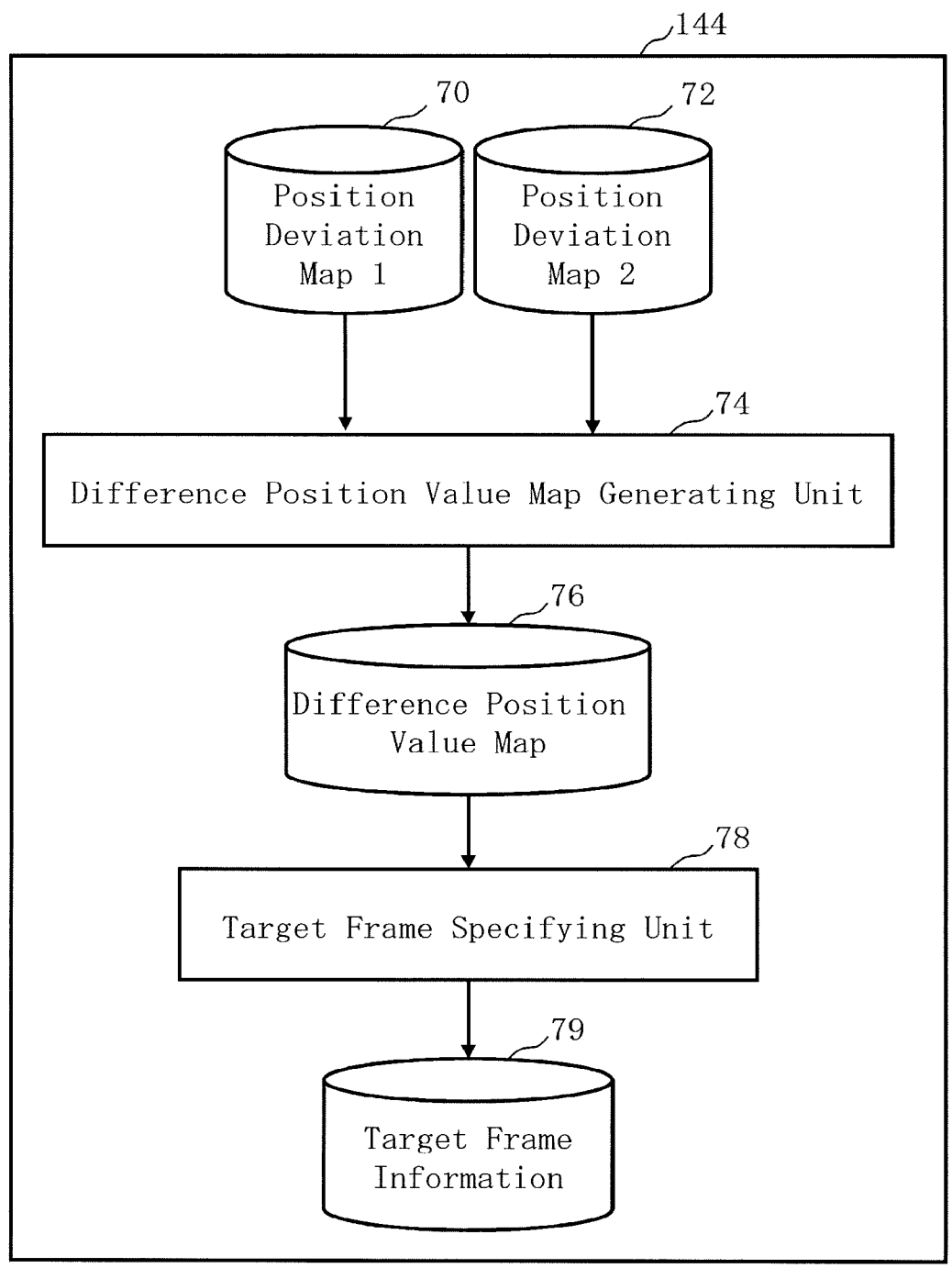
FIG. 4 is a diagram that illustrates the internal configuration of a difference value map generating circuit according to Embodiment 1.

FIG. 4 is a diagram that illustrates the internal configuration of a difference position value map (difference pos map) generating circuit according to Embodiment 1. In the case illustrated in FIG. 4, inside the difference position value map (difference pos map) generating circuit 144, storage devices 70 and 72 in which the pos maps 1 and 2 for two masks 1 and 2 including the mask 1 on which a pattern divided into two parts for double patterning are formed and the mask 2 on the other is formed are stored, a storage device 76 in which a difference position value map representing a difference between the position deviation map (pos map) 1 and the position deviation map (pos map) 2 is stored, a storage device 79 storing target frame information generated based on the difference position value map, a difference position value map generating unit 74, and a target frame specifying processing circuitry 78 are arranged. Each of "xxx units" such as the difference position value map generating unit 74 and the target frame specifying unit 78 includes a processing circuitry. The processing circuitry includes an electric circuit, a quantum circuit, a computer, a processor, a circuit board, or a semiconductor device, for example. Each of the "xxx units" may use the common processing circuitry (same processing circuitry), or may use different processing circuitries (separated processing circuitries). Input data or a calculated result that is necessary for the difference pos map generating circuit 144 is stored each time in a memory not illustrated in the drawing.

Figure 5:
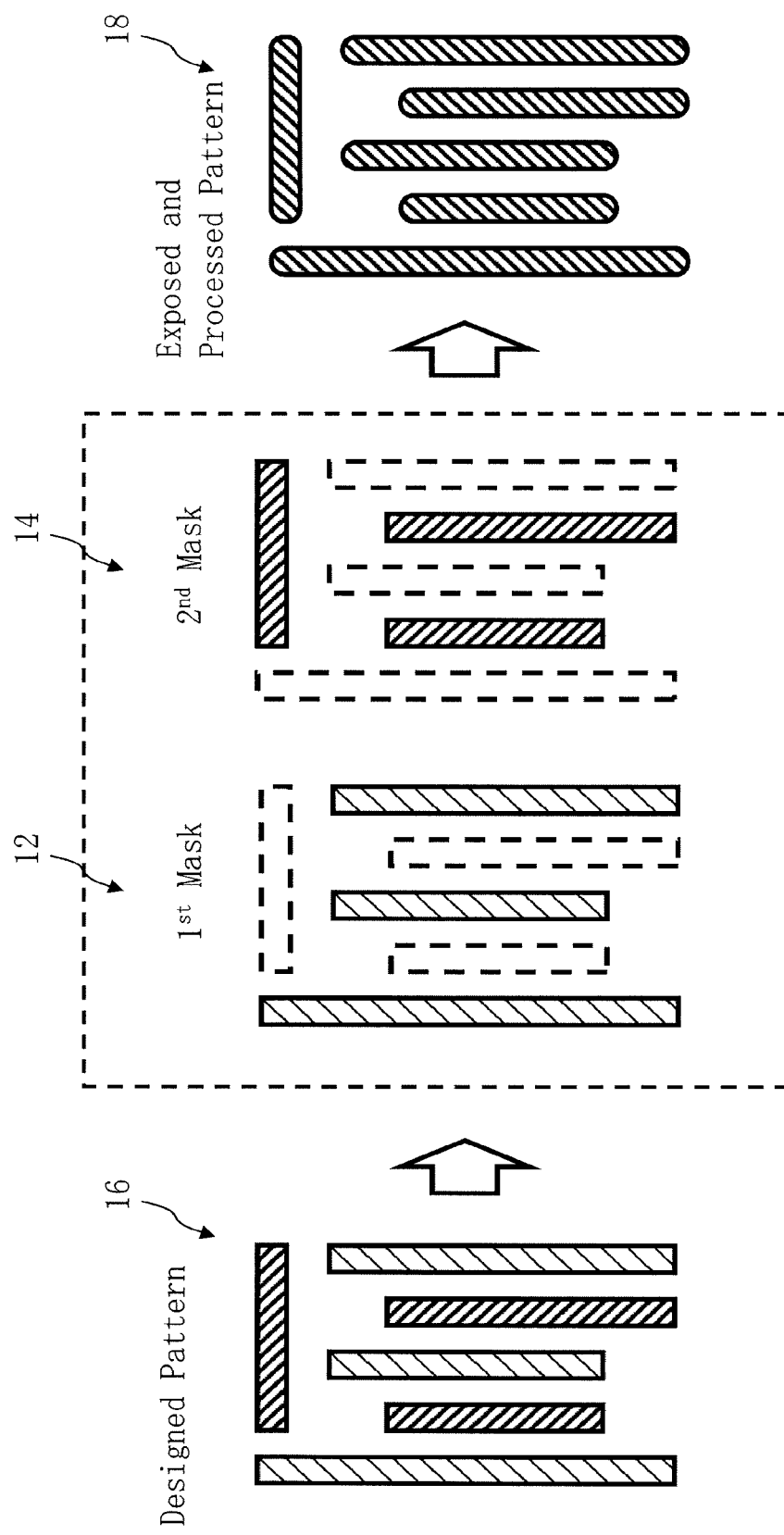
FIGS. 5A to 5C are diagrams that illustrate an example of a designed pattern that is divided into two patterns for double patterning, ideal divided patterns, and an ideal exposed pattern with two ideal divided patterns according to Embodiment 1.

FIGS. 5A to 5C are diagrams that illustrate an example of an exposed and processed pattern acquired by separately printing a designed pattern representing a part of a circuit pattern printed to a wafer or the like according to Embodiment 1, a pattern divided into two parts used for double patterning, divided patterns finally formed on two masks by using a double patterning technique to one wafer region and composing the patterns. FIG. 5A illustrates an example of a designed pattern 16 representing a part of the circuit pattern printed to the wafer. A case is considered in which, in a case where such a designed pattern 16 is exposed and printed to a semiconductor substrate such as a wafer by using the double patterning technique, a distance between circuit patterns on a mask is shorter than the exposure wavelength, and accordingly, it is difficult to expose and print the designed pattern using one mask. For this reason, as illustrated in FIG. 5B, patterns 12 and 14 acquired by dividing the designed pattern 16 into two parts used for multiple patterning are necessary. For example, as illustrated in FIG. 5B, pattern features, which are included in the designed pattern 16, arranged keeping with a distance between pattern features on a mask are about 80 nm or longer which corresponds to the resolution with the exposure wavelength are formed on a first mask on which one divided pattern divided into two parts for multiple patterning is formed. Then, similarly, a remaining pattern included in the designed pattern 16 is formed on a second mask on which the other divided pattern is formed such that a distance between pattern features are about 80 nm or longer which corresponds to the resolution with the exposure wavelength. Ideally, as illustrated in FIG. 5C, an exposed and processed pattern 18 formed on the wafer after the lithographic processing is a pattern similar to the designed pattern 16.

Figure 6:
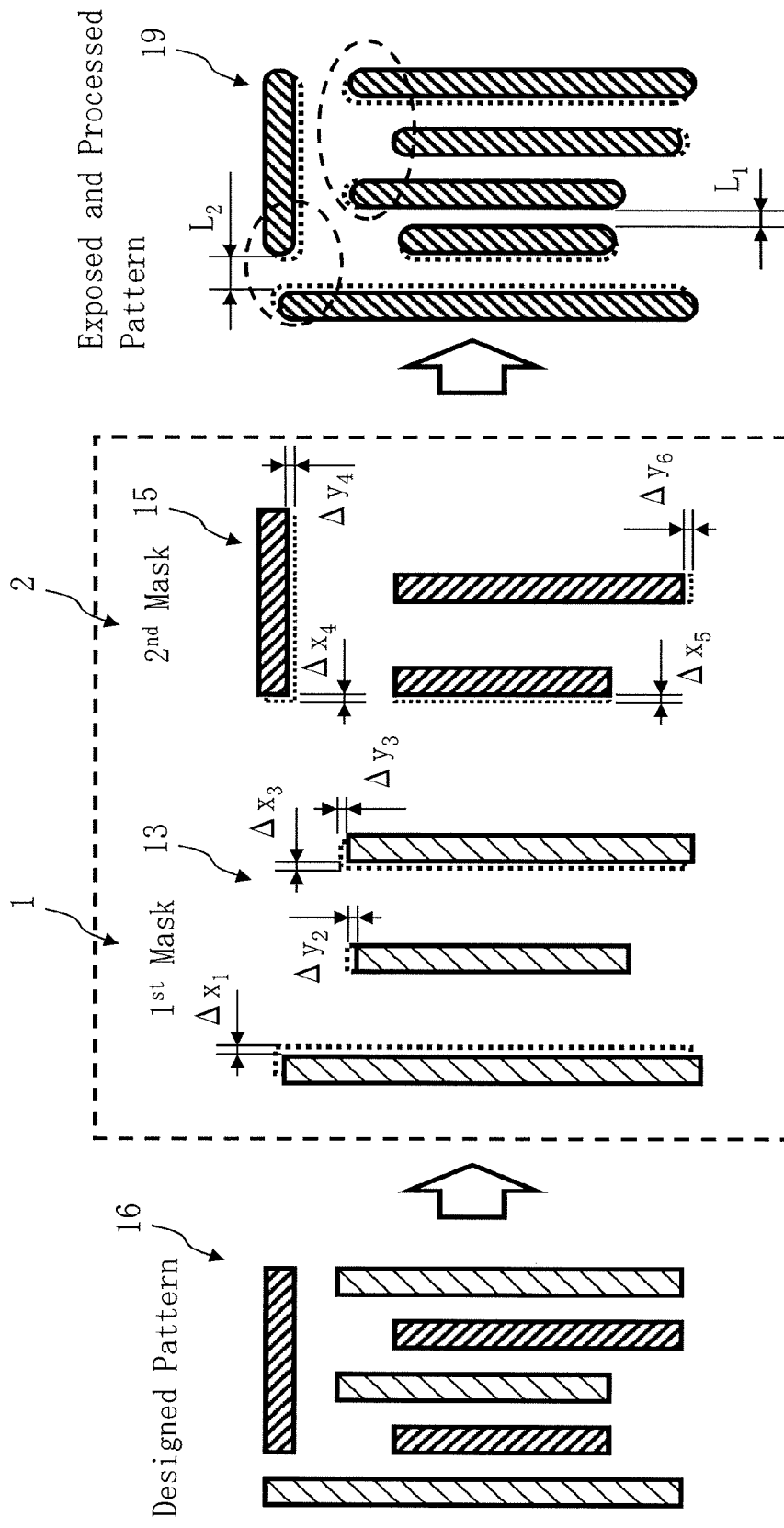
FIGS. 6A to 6C are diagrams that illustrate an example of a designed pattern that is divided into two patterns for multiple patterning, divided patterns with two dimensional position errors, and an exposed pattern with two divided patterns with two dimensional position errors according to Embodiment 1.

FIGS. 6A to 6C are diagrams that illustrate an example of a designed pattern divided for multiple patterning, divided patterns, and an exposed and processed pattern according to Embodiment 1. FIG. 6A, similar to FIG. 5A, illustrates an example of the designed pattern 16 representing a part of a circuit pattern printed to a wafer or the like. In a case where patterns 12 and 14 divided into two parts for double patterning illustrated in FIG. 5B are actually formed on two masks 1 and 2, in FIG. 6B, an example is illustrated in which a divided pattern 13 of which the position deviates in the x direction and/or the y direction is formed on a first mask 1. In addition, an example is illustrated in which a divided pattern 15 of which the position deviates in the x direction and/or the y direction is formed on a second mask 2. As will be described later, even when a position deviation inspection is executed by the pattern inspection apparatus 100 for the two masks 1 and 2 one at a time, in a case where a position deviation or a size error with respect to the design data of each divided pattern is in an allowed range, there are cases where such a deviation does not become an error. However, when the patterns are separately printed and composed for one wafer region using the two masks 1 and 2 by using the multiple-patterning technique, as illustrated in FIG. 6C, in a case where each divided pattern deviates from the design data, for example, there are cases where distances L1 and L2 between the patterns are out of the allowed range inside an exposed and processed pattern 19 composed as one pattern. Particularly, in a case where a position deviation occurs near the end portion of the pattern feature as denoted by L2, for example, when there is a position deviation of 1 nm on the mask, the amount of error on the wafer is not reduced at the reduction magnification (for example, ¼) at the time of exposure because of the mask complexity, and, for example, there are cases where a position deviation of about 1 nm occurs also on the wafer. Such an area is called a hot spot.

Thus, in Embodiment 1, first, a difference position value map is generated based on position deviation maps 1 and 2 acquired by executing an inspection of a comparison with design data by using the pattern inspection apparatus 100 for each of masks 1 and 2 on which one of divided patterns and the other are formed, and a region (target frame) having a possibility of being a hot spot is specified. Then, for the target frame of each of the masks 1 and 2, a further inspection is executed by using the aerial image measurement system 200, and aerial images 1 and 2 are acquired from the masks 1 and 2 on which the two-divided patterns are formed. Based on the acquired two aerial images, exposure simulations are executed, whereby a patterned shape on a wafer through the lithographic processes is calculated. This includes process simulations of a pattern sliming technology or the like. Based on exposure conditions (illumination conditions and focusing conditions) that are in consideration of a process variation under actual exposure and the aerial images 1 and 2 acquired by using the aerial image measurement system 200, simulations are executed so as to calculate the final patterns printed on a wafer, and the wafer patterns are composed of multiple patterning to a wafer, whereby it can be determined whether or not a defect on the final pattern on a wafer. In a case where it is determined that a pattern defect is generated under the designated exposure conditions (the illumination condition and the focusing condition) with multiple patterning, for the divided pattern formed onto at least one or more masks of multiple masks each having one of the divided patterns being formed, a part of the shape of the pattern in an area having a pattern defect is repaired as is necessary by using the pattern position repairing apparatus 400, and the center position of the pattern is finally repaired.

Figure 7:
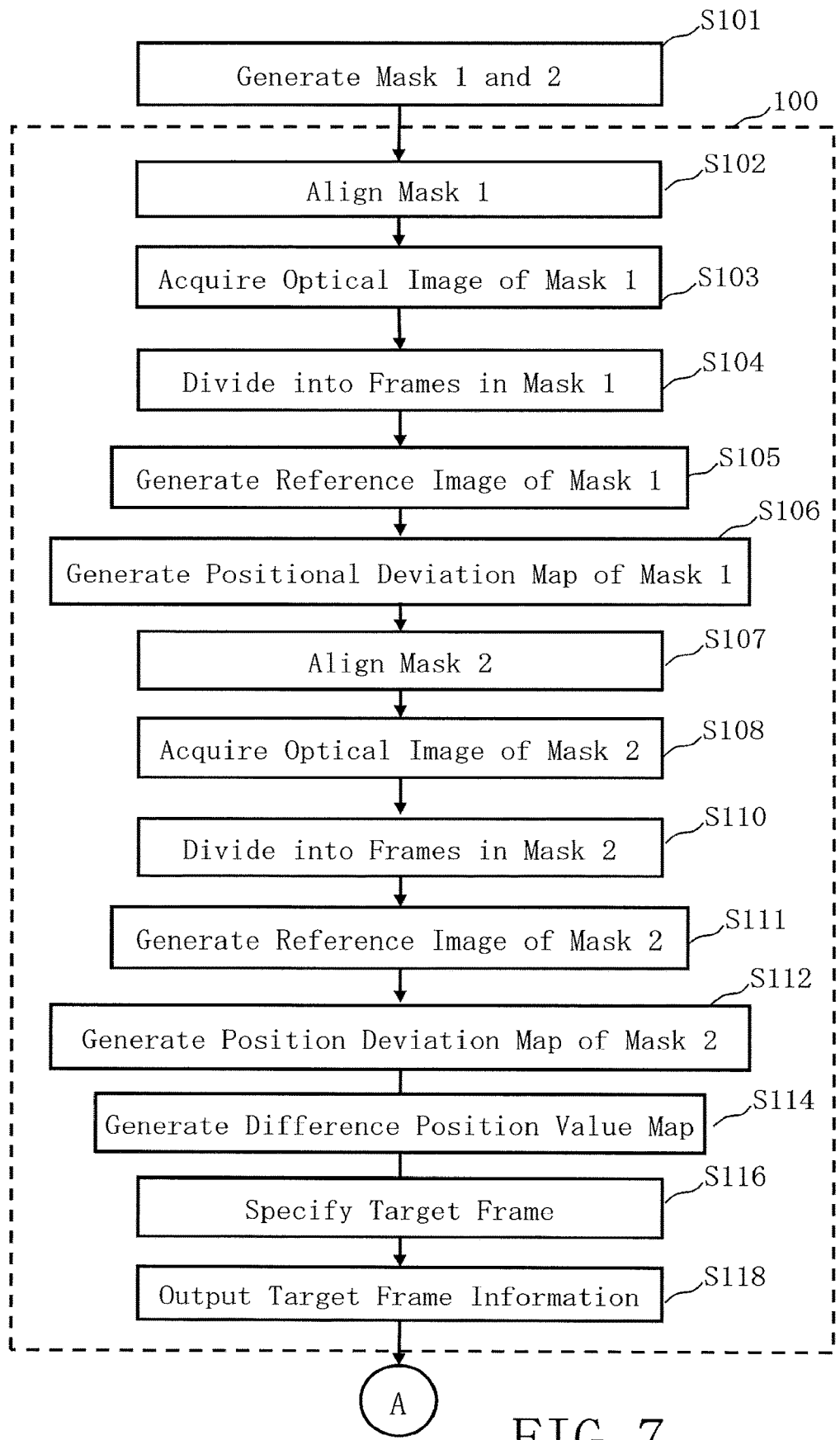
FIG. 7 is a flowchart that illustrates a part of a main process according to an inspection method of Embodiment 1.

FIG. 7 is a flowchart that illustrates a part of a main process according to an inspection method of Embodiment 1. In the par illustrated in FIG. 7, in a part of the inspection method according to Embodiment 1, a series of processes are executed including: a process (S101) of generating masks 1 and 2 each having one of divided patterns divided into two parts for double patterning; an alignment process (S102) for aligning to the coordinate defined by alignment marks formed as a part of the divided pattern of the mask 1; a process (S103) of acquiring an optical image of the mask 1; a process (S104) of dividing the image data into frames of the mask 1; a process (S105) of generating reference images of the mask 1; a process (S106) of generating a position deviation map of the mask 1; an alignment process (S107) for aligning to the coordinate defined by alignment marks formed as a part of the divided pattern of the mask 2; a process (S108) of acquiring an optical image of the mask 2; a process (S110) of dividing the image data into frames of the mask 2; a process (S111) of generating reference images of the mask 2; a process (S112) of generating a position deviation map of the mask 2; a process (S114) of generating a difference position value map acquired based on the position deviation map of the mask 1 and the position deviation map of the mask 2; a target frame specifying process (S116); and a target frame information outputting process (S118).

Here, the alignment process for the mask 1 (S102), the process (S103) of acquiring an optical image of the mask 1, the process (S104) of dividing the image data into frames of the mask 1, the process (S105) of generating reference images of the mask 1; the process (S106) of generating a position deviation map of the mask 1, the alignment process for the mask 2 (S107), the process (S108) of acquiring an optical image of the mask 2, the process (S110) of dividing the image data into frames of the mask 2; the process (S111) of generating reference images of the mask 2, the process (S112) of generating a position deviation map of the mask 2, the process (S114) of generating a difference position value map; the target frame specifying process (S116); and the target frame information outputting process (S118) are executed inside the pattern inspection apparatus 100.

As the process (S101) of generating the masks 1 and 2, patterns divided into two parts for double patterning are formed onto two masks. More specifically, the process is executed as below. For example, first, on a quartz substrate, an absorber film, made from chromium (Cr) or the like against exposing light is formed, and, in order to form a pattern on this absorber film, two mask blanks each coated with a resist film serving as a photosensitive agent are prepared. Then, by using an electron beam drawing device not illustrated in the drawing, one of patterns divided into two parts for multiple patterning is formed in the first mask blank. For example, the divided pattern 13 is formed. Similarly, by using an electron beam drawing device not illustrated in the drawing, the remaining one of the patterns divided into two patterns for multiple patterning is formed into a second mask blank. For example, the divided pattern 15 is formed.

Then, by developing the first and second mask blanks after the pattern drawing, resist patterns are formed. Next, for each of the first and second mask blanks, the absorber film under the resist film is etched by using the resist pattern as a mask. Then, by removing the resist patterns through an ashing process, the patterns divided into two parts for multiple patterning are formed onto two masks.

As the alignment process (S102) for the mask 1, by using an alignment mechanism of the pattern inspection apparatus 100 that is not illustrated in the drawing, the alignment of the mask 1 is executed by using alignment marks formed as a part of the divided pattern on the mask 1. As an alignment technique of a mask, for example, by using the optical image acquiring mechanism 150, for at least three alignment marks arranged on the periphery of divided patterns prepared as parts of the patterns in advance on a plurality of masks divided for multiple patterning, based on image data of each mark and position information of a stage from which the image data of the mark is acquired, the position of each alignment mark with respect to the laser interferometer system 122 of the stage used as the reference can be acquired. Position information of the alignment marks, which is measured, is compared with designed position information of the alignment marks arranged on the periphery of the divided patterns, and a correction (for example, a correction of shift, magnification, orthogonality, or the like) of virtually linear positions is made such that the positions of the alignment marks, which are measured, match the designed positions. In this way, each entire surface of a plurality of masks on which the divided patterns are formed is inspected such that a difference between the measured pattern and the designed reference pattern is minimal. For this reason, for the optical image acquiring mechanism 150, when the stage 102 is scanned at a high precision, a mask coordinate system defined by the alignment marks is corrected to the stage coordinate system defined by the laser interferometer system 122 measuring the position of the stage. Accordingly, the coordinate system of the masks defined by the alignment marks formed as a part of the divided patterns can be adjusted to the designed coordinate system of the pattern.

After the alignment process (S102) for the mask 1, as the process (S103) of acquiring the optical image of the mask 1, the optical image acquiring mechanism 150 acquires optical image data of a divided pattern for a mask aligned to the coordinate defined by alignment marks formed as a part of each divided pattern by using one of the two masks on which patterns divided for multiple patterning are formed. Here, the optical image acquiring mechanism 150, for example, acquires the optical image data of the divided pattern 13 formed by using the mask 1 on which the divided pattern 13 is formed of the two masks 1 and 2 on which patterns divided into two for multiple patterning are formed. More specifically, the operation is executed as below.

To the divided pattern 13 formed on the mask 1, laser light (for example, DUV light) having a wavelength in deep ultraviolet, which is inspection light, is emitted from the appropriate light source 103 through the illumination optical system 170. The light through the mask 101 is formed as an optical image in the photodiode array 105 (an example of a sensor) through the optical zoom system 104 and is incident. As the photodiode array 105, for example, it is preferable to use a time-delay integration (TDI) sensor or the like.

Figure 8:
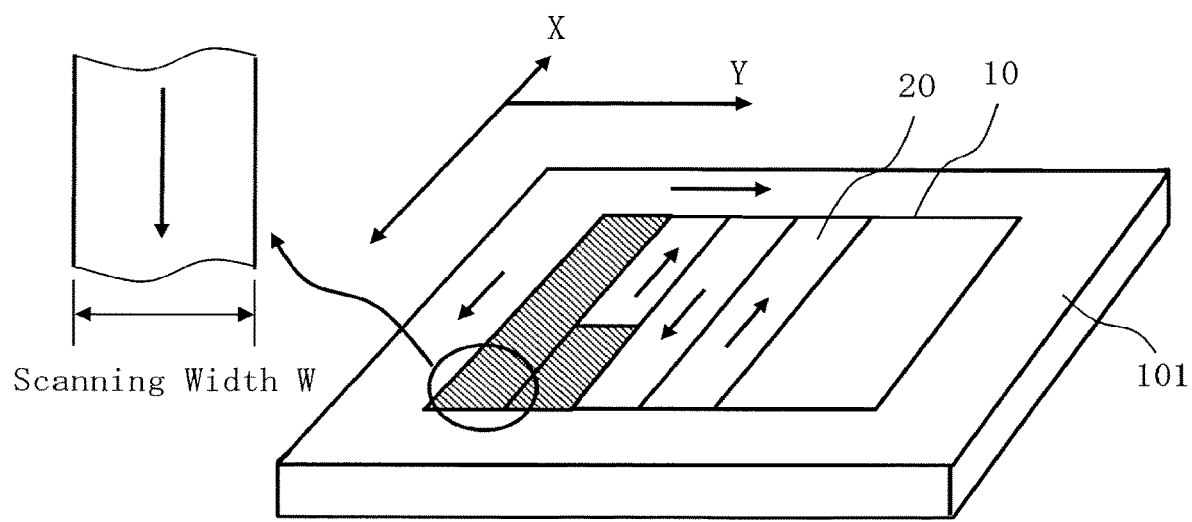
FIG. 8 is a conceptual diagram that illustrates an inspection region according to Embodiment 1.

FIG. 8 is a conceptual diagram that illustrates an inspection region according to Embodiment 1. The inspection region 10 (the entire inspection region) of the mask 101, as illustrated in FIG. 8, for example, is virtually divided into a plurality of inspection stripes 20 of a stripe shape each having a scanning width of W in the Y direction. The pattern inspection apparatus 100 acquires an image (a stripe region image) for each inspection stripe 20. For each inspection stripe 20, an image of a pattern features in the stripe region is captured in the longitudinal direction (X direction) of the stripe region. Optical images are acquired while the photodiode array 105 is continuously moved relatively in the X direction in accordance with the movement of the XYθ stage 102. The photodiode array 105 continuously captures optical images each having a scanning width of W as illustrated in FIG. 8. In other words, the photodiode array 105 that is an example of a sensor captures optical images of patterns formed on the mask 1 under the inspection light while moving relative to the XYθ stage 102. In Embodiment 1, after an optical image of one inspection stripe 20 is captured, the photodiode array moves up to the position of a next inspection stripe 20 in the Y direction, and, this time, similarly, continuously captures optical images each having a scanning width of W while moving in the reverse direction. In other words, the capturing process is repeated in a forward direction (FWD) and a backward (BWD) direction, which are directions opposite to each other, in forward and backward paths.

Here, the capturing directions are not limited to the repetition of the FWD direction and the BWD direction. Thus, the capturing process may be executed from one direction. For example, the capturing directions may be a repetition of the FWD direction and the FWD direction. Alternatively, the capturing directions may be a repetition of the BWD direction and the BWD direction.

The image of the pattern formed on the photodiode array 105 is photoelectrically converted by each light receiving device of the photodiode array 105 and is A/D (analog-to-digital) converted by the sensor circuit 106. Then, pixel data is stored in the stripe pattern memory 123 for each inspection stripe 20. When such pixel data (stripe region image) is captured, as the dynamic range of the photodiode array 105, for example, a dynamic range having a maximal gray scale in a case where 100% of the light intensity of illumination is incident is used. Thereafter, the stripe region image (stripe data 1) is transmitted to the pattern comparison circuit 108 together with data representing the position of the mask 1 on the XYθ stage 102 that is output from the position information output circuit 107. The measured data (pixel data), for example, is an unsigned 8-bit data and represents the gray scale (light intensity) of the brightness of each pixel. The stripe region image output into the pattern comparison circuit 108 is stored in the storage device 52.

Figure 9:
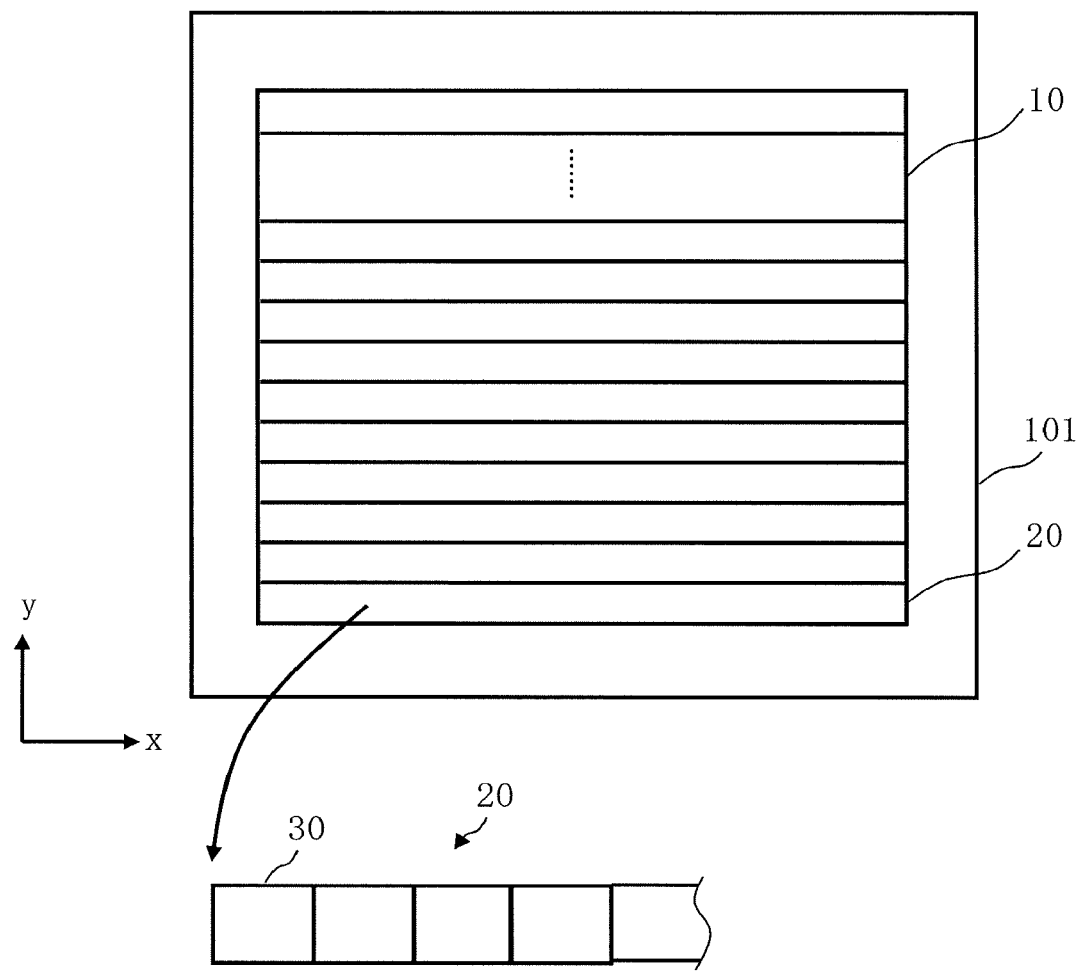
FIG. 9 is another conceptual diagram that illustrates an inspection region according to Embodiment 1.

FIG. 9 is another conceptual diagram that illustrates an inspection region according to Embodiment 1. As described above, for each inspection stripe 20 of a plurality of inspection stripes 20 (stripe regions) acquired by virtually dividing the inspection region 10 of the mask 1 into a stripe shape, the stripe region image (optical image) is acquired. As will be described later, the stripe region image is divided into a plurality of frame images having the same width as the width of the inspection stripe 20, for example, the scanning width W in the x direction. Thus, the inspection region 10 is virtually divided into a plurality of frame regions 30 having a size that is the size of such a frame image. In other words, the inspection region 10 of the photomask is virtually divided into a plurality of inspection stripes 20 each having a stripe shape in one-side size (y-direction size) of the frame region 30, and each inspection stripe 20 is virtually divided into a plurality of frame regions 30 in the other-side size (x-direction size) of the frame region 30.

As the process (S104) of dividing the image data into frames of the mask 1, the dividing unit 58 dividing the image data into frames divides a stripe region image (optical image) into a plurality of frame images (optical images) for each frame region 30 in a predetermined size (for example, the scanning width W) in the x direction for each inspection stripe 20. For example, the stripe region image is divided into frame images of 512×512 pixels. In other words, the stripe region image for each inspection stripe 20 is divided into a plurality of frame images (optical images) having the same width as the width of the inspection stripe 20, for example, the scanning width W. By executing such a process, a plurality of frame images (optical images) corresponding to the plurality of frame regions 30 are acquired.

The plurality of frame images acquired from the mask 1 are stored in the storage device 60.

Here, in the magnetic disk device 109, designed mask patterns 1 and 2 that are sources of the patterns 13 and 15 divided into two for the double patterning described above are stored.

As the process (S105) of generating reference images of the mask 1, the reference image is generated based on design data in which the designed mask pattern 1 that is the two-dimensional figure data generated by computer aided design system of the divided pattern 13 described above is defined. Here, a plurality of reference images corresponding to the plurality of frame regions 30 is generated. More specifically, the operation is executed as below. First, the image converting circuit 111 reads the design data from the magnetic disk device 109 through the control computer 110 and converts each pattern feature of each frame region 30 defined in the read design data into image data of binary values or multiple values, and the image data is transmitted to the reference image preparation circuit 112.

Here, a pattern feature defined in the design data, for example, is composed of a rectangle or a triangle as a basic figure, and, for example, figure data defining the shape, the size, the position, and the like of each pattern figure is stored in information such as coordinates (x, y) of the figure at the reference position, the length of the side, a figure code that is an identifier identifying the figure type such as a rectangle or a triangle. Here, the figures of evaluation patterns described above are defined.

When the information of the designed pattern that is the figure data is input to the image converting circuit 111, data of each figure is developed, and the figure code representing a figure shape of the figure data, the figure size, and the like are analyzed. Then, as a pattern arranged in a square configured in units of grids each having a predetermined quantization size, reference design image data of binary values or multiple values is developed and output. In other words, reference design data is read, the occupancy rate of a figure in the designed pattern is calculated for each square acquired by virtually dividing the inspection region as a square configured in units of a predetermined size, and occupancy rate data of n bits is output. For example, one square may be set as one pixel. When one pixel has resolving power of $1/2^8$ (=$1/256$), a small region of $1/256$ corresponding to the region of the figure in the pixel is assigned, and the occupancy rate in the pixel is calculated. Then, the calculated occupancy rate is output to the reference image preparation circuit 112 as occupancy rate data of 8 bits.

Next, the reference image preparation circuit 112 executes an appropriate filtering process for the design image data that is the transmitted image data of the figure.

Figure 10:
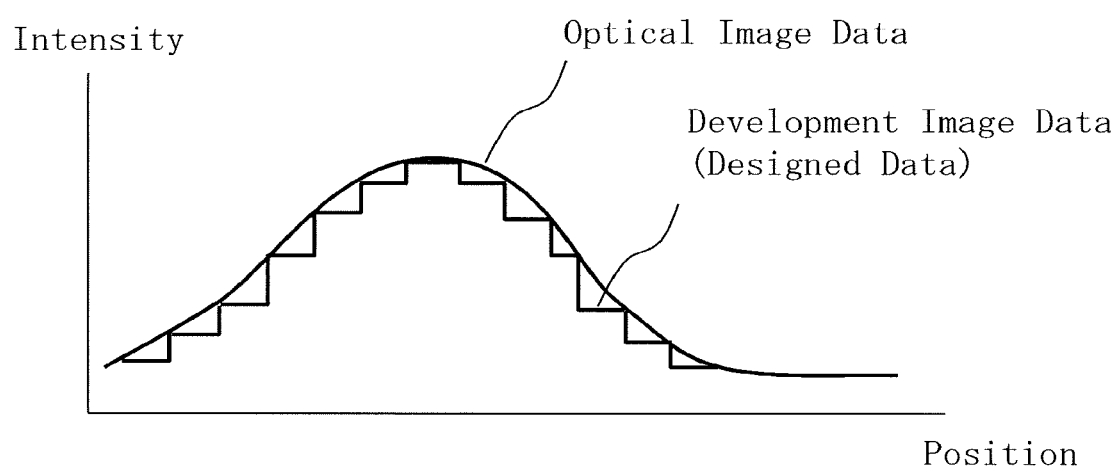
FIG. 10 is a diagram that illustrates a filtering process according to Embodiment 1.

FIG. 10 is a diagram that illustrates the filtering process according to Embodiment 1. The measured data as an optical image from the sensor circuit 106 is in a state to be filtered by the resolution characteristic of the optical zoom system 104, an aperture effect of the photodiode array 105, or the like, in other words, in consecutive analog state. Accordingly, by filtering the design image data of which the image intensity (gray value) is in digital, the design image data can be adjusted to the measured data. In this way, a design image (reference image) to be compared with a frame image (optical image) is generated. The generated design image is output to the pattern comparison circuit 108, and reference data 1 of the reference image, which is used for inspecting the mask 1, output to the pattern comparison circuit 108 is stored in the storage device 50.

In the way described above, a plurality of reference images corresponding to a plurality of frame regions 30 are generated. Accordingly, a plurality of reference images corresponding to a plurality of frame images of each inspection stripe 20 captured from the mask 1 are generated.

As the process of generating a position deviation map of the mask (S106), the pos map generating circuit 140 (position deviation map generating processing circuitry) generates a position deviation map in which a position deviation amount of an optical image acquired from a divided pattern of the mask 1 represented by the optical image data with respect to a designed position aligned to the coordinate defined by alignment marks formed as a part of the divided pattern on the two masks 1 and 2 on which a pattern divided into two parts for the double patterning are formed is defined. Here, the position deviation map 1 of the divided pattern formed on the mask 1 is generated. First, the position alignment unit 64 executes position alignment of each of a plurality of frame images acquired from the divided pattern formed on the mask 1 with respect to a corresponding reference image and, for each frame image (frame region), calculates a position deviation amount (first position deviation amount) between the frame image and a corresponding reference image. The position alignment is executed while the entire frame region is shifted. For example, it is preferable to align the positions in units of sub pixels by using a least squares method using a calculation model. Alternatively, it may be configured such that a position deviation amount between a pattern feature in the frame image and a corresponding pattern feature in a reference image is calculated, and a position in the frame image at which a sum of squares of the position deviation amounts of all the pattern features in the frame image is minimal is set as the position deviation amount of the frame region. In this way, based on the reference data generated from the design data, a position deviation of the divided pattern formed on the mask 1 can be acquired. In addition, a position deviation depending on the position of the frame region 30 can be acquired. Then, an x-direction displacement and a y-direction displacement are calculated, and the calculated position deviation amount (position deviation amount 1) for each frame region 30 is stored in the storage device 66 as a position deviation amount of the pattern center.

Next, the pos map generating circuit 140 (position deviation map generating processing circuitry) generates a position deviation map in which a position deviation amount of an optical image represented by the optical image data with respect to a designed position is defined by using alignment marks formed as a part of the divided pattern for each divided pattern formed on the two masks. Here, the position deviation map 1 corresponding to the mask 1 is generated. In each minimum element value of the position deviation map 1, an x-direction displacement and a y-direction displacement are defined as the position deviation amount of the pattern center. The generated position deviation map 1 is output to the difference pos map generating circuit 144 and is stored in the storage device 70 as the position deviation amount of the pattern center. As described above, by using the alignment marks formed as a part of the divided pattern, the stage coordinate system defined by the laser interferometer system 122 is corrected, and accordingly, the coordinate system of the mask defined by the alignment marks can be adjusted to the designed coordinate system of the pattern. Accordingly, the calculated position deviation amount (position deviation amount 1) for each frame region 30 can be represented as a deviation amount with respect to the alignment marks formed as a part of the divided pattern formed on the mask 1. Thus, the position deviation map 1 can be regarded as a position deviation map of the center coordinates of the divided pattern formed on the mask 1.

As the alignment process (S107) for the mask 2, by using an alignment method not illustrated in the drawing, the mask 2 is aligned to the coordinate defined by alignment marks formed as a part of the pattern on the mask 2. The alignment technique may be similar to that of the alignment process of the mask 1 (S102).

After the alignment process (S107) for the mask 2, as the process (S108) of acquiring an optical image of the mask 2, by using the mask 2 on which one additional divided pattern 15 is formed, the optical image acquiring mechanism 150 acquires optical image data of the divided pattern 15. A specific operation is similar to that of a case where the optical image data of the divided pattern 15 of the mask 1 is acquired. Thus the optical image acquiring mechanism 150 acquires optical image data of a corresponding divided pattern for each of a plurality of masks on each of which the corresponding divided pattern of divided patterns acquired by dividing a pattern into a plurality of parts for multiple patterning has been formed, the each of the plurality of masks being aligned to the coordinate defined by alignment marks formed as a part of the corresponding divided pattern. Thereafter, the stripe region image (stripe data 2) of the mask 2 is transmitted to the pattern comparison circuit 108 together with the position data of the mask 2 on the XYθ stage 102 that is output from the position information output circuit 107. The measured data (pixel data), for example, is an unsigned 8-bit data and represents the gray scale (light intensity) of the brightness of each pixel. The stripe region image output to the pattern comparison circuit 108 is stored in the storage device 54.

As the process (S110) of dividing the image data into frames of the mask 2, the dividing unit 58 dividing the image data into frames divides the stripe region image (optical image) into a plurality of frame images (optical images) of each frame region 30 in a predetermined size (for example, the same width as the scanning width W) in the x direction for each inspection stripe 20 of the mask stripe 20 of the mask 2. Through such a process, a plurality of frame images (optical images) corresponding to a plurality of frame regions 30 is acquired. The plurality of frame images acquired from the mask 2 is stored in the storage device 62.

As the process (S111) of generating reference images of the mask 2, each reference image is generated based on design data in which a designed pattern 2 that is the two-dimensional figure data generated by computer aided design system of the divided pattern 15 described above is defined. Here, a plurality of reference images corresponding to the plurality of frame regions 30 is generated. The generation method thereof is similar to the method of generating reference images used for the mask 1. The generated reference image is output to the pattern comparison circuit 108, and reference data 2 of the reference image, which is used for inspecting the mask 2, output to the pattern comparison circuit 108 is stored in the storage device 56.

In the way described above, a plurality of reference images corresponding to the plurality of frame regions 30 are generated. Accordingly, the plurality of reference images corresponding to the plurality of frame images of each inspection stripe 20 captured from the mask 2 are generated.

As the process (S112) of generating a position deviation map of the mask 2, first, the position alignment unit 64 executes position alignment between each of a plurality of frame images acquired from the mask 2 and a corresponding reference image, thereby, for each frame image (frame region), calculating a position deviation amount (second position deviation amount) between the frame image and the corresponding reference image. The position alignment is executed while the entire frame region is shifted. Then, an x-direction displacement and a y-direction displacement are calculated, and the calculated position deviation amount (position deviation amount 2) for each frame region 30 is stored in the storage device 68 as a position deviation amount of the pattern center.

Next, the pos map generating circuit 140 (position deviation map generating processing circuitry) generates a position deviation map in which a position deviation amount of an optical image represented by the optical image data with respect to a designed position is defined by using alignment marks formed as a part of the divided pattern for each divided pattern formed on the two masks. Here, the position deviation map 2 corresponding to the mask 2 is generated. In each minimum element value of the position deviation map 2, an x-direction displacement and a y-direction displacement are defined as the position deviation amount of the pattern center. The generated position deviation map 2 is output to the difference pos map generating circuit 144 and is stored in the storage device 72 as the position deviation amount of the pattern center. As described above, the coordinate system of the mask defined by the alignment marks can be adjusted to the design coordinate system of the pattern, and accordingly, the calculated position deviation amount (position deviation amount 2) for each frame region 30 can be represented as a deviation amount with respect to the alignment marks formed as a part of the divided pattern formed on the mask 2. Thus, the position deviation map 2 can be regarded as a position deviation map of the center coordinates of the divided pattern formed on the mask 2. Thus the pos map generating circuit 140 generates position deviation maps in each of which a position deviation at a center coordinate of each minimum element of a corresponding map of the position deviation maps is defined regarding the corresponding divided pattern formed on a corresponding mask of the plurality of masks, the position deviation at the center coordinate of the each minimum element being represented as a deviation from the coordinate defined by the alignment marks formed as the part of the corresponding divided pattern formed on the each of the plurality of masks, by using a position deviation amount of the corresponding divided pattern acquired by comparing the optical image data of the corresponding divided pattern formed on each of the plurality of masks with design pattern data of the corresponding divided pattern formed on each of the plurality of masks each aligned to the coordinate defined by the alignment marks.

As the process (S114) of generating a difference position value map, the difference position value map generating unit 74 (difference position value map generating processing circuitry) equipped to the difference pos map generating circuit 144 reads the position deviation map 1 from the storage device 70, reads the position deviation map 2 from the storage device 72, and generates a difference position value map in which a difference value between the position deviation amounts of the pattern centers of the position deviation maps of the two masks 1 and 2 on which a pattern divided into two parts for the multiple patterning are formed is defined. For example, the difference value may be calculated by comparing a designed value of a distance between adjacent patterns of the divided mask pattern 1 formed on the mask 1 and the divided pattern 2 formed on the mask 2 with a measured value of a distance between adjacent pattern centers acquired as a result of subtracting the position deviation amount of the pattern center of the mask 2 from the position deviation amount of the pattern center of the mask 1. The difference position value map is a difference value map of position deviations for one circuit pattern printed to a wafer or the like by using two divided patterns formed on two masks by using such a double patterning technique.

Figure 11:
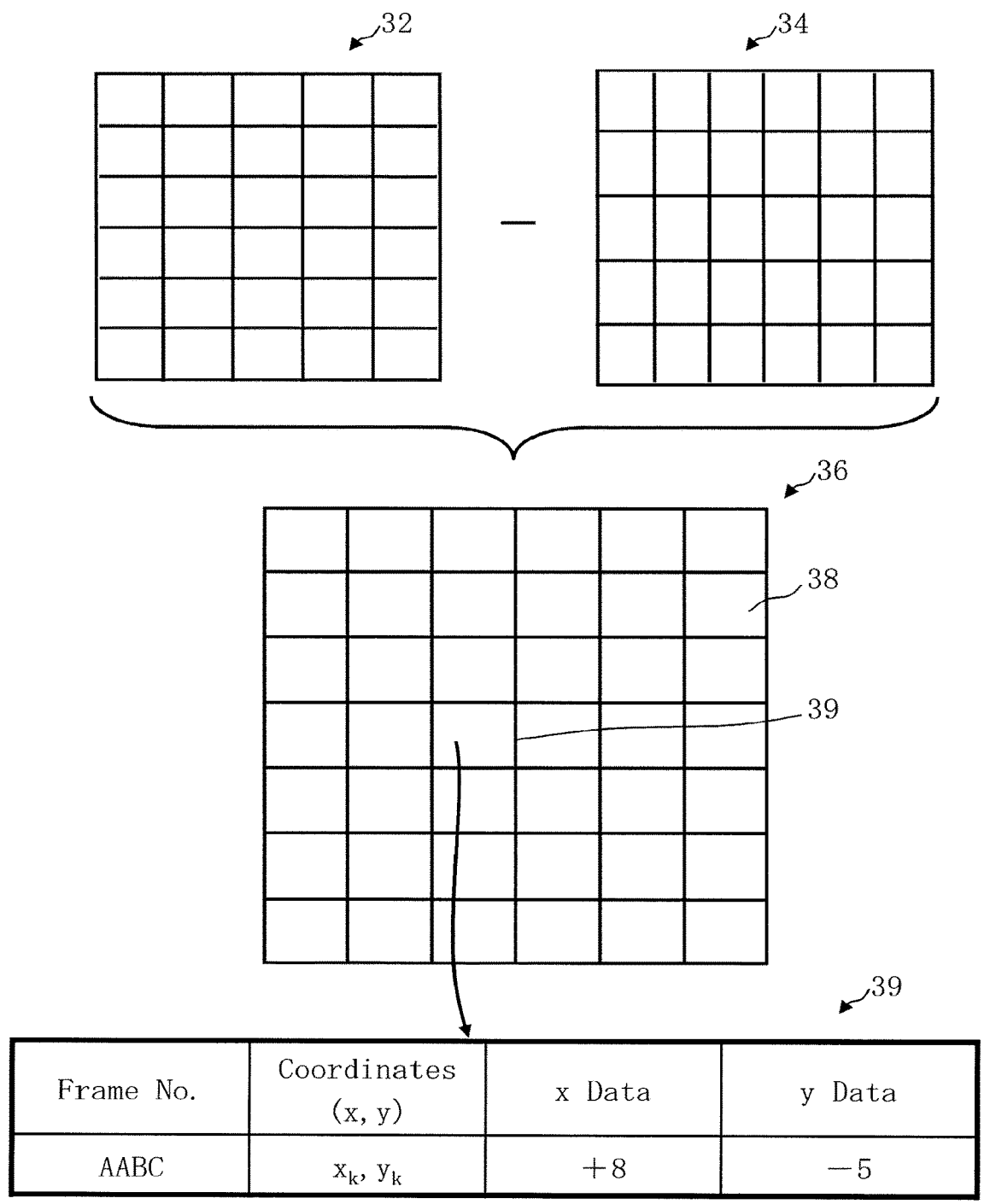
FIG. 11 is a diagram that illustrates position deviation maps and a difference position value map according to Embodiment 1.

FIG. 11 is a diagram that illustrates pos maps and a difference pos map according to Embodiment 1. In the case illustrated in FIG. 11, in a difference pos map 36, for each frame region 30, a value acquired by subtracting a minimum element value of a position deviation map 34 (position deviation map 2) of the mask 2 from a minimum element value of a position deviation map 32 (position deviation map 1) of the mask 1 is defined. In each minimum element value 38, as a difference value between the position deviation amounts of pattern centers within the minimum element value 38, an x-direction difference value and a y-direction difference value are defined. Such a difference value between the minimum element values 38 is the same as a result of a comparison (subtraction) between a designed value of a distance between adjacent patterns of the divided mask pattern 1 formed on the mask 1 and the divided pattern 2 formed on the mask 2 described above and a measured value of a distance between adjacent pattern centers acquired by subtracting the position deviation amount of the pattern center of the mask 2 from the position deviation amount of the pattern center of the mask 1. The generated difference position value map 36 is stored in the storage device 76. Thus the difference position value map generating unit 74 generates one difference position value map defining a difference value between relative position deviation amounts of the each minimum element of the position deviation maps each aligned with the alignment marks as a reference acquired by comparing the optical image data and the design pattern data of the corresponding divided pattern, corresponding to the plurality of the masks each having the corresponding divided pattern formed thereon.

As the target frame specifying process (S116), the target frame specifying unit 78 (region specifying processing circuitry) specifies a target frame region 39 (region) having a difference value exceeding a threshold of distance between patterns laying side-by-side by using the difference position value map 36. In each minimum element value 38 of the difference position value map 36, since the x-direction difference value and the y-direction difference value are defined, the target frame region 39 having a difference value exceeding the threshold in any one thereof may be specified. In the minimum element of the target frame region 39, as target frame information, a frame number, the coordinates (xk, yk) of the frame, an x-direction difference value (for example, +8 nm), and a y-direction difference value (for example, −5 nm) are defined. In the example illustrated in FIG. 11, while one target frame region 39 is illustrated as an example, a plurality of frame regions may be specified as the target frame regions 39. The target frame information is stored in the storage device 79. Thus the target frame specifying unit 78 specifies at least one region having the difference value exceeding the threshold by using the difference position value map.

As the target frame information outputting process (S118), under the control of the control computer 110, the external I/F circuit 121 (output mechanism) outputs the specified target frame information (specified region information and information of the region). More specifically, the control computer 110 reads the target frame information from the storage device 79 and outputs the target frame information (the specified region information and the information of the region) to the data managing apparatus 300 through the external I/F circuit 121 for each specified target frame (region). The target frame information includes information of at least the coordinates, the type of defect, and the reference image of the specified target frame (region). Thus the external I/F circuit 121 outputs at least coordinates, a type of defect, and information of a reference image of each region specified for the each region specified.

Figure 12:
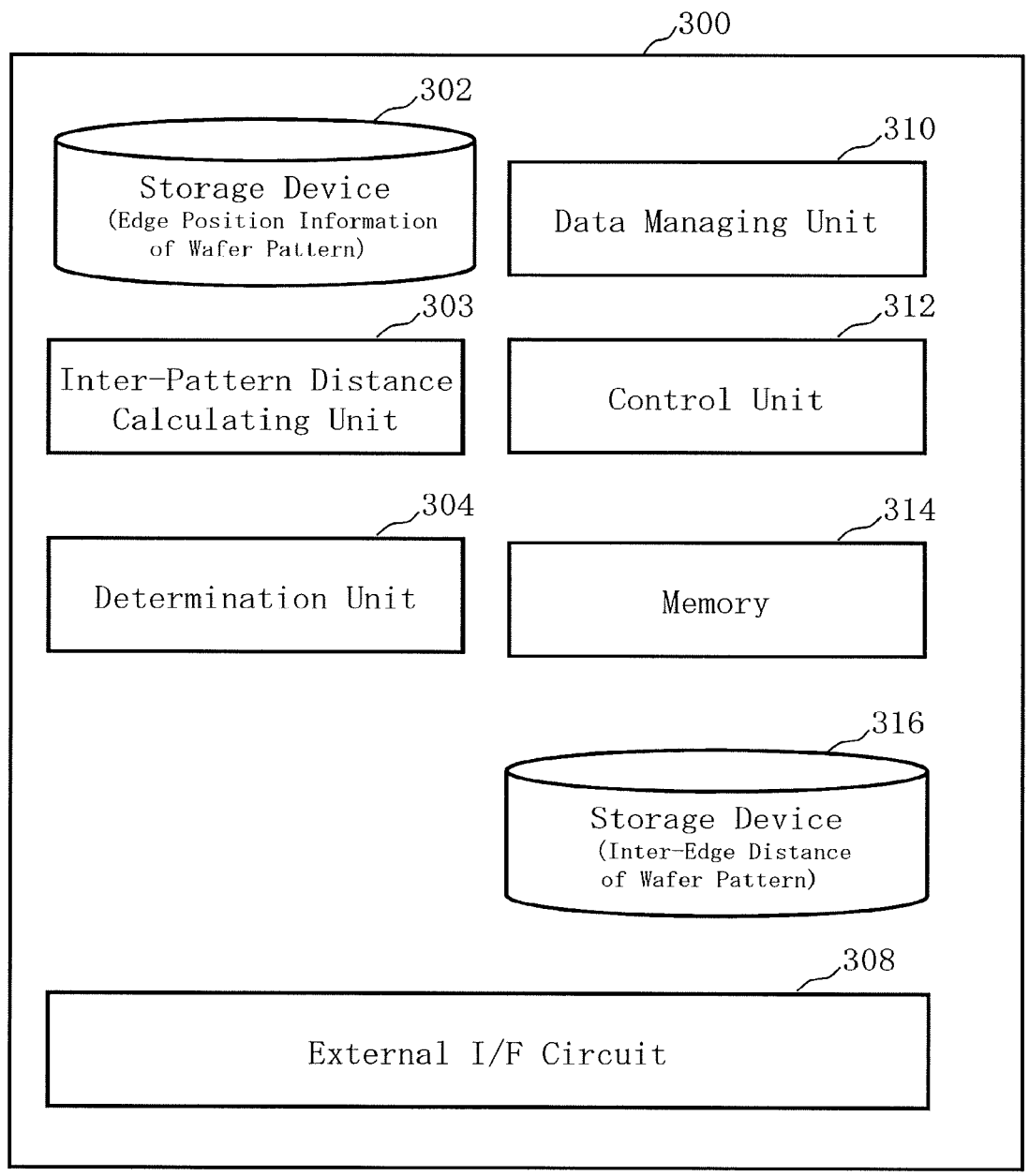
FIG. 12 is a diagram that illustrates the internal configuration of a data managing apparatus according to Embodiment 1.

FIG. 12 is a diagram that illustrates the internal configuration of a data managing apparatus of a mask manufacturing system according to Embodiment 1. In the case illustrated in FIG. 12, inside the data managing apparatus 300, a storage device 302 such as a magnetic disk, an inter-pattern distance calculating unit 303, a determination unit 304, an external interface (I/F) circuit 308, a data managing unit 310, a control unit 312, a memory 314, and one additional storage device 316 are arranged. Each of "xxx units" such as the inter-pattern distance calculating unit 303, the determination unit 304, the data managing unit 310, and the control unit 312 includes a processing circuitry. The processing circuitry includes an electric circuit, a quantum circuit, a computer, a processor, a circuit board, or a semiconductor device, for example. Each of the "xxx units" may use the common processing circuitry (same processing circuitry), or may use different processing circuitries (separated processing circuitries). Input data or a calculated result that is necessary for the data managing apparatus 300 is stored each time in the memory 314.

The external I/F circuit 308, under the control of the control unit 312, receives the specified region information including information of at least coordinates, the type of defect, and a reference image from the pattern inspection apparatus 100 that has inspected all the patterns divided into a plurality of parts for the multiple patterning. The received specified region information is stored in the storage device 302. In addition, the external I/F circuit 308 may receive a difference position value map in which a difference value between the position deviation amounts of the pattern centers, which are included in the position deviation maps, acquired from a plurality of masks on which patterns divided into a plurality of parts for the multiple patterning are formed is defined. Also from the received difference position value map file, a frame having a difference value exceeding a threshold of distance between patterns laying side-by-side may be recognized as a target frame. Then, the external I/F circuit 308, under the control of the control unit 312, reads information of the target frame from the storage device 302 and transmits the read information of the target frame to the aerial image measurement system 200.

As above, according to Embodiment 1, by executing exposure for a wafer or the like using a plurality of masks on which patterns divided into a plurality of parts for the multiple patterning are formed by using the pattern inspection apparatus 100, when one circuit pattern printed to a wafer is configured, a region (target frame) having a possibility of being a hot spot according to a position deviation of the patterns on the masks is specified, and the information of such a target frame can be transmitted to the aerial image measurement system 200 through the data managing apparatus 300.

Figure 13:
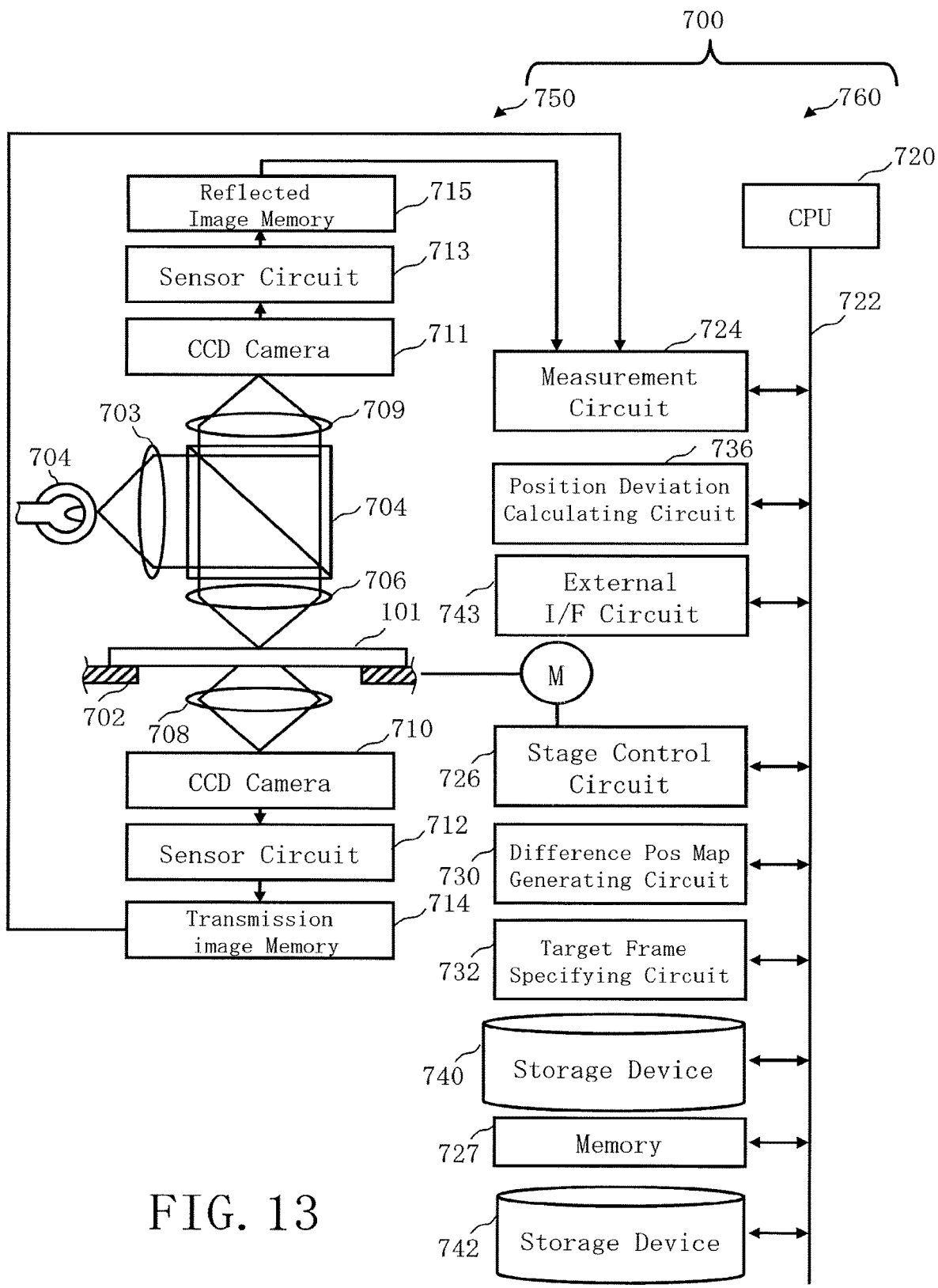
FIG. 13 is a configuration diagram that illustrates the configuration of the pattern position measurement apparatus according to Embodiment 1.

FIG. 13 is a configuration diagram that illustrates the configuration of the pattern position measurement apparatus according to Embodiment 1. The pattern position measurement apparatus 700 may be used instead of the pattern inspection apparatus 100. In FIG. 13, the pattern position measurement apparatus 700 includes a pattern image acquiring mechanism 750 and a control system circuit 760 (a control unit).

The pattern image acquiring mechanism 750 includes a light source 704, a projection optical system 703, a beam splitter 704, an illumination optical system 706, an XYθ stage 702 that is movable, a transmission image formation optical system 708, a reflected image formation optical system 709, a transmission image CCD camera 710, a reflected image CCD camera 711, a transmission image sensor circuit 712, reflected image sensor circuit 713, a transmission image memory 714, and a reflected image memory 715. On the XYθ stage 702, a mask 101 is mounted. On the mask 101, patterns divided into a plurality of parts for the multiple patterning are formed. Each of the divided patterns is composed of a plurality of figures all of which are targets to be inspected. The mask 101, for example, is mounted on the XYθ stage 202 with a mask pattern surface facing upwards.

In the control system circuit 760, the control computer (CPU) 720 is connected to a measurement circuit 724, a stage control circuit 726, a position deviation calculating circuit 736, a difference position map generating circuit 730, a target frame specifying circuit 732, storage devices 740 and 742, an external interface (I/F) circuit 743, and a memory 727 via a bus network 722.

An illumination light emitted from the light source 704 is projected on the beam splitter 704 by the projection optical system 703. The illumination light reflected by the beam splitter 704 illuminates the mask 101 by the illumination optical system 706. The transmission light having transmitted through the mask 101 forms an image in the transmission image CCD camera 710 by the transmission image formation optical system 708. On the other hand, the reflected light reflected by the mask 101 is projected on the beam splitter 704 by the illumination optical system 706 to pass through the beam splitter 704. And, the reflected light having passed through the beam splitter 704 forms an image in the reflected image CCD camera 711 by the reflected image formation optical system 709. In addition, the transmission image sensor circuit 712 is connected to the transmission image memory 714 wherein a transmission pattern image formed, by a light shielding film, on the mask 101 obtained from the transmission image CCD camera 710 via the transmission image formation optical system 708 can be stored. The reflected image sensor circuit 713 is connected to the reflected image memory 715 wherein the reflected pattern image formed, by a light shielding film, on the mask 101 obtained from the reflected image CCD camera 711 via the reflected image formation optical system 709 can be stored.

The pattern image acquiring mechanism 750 (optical image acquiring mechanism) acquires an optical image data of each corresponding divided pattern for a plurality of masks 1 and 2 on which divided patterns acquired by dividing a pattern into a plurality of parts for multiple patterning has been formed, the plurality of masks 1 and 2 each being aligned to the coordinate defined by alignment marks formed as a part of the corresponding divided pattern.

Both the transmission image memory 714 and the reflected image memory 715 are connected to the measurement circuit 724. The measurement circuit 724 (pattern position measurement device) measures, as a pattern position, the position of a center of gravity of a pattern acquired from position information of an arbitral pattern edge designated in advance as a measuring condition, by using the optical image data of the divided patterns formed on the corresponding masks 1 and 2 being aligned to the coordinate defined by the alignment marks acquired in the pattern image acquiring mechanism 750. Further, position information of the stage acquired from the laser interferometer system not illustrated and relative position information of the XYθ stage 702 and the mask pattern defined by alignment operation are output from the stage control circuit 726 to the measurement circuit 724.

The position deviation calculating circuit 736 measures a relative position deviation of a pattern, based on a transmission pattern image (optical image data) acquired by the transmission image memory 714 or the reflected pattern image (optical image data) acquired by the reflected image memory 715. Specifically, the position deviation calculating circuit 736 (position deviation map generating processing circuitry) calculates position deviation amounts of each divided pattern by comparing a position of a pattern acquired from the optical image data of the divided pattern formed on the corresponding masks being aligned to the coordinate defined by alignment marks acquired in the measurement circuit 724 with a position of a pattern acquired from design data of the divided patterns formed on the corresponding masks 1 and 2. A position deviation amount is calculated as amount of a pattern position deviation calculated based on an edge position of an arbitral pattern selected in advance as a measuring condition.

And, the position deviation calculating circuit 736 generates respective corresponding position deviation maps at the center coordinate of the divided patterns formed on each of the masks 1 and 2, being represented as a deviation from the alignment marks formed as a part of the corresponding divided pattern formed on each of the masks 1 and 2, by using a position deviation amount of the corresponding divided pattern acquired.

The difference position map generating circuit 730 (difference position map generating circuit) generates a difference position map defining a difference value of relative position deviation amounts among a plurality of position deviation maps, with the alignment marks acquired by comparing the optical image data and the design data corresponding to the plurality of masks 1 and 2 each having the corresponding divided pattern formed thereon as a reference.

The target frame specifying circuit 732 (region specifying processing circuitry) specifies a region having a difference value exceeding a threshold by using the difference position map.

The external I/F circuit 743 (output mechanism) outputs information of at least design coordinates of the objective patterns for pattern position measurement, position deviation of the measured pattern against the design position of the objective pattern, and a captured image of the specified region, for each specified region.

As above, according to the embodiment 1, a pattern position deviation amount with respect to each alignment mark reference on each of the mask 1 and 2 is measured, when a circuit pattern is composed by the pattern position measurement apparatus 700 by exposing the circuit pattern to a wafer and the like, by using the plurality of masks 1 and 2 on which the pattern divided into the plurality of parts for multiple patterning are formed. And then, an in-plane distribution of a relative position deviation amount (difference position map) between corresponding masks 1 and 2 is generated. And, a position having the difference value exceeding a threshold or having the difference value possibly exceeding a threshold in the difference position map can be transferred to the areal image measurement system 200 via the data managing apparatus 300.

Figure 14:
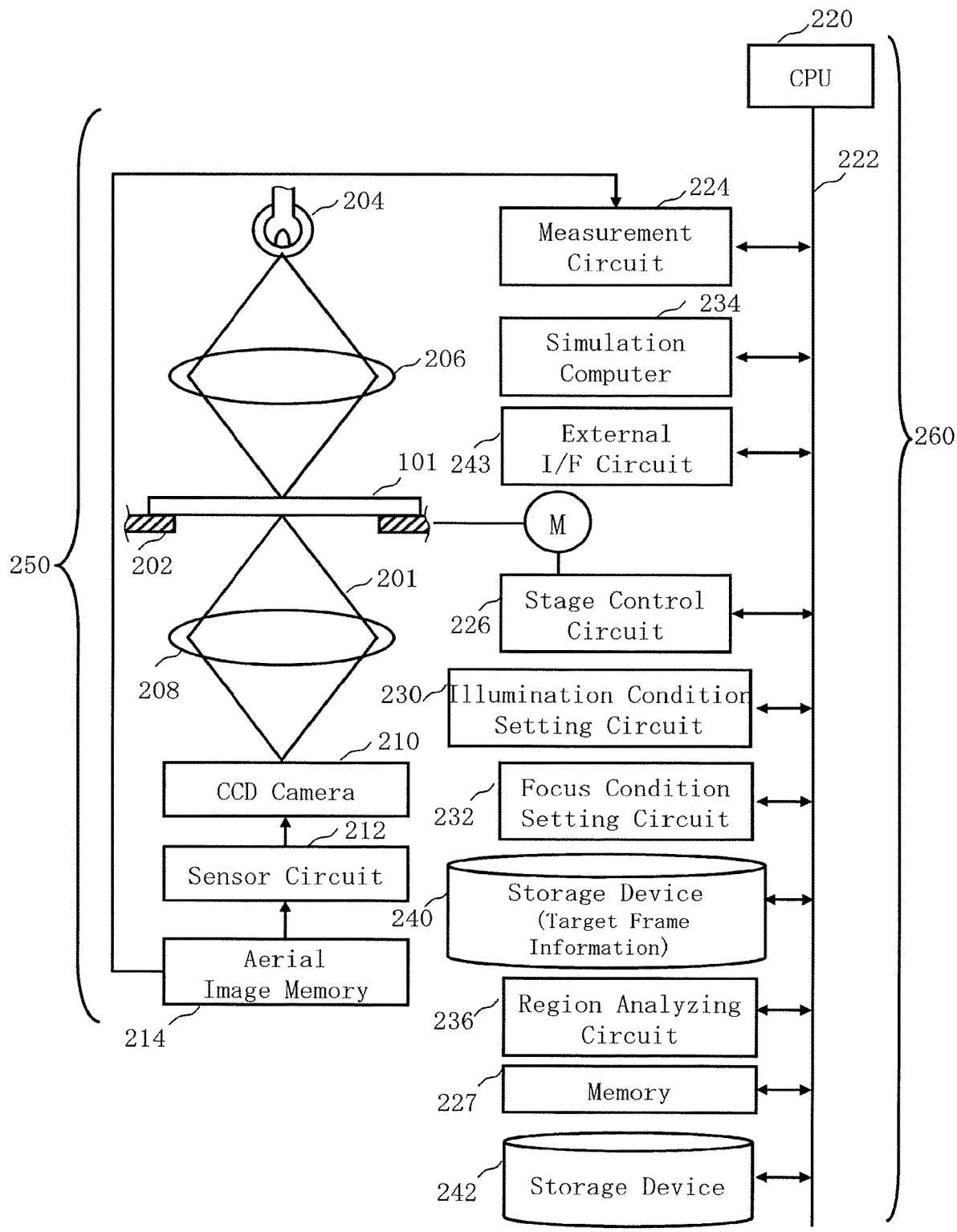
FIG. 14 is a configuration diagram that illustrates the configuration of an aerial image measurement system according to Embodiment 1.

FIG. 14 is a configuration diagram that illustrates the configuration of the aerial image measurement system according to Embodiment 1. In the configuration illustrated in FIG. 14, the aerial image measurement system 200 includes an aerial image acquiring mechanism 250 and a control system circuit 260 (control unit).

The aerial image acquiring mechanism 250 includes: a light source 204; an illumination optical system 206; an XYθ stage 202 that is movable; an image formation optical system 208; a CCD camera 210; a sensor circuit 212; and an aerial image memory 214. On the XYθ stage 202, a mask 102 is mounted. A mask 101 is a mask on which a pattern divided into a plurality of parts for multiple patterning are formed, and a target frame is specified through an inspection made by the pattern inspection apparatus 100. Each divided pattern is configured by a plurality of figures that are inspection targets altogether. The mask 101, for example, is mounted on the XYθ stage 202 with a mask pattern surface up.

In the control system circuit 260, a control computer 220 serving as a computer and a simulation computer 234 performing a simulation are connected to a measurement circuit 224, a stage control circuit 226, an illumination condition setting circuit 230, a focus condition setting circuit 232, a region analyzing circuit 236, storage devices 240 and 242, an external interface (I/F) circuit 243 (output mechanism); and memories 227 and 228 through a bus network 222. In addition, the sensor circuit 212 is connected to the aerial image memory 214, and the simulation computer 234 is configured to be accessible to the aerial image memory 214 through the bus network 222. The simulation computer 234 performs an exposure simulation and a process simulation, and the measurement circuit 224 measuring the edge position of the calculated wafer pattern is connected through the bus network 222. The XYθ stage 202 is driven by an X-axis motor, a Y-axis motor, and a θ-axis motor.

Figure 15:
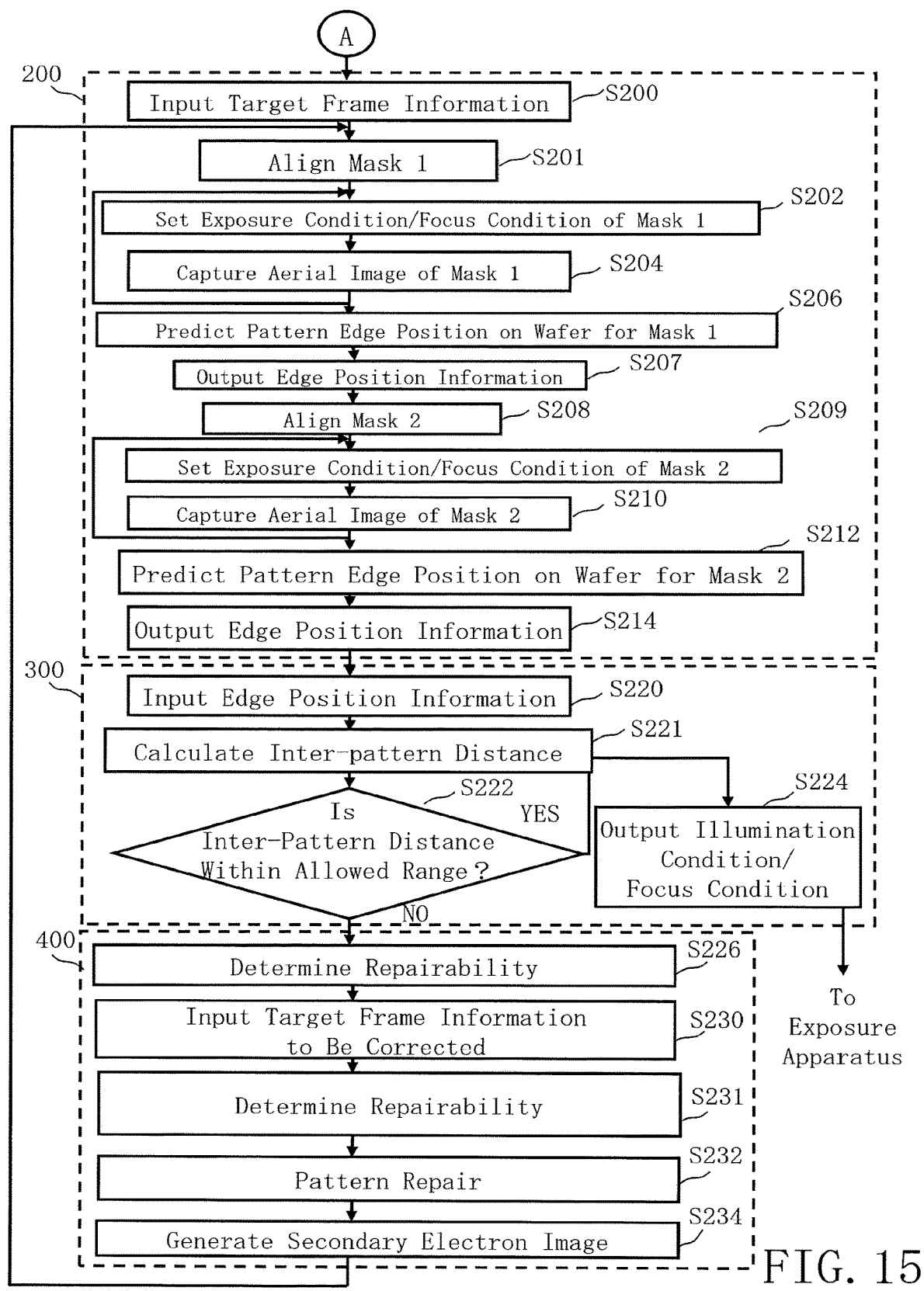
FIG. 15 is a flowchart that illustrates the remaining part of the main process according to the inspection method of Embodiment 1.

FIG. 15 is a flowchart that illustrates the remaining part of the main process according to the inspection method of Embodiment 1. In the case illustrated in FIG. 15, in the remaining part of the inspection method according to Embodiment 1, a series of processes is executed such as: a target frame information inputting process (S200); an alignment process (S201) for the mask 1; an illumination condition/focus condition setting process (S202) for the mask 1; an aerial image capturing process (S204) for the mask 1; an edge position predicting process (S206) of a wafer pattern calculated through the exposure simulation and the process simulation based on the aerial image of the mask 1; an edge position information outputting process (S207) of a wafer pattern calculated through the exposure simulation and the process simulation based on the aerial image of the mask 1 corresponding to the set illumination condition/focus condition; an alignment process (S208) for the mask 2; an illumination condition/focus condition setting process (S209) for the mask 2; an aerial image capturing process (S210) for the mask 2; an edge position predicting process (S212) of a wafer pattern calculated through the exposure simulation and the process simulation based on the aerial image of the mask 2; an edge position information outputting process (S214) of a wafer pattern calculated through the exposure simulation and the process simulation based on the aerial image of the mask 2 corresponding to the set illumination condition/focus condition; an edge position information inputting process (S220); an inter-pattern distance calculating process (S221) for calculating a gap between the edge position of a divided mask pattern 1 and the edge position of a divided pattern 2 that are adjacent to each other inside the target frame; an inter-pattern distance determining process (S222); an illumination condition/focus condition outputting process (S224) that is determined to be in an allowed range; a repairability determining process (S231); an edge position information inputting process (S230); a pattern repairing process (S232) of a mask to be repaired; and a secondary electron image generating process (S234).

The target frame information inputting process (S200), the alignment process (S201) for the mask 1, the illumination condition/focus condition setting process (S202) for the mask 1, the aerial image capturing process (S204) for the mask 1, the edge position predicting process (S206) of the wafer pattern calculated through the exposure simulation and the process simulation based on the aerial image of the mask 1, the edge position information outputting process (S207) of the wafer pattern calculated through the exposure simulation and the process simulation based on the aerial image of the mask 1 corresponding to the set illumination condition/focus condition, the alignment process (S208) for the mask 2, the illumination condition/focus condition setting process (S209) for the mask 2, the aerial image capturing process (S210) for the mask 2, the edge position predicting process (S212) of the wafer pattern calculated through the exposure simulation and the process simulation based on the aerial image of the mask 2, and the edge position information outputting process (S214) of the wafer pattern calculated through the exposure simulation and the process simulation based on the aerial image of the mask 2 corresponding to the set illumination condition/focus condition are executed inside the aerial image measurement system 200.

In addition, the edge position information inputting process (S220), the inter-pattern distance calculating process (S221) for calculating the gap between the edge position of the divided mask pattern 1 and the edge position of the divided pattern 2 that are adjacent to each other inside the target frame, the inter-pattern distance determining process (S222), the illumination condition/focus condition outputting process (S224) that is determined to be in the allowed range, and the inter-pattern distance determination process (S226) used for determining whether or not the inter-pattern distance can be configured to be in an allowed range by repairing at least one mask among the plurality of masks on which the pattern divided into the plurality of parts for the multiple patterning are formed, are executed inside the data managing apparatus 300.

The corrected target frame information inputting process (S230), the repairability determining process (S231), the pattern repairing process (S232), and the secondary electron image generating process (S234) are executed inside the pattern position repairing apparatus 400.

As the target frame information inputting process (S200), the external I/F circuit 243, under the control of the control computer 220, by using the mask 1 on which one of patterns divided into two parts for the multiple patterning is formed, inputs target frame information (specified region information) of the target frame region 39 (specified region) having difference value between the deviation maps in position of the pattern centers of divided patterns acquired by comparing the divided pattern captured for the mask aligned to the coordinate defined by alignment marks formed as a part of the divided pattern with a reference pattern acquired from the design data exceeding a threshold of distance between patterns laying side-by-side. The target frame information (specified region information) output by the pattern inspection apparatus 100 is input through the data managing apparatus 300. The input target frame information is stored in the storage device 240. Thus the storage device 240 receives the position deviation maps each acquired by comparing optical image data of corresponding divided pattern with design pattern data of the corresponding divided pattern for each of the plurality of masks on each of which the corresponding divided pattern of divided patterns acquired by dividing the pattern into the plurality of parts for multiple patterning has been formed, the plurality of masks each being aligned to the coordinate defined by alignment marks formed as a part of the corresponding divided pattern, and specific region information output by the pattern inspection apparatus 100 capable of outputting the specific region information of a specific region having a difference value between relative position deviation amounts of each minimum element of the position deviation maps acquired from the plurality of masks on each of which the corresponding divided pattern has been formed exceeding the threshold as input and stores the position deviation maps and the specific region information.

As the alignment process (S201) for the mask 1, by using an alignment mechanism of the aerial image measurement system 200 that is not illustrated in the drawing, the alignment of the mask 1 is executed by using alignment marks formed as a part of the divided pattern on the mask 1. As a technique for the alignment, for example, by using the optical image acquiring mechanism 250, for at least three alignment marks arranged on the periphery of divided patterns prepared as parts of the patterns in advance on a plurality of masks divided for multiple patterning, based on image data of each mark and position information of a stage from which the image data of the mark is acquired, the position of each alignment mark can be acquired. The position information of the alignment marks that is measured is compared with the designed position information of the alignment marks arranged on the periphery of the divided pattern, and a correction (for example, a correction of shift, magnification, orthogonality, or the like) of virtually linear positions is made such that the positions of the alignment marks, which are measured, match the designed positions. In this way, all the patterns of a plurality of masks on which the divided patterns are formed are inspected such that a difference between the measured value and the designed value is minimal. For this reason, for the optical image acquiring mechanism 250, when the stage 202 is scanned with high precision, a stage coordinate system defined by a laser interferometer system, which is not illustrated in the drawing, measuring the position of the stage is corrected. Accordingly, the coordinate system of the masks defined by the alignment marks formed as a part of the divided patterns can be adjusted to the designed coordinate system of the pattern. Alternatively, it is preferable to store correction/no-correction (for example, a correction of shift, magnification, orthogonality, or the like) of virtually linear positions that has been applied when alignment is executed by the pattern inspection apparatus 100 and a correction amount of a case where the correction is made in the memory 228 through the external I/F circuit in advance from the pattern inspection apparatus 100 through the data managing apparatus 300 and to use the stored information in the alignment processes (S201 and S208) of the masks.

As the illumination condition/focus condition setting process (S202) for the mask 1, the illumination condition setting circuit 230 sets an illumination condition of a case where the mask 1 is measured by the aerial image measurement system 200. Similarly, the focus condition setting circuit 232 sets a focus condition of a case where the mask 1 is measured by the aerial image measurement system 200. The illumination condition and the focus condition are set to include a condition used at the time of exposing the divided pattern formed on the mask 1 onto the wafer by the exposure apparatus 510 and a variation of parameters such as the illumination conditions and the focus conditions at the time of repeating exposure to the wafer. The illumination condition includes illumination conditions such as the shape of a pupil that is applied to the exposure and an applied optical filter. The focus condition includes a focus position for the mask.

In addition, it is preferable to store the illumination condition/focus condition of the aerial image measurement system 200 that are set for the mask 1 in a storage device not illustrated in the drawing in advance as a parameter that is used by the aerial image measurement system 200 as a standard and to appropriately use the parameter at the time of capturing an aerial image.

As the aerial image capturing process (S204) for the mask 1, first, on the XYθ stage 202, the mask 1 that is a measurement target is arranged. The region analyzing circuit 236 reads the target frame information from the storage device 240 and analyzes the position (coordinates) and the region range of the target frame region on the mask 1. Then, the XYθ stage 202 is moved such that the target frame region on the mask 1 is positioned on the optical axis.

Then, for a plurality of masks on which patterns divided into a plurality of parts for the multiple patterning are formed, by using the illumination condition and the focus condition set to include the condition used for exposing the divided pattern that is formed on the mask 1 onto the wafer using the exposure apparatus and the variation of parameters such as the illumination conditions and the focus conditions at the time of repeating the exposure to the wafer for a target frame specified based on the target frame information (specified region information), the aerial image acquiring mechanism 250 (image capturing mechanism) captures the aerial image of the mask. Here, the aerial image acquiring mechanism 250 (image capturing mechanism) captures an aerial image of the target frame region (specified region) of the mask 1.

More specifically, light emitted from the light source 204 having the same wavelength in exposure with the exposure apparatus 510 is emitted to the target frame region of the divided mask pattern 1 of the mask 1, which is defined in the difference position value map, through the illumination optical system 206 that is equivalent to the exposure apparatus 510 used when the divided pattern formed on the mask 1 is actually printed onto the wafer by the exposure apparatus 510. In addition, the illumination condition at this time is set to include the variation of the illumination conditions at the time of repeating exposure to the wafer. In addition to the illumination condition described above, a variation of the focus position with respect to the wafer at the time of repeating the exposure to the wafer is set to be included therein. The light that is transmitted through the mask 101 is formed as an optical image at the CCD camera 210 through the image formation optical system 208, and the optical image is captured. The divided mask pattern 1 formed on the mask 1, different from the exposure apparatus 510, for example, is reduced at the rate of 1/150 and forms an image at the CCD camera 210. The number NA of openings may be adjusted by the image formation optical system 208 so as to acquire an equivalent image using the exposure apparatus 510.

The aerial image of the target frame region that is formed on the CCD camera 210 is photoelectrically converted and is further A/D (analog-to-digital) converted by the sensor circuit 212. Then, the aerial image data is stored in the aerial image memory 214.

Then, in order to acquire aerial images of all the target frame regions in the divided mask pattern 1 formed on the mask 1, the process is returned to the illumination condition/ focus condition setting process (S202) for the mask 1, and the illumination condition/focus condition setting process (S202) for the mask 1 and the aerial image capturing process (S204) for the mask 1 are repeated while the illumination condition/focus condition are changed.

As the edge position predicting process (S206) of a wafer pattern calculated through the exposure simulation and the process simulation based on the aerial image of the mask 1, the simulation computer 234, for each mask, executes an exposure simulation and a process simulation based on the aerial image of the target frame that is captured according to the illumination condition and the focus condition used for exposure, which are arbitrary designated in advance and simulates the shape of the pattern printed onto the wafer. The measurement circuit 224 (measurement processing circuitry) measures the edge position of the wafer pattern from the shape of the wafer pattern acquired by the simulation computer 234. Then, together with the measurement, the measurement circuit 224 (measurement processing circuitry), in a case where the aerial images of the target frames of masks is composed, generates information of the edge position of the pattern from which it can be checked whether or not an inter-pattern distance of the target frame is within an allowed range. Here, the measurement circuit 224 (measurement processing circuitry) measures the edge position of the wafer pattern applied to the mask 1. More specifically, the operation is executed as below.

The simulation computer 234 reads aerial image data captured under a plurality of illumination conditions and focus conditions from the aerial image memory 214 and calculates a wafer pattern at the time of printing each pattern onto the wafer based on the captured aerial images of the target frame regions of the masks 1 and 2 for each illumination condition/focus condition. The measurement circuit 224 (measurement processing circuitry) measures the edge position of the wafer pattern of the mask 1 that is acquired by the simulation computer 234. The measured edge position information of the wafer pattern is stored in another storage device 242 in association with the illumination condition/focus condition at the time of capturing the aerial image. The edge position information of the wafer pattern is an example of the information from which it can be determined whether or not an inter-pattern distance between wafer patterns adjacent to each other in the target frame region is in the allowed range.

As the alignment process (S208) for the mask 2, by using an alignment mechanism of the aerial image measurement system 200 that is not illustrated in the figure, the mask 2 is aligned to the coordinate defined by alignment marks formed as a part of the divided pattern formed on the mask 2. The specific technique is the same as that used for the alignment process (S200) for the mask 1.

As the illumination condition/focus condition setting process (S209) for the mask 2, the illumination condition setting circuit 230 sets an illumination condition of a case where the mask 2 is measured by the aerial image measurement system 200. Similarly, the focus condition setting circuit 232 sets a focus condition of a case where the mask 2 is measured by the aerial image measurement system 200. The illumination condition and the focus condition are set to include a condition used at the time of exposing the divided pattern formed on the mask 2 onto the wafer by using the exposure apparatus 510 and a variation of parameters such as the illumination conditions and the focus conditions at the time of repeating exposure to the wafer. The illumination condition includes illumination conditions such as the shape of a pupil that is applied to the exposure and an applied optical filter. The focus condition includes a focus position of the mask.

In addition, it is preferable to store the illumination condition/focus condition of the aerial image measurement system 200 that are set for the mask 2 in a storage device not illustrated in the drawing in advance as a parameter that is used by the aerial image measurement system 200 as a standard and to appropriately use the parameter at the time of capturing an aerial image.

As the aerial image capturing process (S210) for the mask 2, first, on the XYθ stage 202, the mask 2 that is a measurement target is arranged. The region analyzing circuit 236 reads the target frame information from the storage device 240 and analyzes the position (coordinates) and the region range of the target frame region on the mask 2. Then, the XYθ stage 202 is moved such that the target frame region on the mask 2 is positioned on the optical axis.

Then, for a plurality of masks on which patterns divided into a plurality of parts for the multiple patterning are formed, by using the illumination condition and the focus condition set to include the condition used for exposing the divided pattern that is formed on the mask 2 onto the wafer using the exposure apparatus and the variation of parameters such as the illumination conditions and the focus conditions at the time of repeating the exposure to the wafer for a target frame specified based on the target frame information (specified region information), the aerial image acquiring mechanism 250 (image capturing mechanism) captures the aerial image of the mask. Here, the aerial image acquiring mechanism 250 (image capturing mechanism) captures an aerial image of the target frame region (specified region) of the mask 2.

More specifically, light emitted from the light source 204 having the same wavelength in exposure with the exposure apparatus 510 is emitted to the target frame region of the divided pattern 2 of the mask 2, which is defined in the difference position value map, through the illumination optical system 206 that is equivalent to the exposure apparatus 510 used when the divided pattern formed on the mask 2 is printed onto the wafer by the exposure apparatus 510. In addition, the illumination condition at this time is set to include the variation of the illumination conditions at the time of repeating exposure to the wafer. In addition to the illumination condition described above, a variation of the focus position with respect to the wafer at the time of repeating the exposure to the wafer is set to be included therein. The light that is transmitted through the mask 101 is formed as an optical image at the CCD camera 210 through the image formation optical system 208, and the optical image is captured. The divided mask pattern 2 formed on the mask 2, different from the exposure apparatus 510, for example, is reduced at the ratio of 1/150 and forms an image at the CCD camera 210. The number NA of openings may be adjusted by the image formation optical system 208 so as to acquire an equivalent image using the exposure apparatus 510.

The aerial image of the target frame region that is formed on the CCD camera 210 is photoelectrically converted and is further A/D (analog-to-digital) converted by the sensor circuit 212. Then, the aerial image data is stored in the aerial image memory 214.

Then, in order to acquire aerial images of all the target frame regions in the divided pattern 2 formed on the mask 2, the process is returned to the illumination condition/focus condition setting process (S209) for the mask 2, and the illumination condition/focus condition setting process (S209) for the mask 2 and the aerial image capturing process (S210) for the mask 2 are repeated while the illumination condition/focus condition are changed.

As above, for each mask, the aerial image of the target frame region (specified region) is captured. In other word, the aerial image acquiring mechanism 250 captures aerial images of the plurality of masks on each of which the corresponding divided pattern has been formed for the specific region specified based on the specific region information by using a plurality of illumination conditions and a plurality of focus conditions.

As the edge position predicting process (S212) of a wafer pattern calculated through the exposure simulation and the process simulation based on the aerial image of the mask 2, the simulation computer 234, for each mask, executes an exposure simulation and a process simulation based on the aerial image of the target frame that is captured according to the illumination condition and the focus condition used for exposure, which are arbitrary designated in advance, and simulates the shape of the pattern printed onto the wafer. The measurement circuit 224 (measurement processing circuitry) measures the edge position of the wafer pattern from the shape of the wafer pattern acquired by the simulation computer 234. Then, together with the measurement, the measurement circuit 224 (measurement processing circuitry), in a case where the aerial images of the target frames of masks are composed, generates information of the edge position of the pattern from which it can be checked whether or not an inter-pattern distance of the target frame is within an allowed range. Here, the measurement circuit 224 (measurement processing circuitry) measures the edge position of the wafer pattern applied to the mask 2. More specifically, the operation is executed as below.

The simulation computer 234 reads aerial image data captured under a plurality of illumination conditions and focus conditions from the aerial image memory 214 and calculates a wafer pattern at the time of printing each pattern onto the wafer based on the captured aerial images of the target frame region of the masks 1 and 2 for each illumination condition/focus condition. The measurement circuit 224 (measurement processing circuitry) measures the edge position of the wafer pattern of the mask 2 that is acquired by the simulation computer 234. The measured edge position information of the wafer pattern is stored in another storage device 242 in association with the illumination condition/focus condition at the time of capturing the aerial image. The edge position information of the wafer pattern is an example of the information from which it can be determined whether or not an inter-pattern distance between wafer patterns adjacent to each other in the target frame region is in the allowed range. Thus the simulation computer 234 calculates edge position information defining an edge position of a wafer pattern acquired through lithographic processes with the corresponding divided pattern for each of the plurality of masks, based on the aerial images of the plurality of masks captured for the specific region.

As above, for each mask, the edge position of the pattern of the captured aerial image of the target frame region (specified region) is measured, and the edge position of the pattern on the wafer according to a plurality of exposed masks is predicted.

As the edge position information outputting process (S214), under the control of the control computer 220, the external I/F circuit 243 (output mechanism), based on the aerial image of the target frame region acquired from a plurality of masks on which a pattern divided into a plurality of parts for the multiple patterning is formed, performs an exposure simulation and a process simulation and, in a case where wafer patterns calculated for the divided patterns are composed, outputs the information of the edge position of the wafer pattern described above used for determining whether or not an inter-pattern distance of the target frame region is in the allowed range. More specifically, the operation is executed as below. The I/F circuit 243 (output mechanism) outputs information (also referred to as information of the edge position of the pattern or a prediction result) of the edge position prediction of the printed wafer pattern acquired by the simulation computer 234 and the measurement circuit 224, which is stored in the storage device 242, to the data managing apparatus 300. The information of the edge position prediction of the pattern is information of a predicted edge position of the wafer pattern that corresponds to the set illumination condition/focus condition. In addition, the I/F circuit 243 (output mechanism) outputs the aerial image of the target frame region acquired from the plurality of masks to the data managing apparatus 300 together with the information of the target frame region.

As the edge position information inputting process (S220), under the control of the control unit 312, by using a plurality of masks 1 and 2 on which a pattern divided into a plurality of parts for the multiple patterning are formed, the external I/F circuit 308, for each mask, inputs the information of the edge position of the wafer pattern calculated through an exposure simulation and a process simulation for the mask aligned to the coordinate defined by alignment marks formed as a part of the divided pattern based on the aerial image of each mask acquired for the target frame specified based on the target frame information while changing at least one of the illumination condition and the focus condition.

The information of the edge position of the pattern, as described above, is prediction information acquired from the edge position of the wafer pattern calculated by the simulation computer 234 based on the aerial image. The information of the edge position of the wafer pattern output by the aerial image measurement system 200 is input to the external I/F circuit 308. More specifically, the operation is executed as below. The external I/F circuit 308, for the target frame region (specified region) of two masks 1 and 2, captures aerial images of the two masks acquired while changing at least one of the illumination condition and the focus condition and receives the information (the information of the edge position of the pattern) of the wafer pattern calculated by performing an exposure simulation and a process simulation based thereon as input from the aerial image measurement system 200. The input edge position prediction information is stored in the storage device 302. In addition, the external I/F circuit 308 receives the aerial images of the target frame region that are acquired from a plurality of masks as input together with the information of the target frame region and stores each input aerial image of the target frame region and the information of the target frame region in the storage device 302.

Figures 16A, 16B:
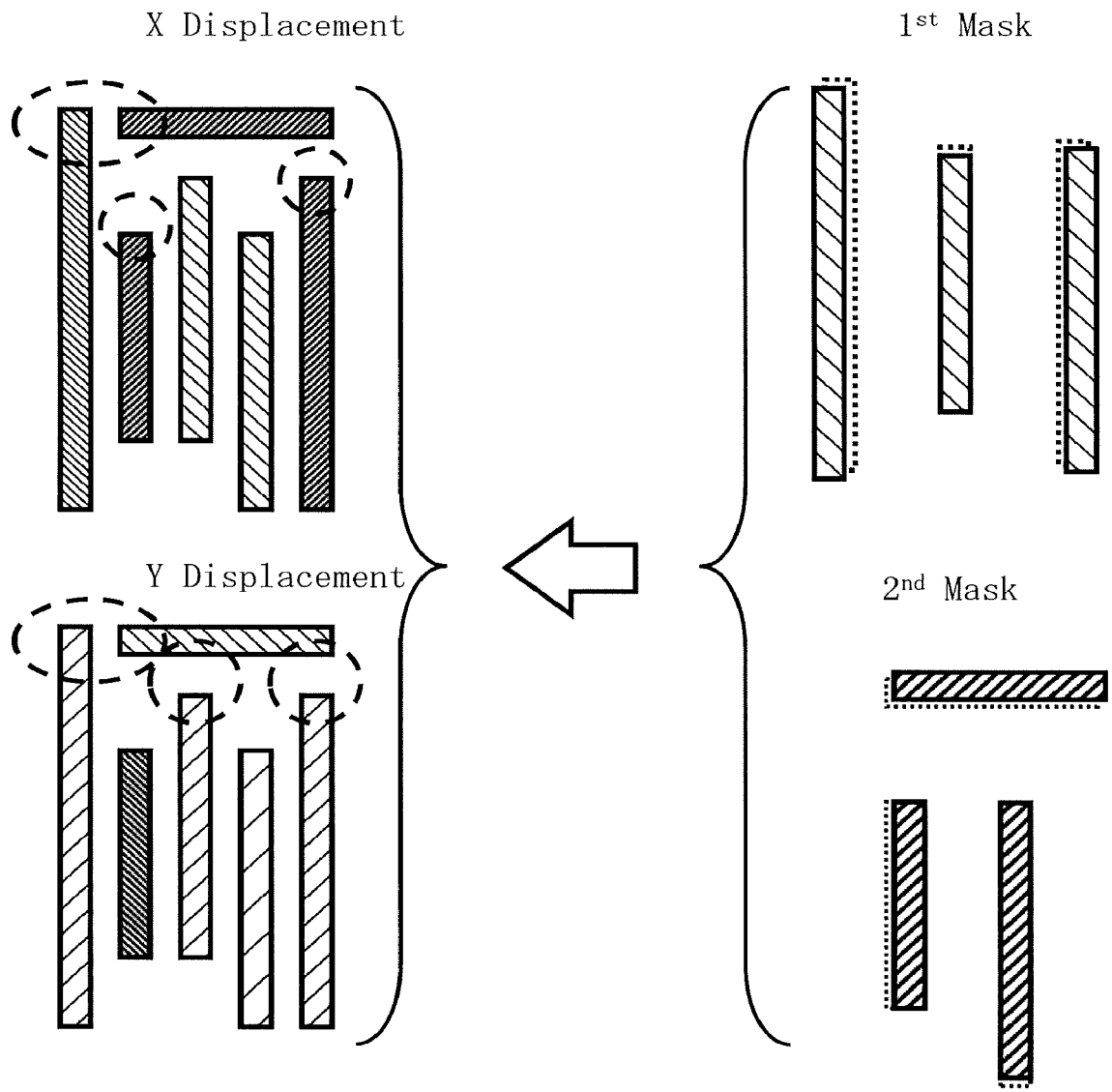
FIGS. 16A and 16B are diagrams that illustrate an example of position deviations of individual mask patterns and a position deviation of an overlapped pattern according to Embodiment 1.

FIGS. 16A and 16B are diagrams that illustrate an example of position deviations of individual mask patterns and an inter-pattern deviation of overlaid patterns according to Embodiment 1. FIG. 16A illustrates the position deviations against the design of each divided pattern of two masks divided into two parts for multiple patterning. When the divided patterns of the two masks having such position deviations are overlaid, as illustrated in FIG. 16B, an x-direction deviation and/or a y-direction displacement are generated for each pattern feature belonging to each divided pattern. As a result, the pattern error in position occurs on a wafer by exposing the pattern of the mask 1 onto the pattern of the mask 2. Thus, in Embodiment 1, the presence/absence of a defect in the distance between the patterns is inspected.

As the inter-pattern distance calculating process (S221), the inter-pattern distance calculating unit 303 calculates an inter-pattern distance corresponding to the set illumination condition/focus condition. More specifically, the operation is executed as below. The inter-pattern distance calculating unit 303 calculates an inter-pattern distance between adjacent wafer patterns of the plurality of masks 1 and 2 in the target frame region (specified region) by using the position prediction information of the wafer pattern calculated based on the aerial images of the masks 1 and 2 and the illumination condition/focus condition at the time of acquiring the aerial images used for the prediction. The illumination conditions/focus conditions at the time of printing the masks 1 and 2 using the exposure apparatus 510 may not be the same. Since the aerial images of the masks 1 and 2 are captured while the illumination condition/focus condition are changed, there may be many combinations of the position prediction information of the wafer patterns calculated based on the aerial images of the masks 1 and 2. Then, for each combination, a distance between pattern features that are adjacent to each other in a case where the edge position information of the wafer patterns of the masks 1 and 2 is overlaid is calculated. Since the edge positions of the wafer patterns at the time of pattern processing using the masks 1 and 2 are predicted, the distance can be calculated based on the predicted edge positions. Each inter-pattern distance calculated for each combination is stored in another storage device 316.

As the inter-pattern distance determination process (S222), the determination unit 304 determines an inter-pattern distance corresponding to the illumination condition/focus condition at the time of exposing the mask. In other words, the determination unit 304 assumes the condition at the time of acquiring the aerial image of each mask and determines whether or not the inter-pattern distance of the plurality of wafers that are adjacent to each other is in the allowed range based on the edge position information of the wafer patterns calculated based on the aerial images acquired from the masks in the specified target frame. More specifically, the operation is executed as below. The determination unit 304, by using the edge position prediction information of patterns on the wafers of the masks 1 and 2, determines whether or not an inter-pattern distance of the target frame region (specified region) in the plurality of masks 1 and 2 is in the allowed range. In the example illustrated in FIG. 6C, for example, it is determined whether or not each of the distances between patterns L1 and L2 is in the allowed range. In cases where there are a plurality of combinations for which all the distances between patterns in the target frame region are in the allowed range in consideration of variations in exposure, the process proceeds to the illumination condition/focus condition outputting process (S224). In cases where there are no sufficient number of combinations for which all the distances between patterns in the target frame region are in the allowed range (in a case where the likelihood at the time of exposure cannot be secured), the process proceeds to the next pattern repairing process. Thus the determination unit 304 (an exposure determining processing circuitry) determines whether or not an inter-pattern distance between the edge position of the wafer pattern of the corresponding divided pattern which has been formed on one of the plurality of masks and the edge position of the wafer pattern of the corresponding divided pattern which has been formed on another one of the plurality of masks calculated for the specific region is in an allowed range in a case where the edge position of the wafer pattern of the corresponding divided pattern which has been formed on the one of the plurality of masks and the edge position of the wafer pattern of the corresponding divided pattern which has been formed on the another one of the plurality of masks calculated for the specific region by the calculation processing circuitry is composed to be overlaid by using the alignment marks of the one of the plurality of masks and the alignment marks of the another one of the plurality of masks as a reference.

As the illumination condition/focus condition outputting process (S224), the data managing unit 310 outputs information of a combination of the illumination condition and the focus condition of each of the masks 1 and 2, which is in the allowed range, to the exposure apparatus 510 executing multiple patterning for a leading-edge semiconductor device manufacturing by using a plurality of masks 1 and 2. More specifically, the data managing unit 310 outputs information of an illumination condition and an focus condition of each of the masks 1 and 2 corresponding to a combination for which all the inter-pattern distances in the target frame region (specified region) are in the allowed range to the exposure apparatus 510 through the external I/F circuit 308. In a case where there is a plurality of combinations for which all the inter-pattern distances in the target frame region are in the allowed range, the information corresponding to each of the combinations may be output.

In the inter-pattern distance determination process (S222) described above, in cases where there are no sufficient number of combinations for which all the inter-pattern distances in the target frame region (specified region) are in the allowed range, the position of pattern of the mask 1 or the mask 2 or the positions of patterns of the both the masks that are divided into two parts for the double patterning are repaired. Hereinafter, specific description will be presented.

Figure 17:
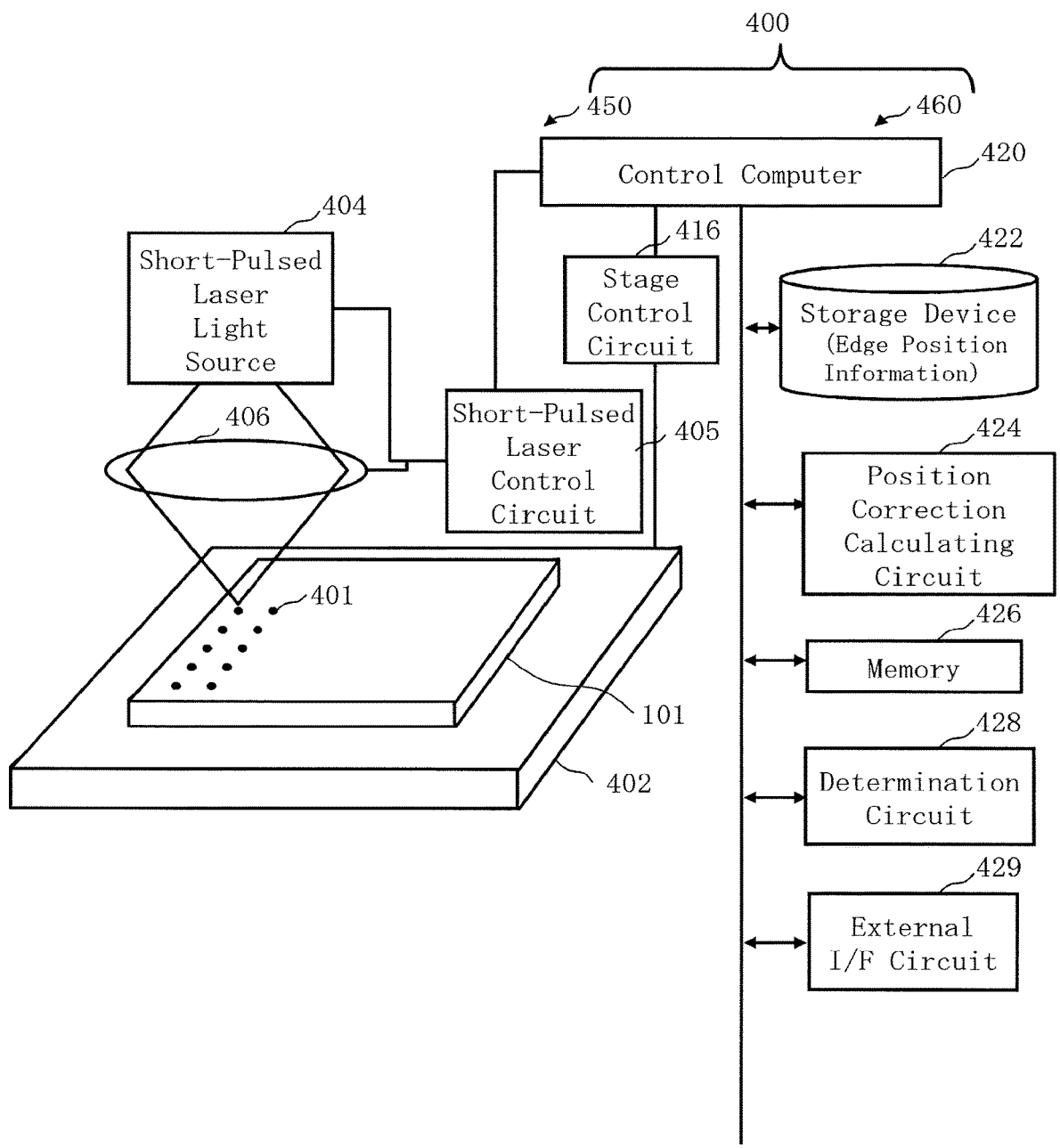
FIG. 17 is a configuration diagram that illustrates an example of the configuration of a pattern position repairing apparatus according to Embodiment 1.

FIG. 17 is a configuration diagram that illustrates an example of the configuration of the pattern position repairing apparatus according to Embodiment 1. In the example illustrated in FIG. 17, the pattern position repairing apparatus 400 includes: a pattern position repairing mechanism 450; and a control system circuit 460 (control unit).

The pattern position repairing mechanism 450 includes: a short-pulsed laser oscillation device 404; a short-pulsed laser control circuit 405; and an optical system 406 of short-pulsed laser for focusing and zooming. On the stage 402, the mask 101 is mounted. The masks 101 are the mask 1 and 2 for which there are no sufficient number of combinations for which all the inter-pattern distances adjacent to each other are in an allowed range, which are acquired by using the edge position prediction information of the wafer pattern of the specified region calculated based on the aerial images captured by the aerial image measurement system 200, in the specified region of the target frame specified by the pattern inspection apparatus 100. Here, a plurality of masks on which patterns divided into two parts for the multiple patterning are formed is included. The mask 101, for example, is mounted on the stage 402 with the mask pattern surface up.

In the control system circuit 460, a control computer 420 serving as a computer is connected to a stage control circuit 416, a storage device 422 such as a magnetic disk, a position correction calculating circuit 424, a memory 426, a determination circuit 428, and an external interface (I/F) circuit 429 (output mechanism) through a bus network. The control computer 420 is connected to the pulsed laser control circuit 405 controlling the emission of pulsed laser through a bus network.

As the edge position information inputting process (S230), under the control of the control computer 420, by using a plurality of the masks 1 and 2 on which divided patterns acquired by dividing a pattern into a plurality of parts for multiple patterning are formed, the external I/F circuit 429, for each mask, calculates edge position prediction information of a wafer pattern based on the aerial image of a target frame captured according to the illumination condition and the focus condition used for exposure designated arbitrarily in advance and, when both edge position prediction information acquired from two masks are overlaid, inputs a pattern edge position information used for determining whether or not an inter-pattern distance of the adjacent wafer patterns of the target frame is in the allowed range. Here, particularly, the external I/F circuit 429 inputs the edge position prediction information of a set of masks for which the inter-pattern distance is out of the allowed range in the inter-pattern distance determination process (S222) described above. More specifically, the external I/F circuit 429 inputs the edge position prediction information of a wafer pattern of at least one target frame region of two masks 1 and 2 in which the inter-pattern distance of wafer patterns in the target frame region (specified region) acquired from the two masks exceeds the allowed range. The input edge position prediction information is stored in the storage device 422.

The edge position prediction information of the wafer pattern of the target frame region of at least one mask of the plurality of the masks 1 and 2 described above is the edge position prediction information of the wafer pattern, which is arbitrarily selected by the data managing apparatus 300, acquired by the simulation computer 234 and the measurement circuit 224 of the aerial image measurement system 200 for the pattern divided into a plurality of parts for multiple patterning that is stored in the storage device 302 (data recording device). Then, the external I/F circuit 429 additionally inputs pattern information of the plurality of the divided patterns selected arbitrarily by the data managing apparatus 300. The input pattern information of the plurality of the divided patterns is stored in the storage device 422. In addition, the external I/F circuit 429 inputs data of the aerial image of each mask from the data managing apparatus 300. The input data of the aerial image of each mask is stored in the storage device 422.

As the inter-pattern distance determination process (S231), when a plurality of masks formed by a plurality of masks 1 and 2 are overlaid by using the multiple-patterning technique, and the pattern is printed onto the wafer, the determination circuit 428 (inter-pattern distance determination processing circuitry) determines whether or not the inter-pattern distance can be improved to be in the allowed range by repairing at least one mask. More specifically, the determination circuit 428 (inter-pattern distance determination processing circuitry) selects data of a plurality of divided patterns, which are divided into at least two or more parts for multiple patterning, corresponding to an arbitrary circuit pattern from the storage device 422. Then, in a case where the inter-pattern distance is out of the allowed range according to an arbitrary illumination condition and an arbitrary focus condition that are designated when the edge position prediction information of the wafer pattern in the target frame of each mask is composed, the determination circuit 428 (inter-pattern distance determination processing circuitry) determines a repairability of the position of the mask pattern in the target frame for at least one of the plurality of the masks 1 and 2 based on the edge position prediction information of the wafer pattern, the aerial image of the mask, and the information of the divided patterns formed on the masks.

As the pattern repairing process (S232), in a case that the inter-pattern distance is out of the allowed range according to an arbitrary illumination condition and an arbitrary focus condition that are designated when the edge position prediction information of the wafer patterns in the target frames of the masks is overlaid, the pattern position repairing mechanism 450 (repairing mechanism) repairs the position of the divided pattern formed on the mask by using pulsed laser for at least one of the plurality of the masks 1 and 2 based on the edge position prediction information of the wafer pattern, the aerial image of the mask, and the information of the divided patterns formed on the masks. In this way, the position of the divided pattern formed on the mask is repaired. In other words, the pattern position repairing mechanism 450 (a repairing mechanism or a repair unit) receives the edge position information of the wafer acquired by overlaying all the patterns, which are divided into a plurality of parts for the multiple patterning, stored in the storage device 302 (data recording device) that is arbitrarily selected by the data managing apparatus 300 as input and repairs the positions of the some pattern centers in the target frame region of the divided mask pattern 1 formed on the mask 1 by using pulsed laser for at least one mask determined to be repairable based on the edge position information of the wafer pattern, the aerial image of the mask, and the information of the divided patterns formed on the mask, thereby repairing the edge position of the wafer pattern. FIG. 17 illustrates a case where the correction is made using pulsed laser.

More specifically, first, the position correction calculating circuit 424 calculates a place in the target mask 101 at which crystal defects are to be generated and the number of the crystal defects based on the edge position prediction information of the wafer pattern in the target frame region of the target mask 101. Short-pulsed laser such as a femto laser exposing into a micro area introduces a local structure change of a glass substrate (quartz) by a generated crystal defect. In accordance with such a structural change, a volume change in the local area occurs. The pattern position on the mask can be corrected by intentionally applying a local distortion by a crystal defect in a neutral plane (a center plane of the substrate thickness) in the pattern area of the substrate. Thus, in Embodiment 1, the pattern position is corrected by applying an intentionally-generated local distortion to at least one of the masks 1 and 2.

More specifically, the stage 402 is moved such that the target mask 101 is positioned to the target location 401 for repairing mask position acquired through calculation and at a position to which pulsed laser can be emitted. Then, short-pulsed laser is generated by the short-pulsed laser light source 404 to the back face of the mask having no absorber body pattern, and emitted to the crystal defect generation position 401 of the target mask 101 with a calculated density through the optical system 406 of short-pulsed laser for focusing and zooming. At this time, the pulsed laser used for generating a local crystal structure change is accurately focused to the neutral plane of the glass substrate. There are cases where the crystal defect generation position 401 is necessary for each of a plurality of target frame regions. In such cases, by emitting the pulsed laser so as to include the plurality of crystal defect generation positions 401, as a whole, the pattern position in the target frame region (specified region) of the mask 101 can be corrected.

As described above, while the pulsed laser is used for a pattern position correction, the present invention is not limited thereto. For example, by using a pattern position correcting device using a charged particle beam such as an ion beam or an electron beam and a reactive gas, the pattern position may be corrected by locally etching the external shapes of all the patterns in the target frame region that are targets or depositing the absorber material. In a case where the position correction is made by using the charged particle beam, for example, an electron beam, an ion beam, or the like may be used.

Figure 18:
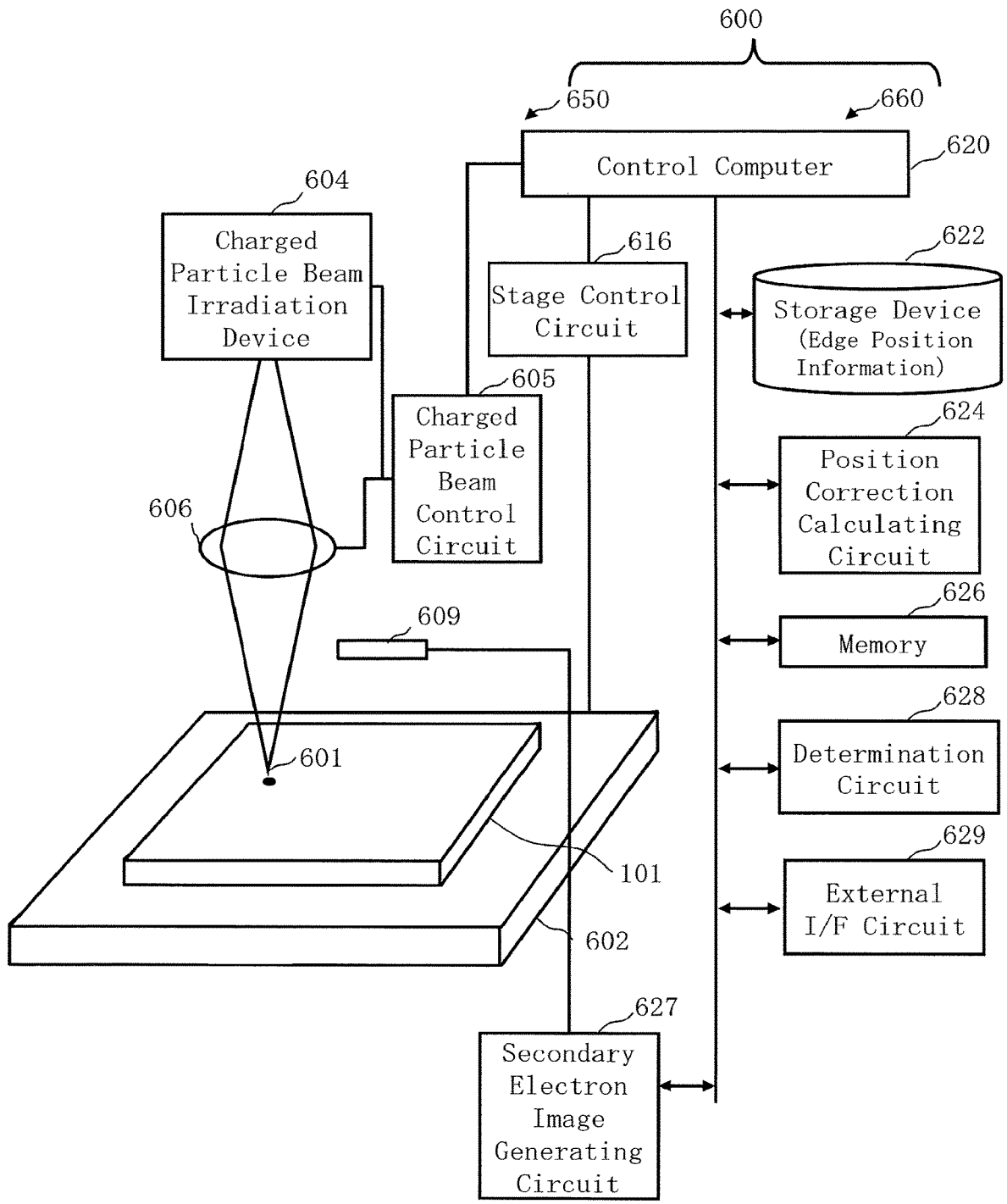
FIG. 18 is a configuration diagram that illustrates another example of the configuration of a pattern position repairing apparatus according to Embodiment 1.

FIG. 18 is a configuration diagram that illustrates another example of the configuration of a pattern position repairing apparatus according to Embodiment 1. In the configuration illustrated in FIG. 18, the pattern position repairing apparatus 600 includes a pattern position repairing mechanism 650 and a control system circuit 660 (control unit).

The pattern position repairing mechanism 650 includes a charged particle beam irradiation device 604, a charged particle beam control circuit 605, an electric magnetic optical system 606 of a charged particle beam, and a secondary electron detector 609. On the stage 602, a mask 101 is mounted. The masks 101 are masks 1 and 2 in which there are no sufficient number of combinations for which the inter-pattern distances of adjacent wafer patterns, which is acquired by using the edge position prediction information of the wafer pattern in the specified region calculated based on the aerial image captured by the aerial image measurement system 200, are in an allowed range at the specified region of the target frame specified by the pattern inspection apparatus 100. Here, a plurality of masks on which the patterns divided into two parts for multiple patterning are formed is included therein. The mask 101, for example, is mounted on the stage 602 with the mask pattern surface up.

In the control system circuit 660, a control computer 620 serving as a computer is connected to a stage control circuit 616, a storage device 622 such as a magnetic disk, a corrected position calculating circuit 624, a memory 626, a secondary electron image generating circuit 627, a determination circuit 628, and an external interface (I/F) circuit 629 through a bus network. The control computer 620 is connected to the charged particle beam control circuit 605 controlling the emission of a charged particle beam through a bus network.

As the pattern repairing process (S232), in a case that the inter-pattern distance is out of the allowed range according to an arbitrary illumination condition and an arbitrary focus condition that are designated when the edge position prediction information of the wafer patterns in the target frames of the masks is overlaid, the pattern position repairing mechanism 650 (repairing mechanism) repairs the shape of the divided pattern formed on the mask by using a charged particle beam for at least one of the plurality of the masks 1 and 2 based on the edge position prediction information of the wafer pattern, the aerial image of the mask, and the information of the divided patterns formed on the masks, thereby repairing the edge of the pattern. In other words, the pattern position repairing mechanism 650 (a repairing mechanism or a repair unit) receives the edge position information of the wafer pattern acquired by combining all the patterns, which are divided into a plurality of parts for the multiple patterning, stored in the storage device 302 (data recording device) that is arbitrarily selected by the data managing apparatus 300 as input and repairs the positions of the some pattern centers in the target frame region of the divided mask pattern 1 formed on the mask 1 by using a charged particle beam for at least one mask determined to be repairable based on the edge position information of the wafer pattern, the aerial image of the mask, and the information of the divided patterns formed on the mask, thereby repairing the edge of the wafer pattern. In other words, by repairing some pattern shapes in the target frame region, the center position of the defected pattern in the target frame region is repaired. Thus the pattern position repairing mechanism 650 repairs center positions of the defected patterns in the specific region, the defected patterns being a part of the corresponding divided pattern in the specific region and being formed on each of the plurality of masks, by repairing the edge of the corresponding divided pattern formed on at least one mask of the plurality of masks by repairing a shape of the corresponding divided pattern formed on the at least one mask on which the defected patterns are formed using a charged particle beam, the at least one mask of the plurality of masks being selected by the control computer including the inter-pattern distance determination processing circuitry, for the specific region having the inter-pattern distance between the edge position of the one of the plurality of wafer patterns and the edge position of the another one of the plurality of wafer patterns in the specific region determined to be out of the allowed range by the determination unit 304. FIG. 18 illustrates a case where the correction is made using an electron beam.

First, the position correction calculating circuit 624 calculates the places in the target mask 101 that are to be etched or deposited and the number of patterns to be etched or deposited based on the edge position prediction information of the wafer pattern of the target frame region of the target mask 101. On a glass substrate (quartz) used for the mask 101, divided patterns are formed by an absorber against the exposure light, which is made from chromium (Cr) or the like, and, by emitting an electron beam in a reactive gas atmosphere, the chromium can be etched, or carbon composites as the absorber can be locally deposited.

Thus, in Embodiment 1, for at least one of the masks 1 and 2, the mask pattern position is intentionally corrected by locally etching or depositing the absorber in some patterns in the target frame region of the target mask.

More specifically, the stage 602 is moved such that the target mask is positioned to which an electron beam can be emitted to a target position 601 acquired through calculation. Then, an electron beam emitted from the charged particle beam irradiation device 604 to the absorber pattern irradiates the target position 601 of the target mask 101 through the electric magnetic optical system 606 of the charged particle beam. At this time, the vacuum atmosphere in the pattern position repairing apparatus 600 is optimized to only a position near the substrate surface in accordance with the absorber etching or the absorber deposition based on the process by locally introducing gas with pre-determined conditions. There are cases where the target position 601 is present for each of a plurality in the target frame regions. By emitting an electron beam to a plurality of the defect positions 601 in an optimized atmosphere with the process, the pattern shape of the target frame region (specified region) of the mask 101 is corrected.

As the secondary electron image generating process (S234), after the correction of the pattern shape, a charged particle beam is generated from the charged particle beam irradiation device 604, and the charged particle beam is emitted to the mask on which a pattern repaired by the electric magnetic optical system 606 of the charged particle beam is formed. Then, generated secondary electrons at the target pattern are detected by the secondary electron detector 609. The detected signal is output to the secondary electron image generating circuit 627. The secondary electron image generating circuit 627 generates a secondary electron image of the divided pattern after the correction. Particularly, the secondary electron image of the pattern in the target frame region (specified region) is generated. The external I/F circuit 629 (an example of an output mechanism) acquires the generated secondary electron image and outputs the acquired secondary electron image to the data managing apparatus 300. The data managing apparatus 300 receives information of the secondary electron image output from the pattern position repairing apparatus 400 as input and stores the information of the secondary electron image in the storage device 302.

The correction of the pattern shape may be made for both of the masks 1 and 2 or any one thereof. After the pattern repairing process (S232), the process is returned to the illumination condition/focus condition setting process (S202) for the mask 1, and, at least a combination of the allowed range exists through the inter-pattern distance determination process (S222), each process up to the pattern repairing process (S232) is repeated. In a case where there is a combination of the allowed range in the inter-pattern distance determination process (S222), the illumination condition/focus condition outputting process (S224) may be executed.

For example, by repeating each step at least two or more times, the possibility of acquiring a combination of the allowed range can be markedly improved.

In the example described above, while the pattern position repairing apparatus 600 has been described as an independent pattern position repairing apparatus, the pattern position repairing apparatus is not limited thereto. A combination of the aerial image measurement system 200, the data managing apparatus 300, and the pattern position repairing apparatus 600 described above may be represented as the pattern position repairing apparatus.

As above, according to Embodiment 1, in a case where a pattern is printed onto a wafer using the multiple-patterning technique by using a plurality of masks on which the pattern divided into a plurality of parts for the multiple patterning is formed, when a pattern inspection is executed by the pattern inspection apparatus for each of the masks, and any critical defects in patterns are not detected, a position deviation of a case where the divided patterns divided for the plurality of masks are overlaid on a wafer by using the multiple-patterning technique can be detected. In addition, in a case where the position deviation is detected, the position deviation occurring among the plurality of masks on which the pattern divided into a plurality of parts for the multiple patterning is formed can be repaired. Furthermore, an illumination condition and a focus condition of a mask for which an inter-pattern distance is in the allowed range on the wafer can be acquired. Then, a result thereof can be transmitted to the exposure apparatus 510. As a result, when the divided pattern formed on each mask is printed onto a wafer by using the multiple-patterning technique, the exposure apparatus 510 can form patterns for which an inter-pattern distance on the wafer is in the allowed range.

Figure 19:
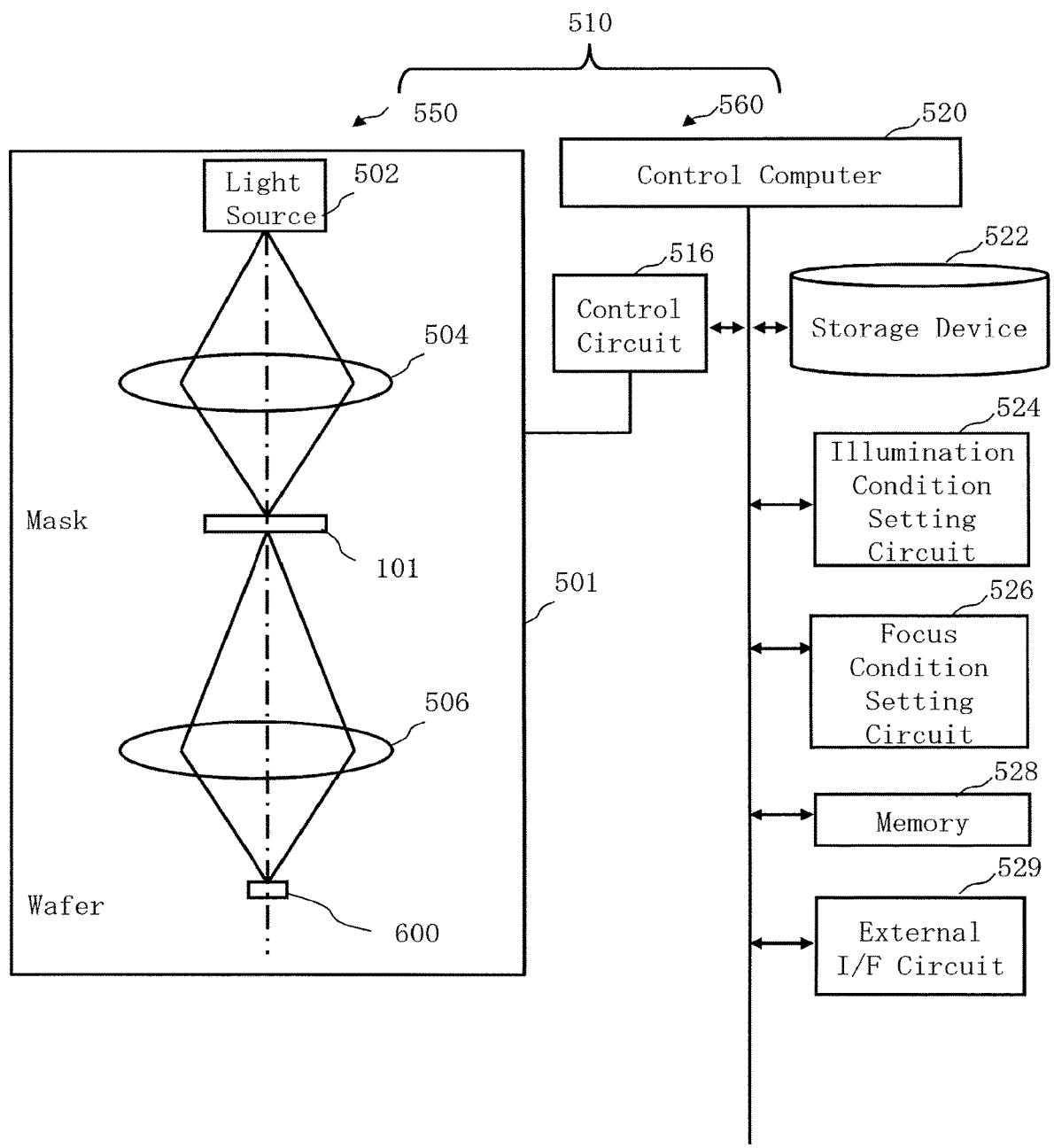
FIG. 19 is a configuration diagram that illustrates the main configuration of an exposure apparatus according to Embodiment 1.

FIG. 19 is a configuration diagram that illustrates the main configuration of the exposure apparatus according to Embodiment 1. In the configuration illustrated in FIG. 19, the exposure apparatus 510 includes an exposure mechanism 550 and a control system circuit 560. In the exposure mechanism 550, an environment chamber 501 used for stabilizing environmental variations, a light source 502, a projection optical system 504, and an image formation optical system 506 are arranged. The light source 502, the projection optical system 504, and the image formation optical system 506 are equipped into the environment chamber 501. In the environment chamber 501, a mask 101 mounted on a mask stage not illustrated in the drawing and a wafer 600 mounted on a wafer stage not illustrated in the drawing are equipped.

In the control system circuit 560, a control computer 520 serving as a computer is connected to a control circuit 516, an illumination condition setting circuit 524, a focus condition setting circuit 526, a storage device 522, an external interface (I/F) circuit 529 (output mechanism), and a memory 528 through a bus network. The control circuit 516 controls and drives the exposure mechanism 550.

The external I/F circuit 529 inputs data output from the pattern inspection apparatus 100, data output from the aerial image measurement system 200, and data output from the pattern position repairing apparatus 400 through the data managing apparatus 300. Each input data is stored in the storage device 522. Among such data, information of a combination of an illumination condition and a focus condition of each mask for which a relative inter-pattern distance in a specified region on a plurality of masks of a case where a plurality of divided patterns are overlaid as one layer of a semiconductor device on a wafer by using the multiple-patterning technique by using the plurality of masks on which a pattern divided into a plurality of parts for the multiple patterning is formed is in the allowed range is included. In addition, among such data, the target frame information output from the pattern inspection apparatus 100 is included. Thus the storage device 522 (magnetic disk device) receives and stores information of combinations of an illumination condition and a focus condition each of which can be applicable to one of divided patterns acquired by dividing a pattern into a plurality of parts for multiple patterning and formed on a plurality of masks, the combinations of an illumination condition and a focus condition so that an inter-pattern distance between an edge position of a wafer pattern of the one of the divided patterns and an edge position of a wafer pattern of the another one of the divided patterns is in an allowed range in a case where edge positions of wafer patterns calculated based on aerial images of the divided patterns captured using a plurality of illumination conditions and a plurality of focus condition for the plurality of masks is overlaid by using alignment marks drawn as parts of the divided patterns.

When a pattern is printed to the wafer 580 using the multiple-patterning technique by using a plurality of masks 1 and 2, the exposure mechanism 550 executes exposure with the illumination condition or the focus condition for each of the plurality of masks used for the exposure being limited based on the information of the combinations. The illumination condition is set by the illumination condition setting circuit 524. The focus condition is set by the focus condition setting circuit 526. In other words, in a case where a pattern is printed to the wafer 580 using the multiple-patterning technique by using any one of the data output from the pattern inspection apparatus 100, the data output from the aerial image measurement system 200, the output data from the data managing apparatus 300, and the data output from the pattern position repairing apparatus 400, the exposure mechanism 550 executes the exposure with a condition that a plurality of illumination conditions or a plurality of focus conditions being applicable to the divided patterns formed on the plurality of masks being limited based on any one of the output data from the pattern inspection apparatus 100, the output data from the aerial image measurement system 200, the output data from the data managing apparatus 300, and the output data from the pattern position repairing apparatus 400. More specifically, with a condition in which the corresponding illumination condition or the corresponding focus condition is set for each mask, exposure light generated from the light source 502 irradiates the masks 101 mounted on the mask stage by the projection optical system 504. Then, exposure light transmitted through the mounted mask 101 forms an image on the wafer 580 by using the image formation optical system 506. In order to compose patterns into one pattern by using the multiple-patterning technique, it is necessary to print a plurality of divided patterns, and accordingly, the masks 1 and 2 on which certain divided patterns are formed are sequentially mounted on the mask stage, and each divided pattern may be printed to the wafer 580.

As above, a method for manufacturing a mask according to Embodiment 1 includes the following processes.

By using the pattern inspection apparatus 100, optical image data of divided patterns formed on masks aligned to the coordinate defined by alignment marks formed as a part of each of the divided patterns by using a plurality of masks 1 and 2 on which a pattern divided into a plurality of parts is formed for the multiple patterning is acquired.

For the plurality of masks 1 and 2 on which divided patterns are formed, a position deviation map is generated in which a position deviation amount of the optical image for each divided pattern is defined by comparing the designed data of each divided pattern based on the designed coordinates with the optical image data aligned to the coordinate defined by the alignment marks formed as a part of the divided pattern.

In addition, by using the pattern inspection apparatus 100, a difference position value map, in which a difference value between relative position deviation amounts of the position deviation maps of divided patterns is defined by using a plurality of masks on which a pattern divided into a plurality of parts is formed using the multiple-patterning technique, representing a position deviation amount of the pattern center at the time of composing the patterns as one layer of a semiconductor device on a wafer by using the masks on which the pattern divided into a plurality of parts is formed using the multiple-patterning technique is generated.

In addition, by using the pattern inspection apparatus 100, a region having a difference value exceeding a threshold of distance between patterns laying side-by-side is specified by using the difference position value map.

Furthermore, at least coordinates, a type of defect, and information of a reference image of the specified region are output for each specified region by using the pattern inspection apparatus 100.

By using the aerial image measurement system 200, specific region information output by the pattern inspection apparatus capable of outputting the specific region information of a specific region having a difference value between relative position deviation amounts of the position deviation maps acquired for masks aligned to the coordinate defined by alignment marks formed as a part of each of the divided patterns exceeding the threshold by using a plurality of masks 1 and 2 on which a pattern divided into a plurality of parts for the multiple patterning is formed is input.

By using the aerial image measurement system 200, for the masks aligned to the coordinate defined by the alignment marks formed as a part of each of the divided patterns, for the specific region specified based on the specified region information of each mask, the aerial images of the masks are captured using the illumination condition and the focus condition used for a pattern exposure that is arbitrarily designated in advance.

In addition, by using the aerial image measurement system 200, for each mask, based on the aerial image of the specific region captured according to the illumination condition and the focus condition used for the exposure arbitrarily designated in advance, for each mask, an exposure simulation and a process simulation are executed, and the edge position of the wafer pattern for each divided pattern is calculated, and, in a case where the wafer patterns calculated based on the divided patterns are overlaid in the specific region, the edge position information of the wafer pattern from which whether or not an inter-pattern distance between the edge positions of the wafer patterns in the specific region is in the allowed range can be determined is generated.

By using the pattern position repairing apparatus 400, the pattern information of a plurality of patterns divided for the multiple patterning, a plurality of pattern information acquired by dividing one pattern stored in the data recording device 302 for the multiple patterning that is arbitrarily selected by the data managing apparatus 300 including the storage device 302 storing information output from the pattern inspection apparatus 100 and the aerial image measurement system 200, and the edge position information between wafer patterns output from the aerial image measurement system 200 are input.

By using the pattern position repairing apparatus 400, in a case where a distance between edges of the wafer patterns in the specific region is out of the allowed range based on the edge position information of the wafer patterns when data of the plurality of divided patterns divided into a plurality of parts for the multiple patterning is selected, and the wafer patterns of the specific region calculated from the divided patterns of the masks that are output from the aerial image measurement system 200 are overlaid under a designated arbitrary illumination condition/focus condition, based on the edge position information of the wafer pattern, for at least one mask among the plurality of masks, the repairability of the pattern is determined.

In addition, by using the pattern position repairing apparatus 600, the pattern information of the plurality of divided patterns divided into a plurality of parts for the multiple patterning, which is stored in the storage device 302, arbitrarily selected by the data managing apparatus 300 is input, and, based on at least one pattern information of the plurality of the divided patterns and the edge position information of the wafer pattern, for at least one mask determined to be repairable, by using a charged particle beam, the shape of the formed wafer pattern is repaired, whereby the edge position of the wafer pattern that is finally printed is repaired. Furthermore, by using the pattern position repairing apparatus 600, after the correction, a secondary electron image according to the charged particle beam of the repaired pattern is acquired and is output.

In the description presented above, each of "yyy circuits" includes a processing circuitry. The processing circuitry includes an electric circuit, a quantum circuit, a computer, a processor, a circuit board, or a semiconductor device, for example. Each of the "yyy circuits" may use the common processing circuitry (same processing circuitry), or may use different processing circuitries (separated processing circuitries). A program is recorded on a recording medium or a storage device such as a magnetic disk device, a magnetic tape device, an FD, or a read only memory (ROM). For example, Each of the stage control circuit 114, the image converting circuit 111, the reference image preparation circuit 112, the pattern comparison circuit 108, the position deviation map (pos map) generating circuit 140, and the difference pos map generating circuit 144 includes a processing circuitry. For example, each circuit may be realized by the control computer 110.

As above, the embodiment has been described with reference to specific examples. However, the present invention is not limited to such specific examples. For example, in the embodiment, while an illumination optical system using transmitted light has been illustrated as the illumination optical system 170, the present invention is not limited thereto. For example, an illumination optical system using reflective light may be used. Alternatively, the combination of the transmitted light and the reflective light in the illumination optical system may be used together.

While parts such as a device configuration and a control technique that are not directly necessary for the description of the present invention and the like have not been described, a device configuration or a control technique that is necessary may be appropriately selected and used. For example, while the configuration of a control unit controlling the pattern inspection apparatus 100 has not been described, it is apparent that the configuration of the control unit that is necessary may be appropriately selected and used.

In addition, all of a pattern inspection apparatus, a method of measuring an aerial image, a method of repairing a pattern position, a data processing method, and a method for manufacturing a mask for multiple patterning that include the elements of the present invention and can be appropriately changed in design by those skilled in art belong to the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for measuring an aerial image, the method comprising:

receiving specific region information output by a pattern inspection apparatus or a pattern position measurement apparatus configured to output the specific region information of a specific region having a difference value between a first position deviation amount and a second position deviation amount exceeding a threshold of distance between patterns laying side-by-side, the first position deviation amount acquired by comparing optical image data of a first divided pattern of a first mask with design pattern data of the first divided pattern, the first mask being aligned to a coordinate defined by alignment marks formed as a part of the first divided pattern, the second position deviation amount acquired by comparing optical image data of a second divided pattern of a second mask with design pattern data of the second divided pattern, the second mask being aligned to a coordinate defined by alignment marks formed as a part of the second divided pattern, the first mask being different from the second mask, the first divided pattern being different from the second divided pattern, and the first divided pattern and the second divided pattern being portions of a larger pattern;

capturing aerial images of the first mask and the second mask for the specific region specified based on the specific region information using a plurality of illumination conditions and a plurality of focus conditions;

calculating first edge position information defining an edge position of a wafer pattern acquired through lithographic processes with the first divided pattern based on the aerial images of the first mask for the specific region;

calculating second edge position information defining an edge position of a wafer pattern acquired through lithographic processes with the second divided pattern based on the aerial images of the second mask for the specific region; and outputting the first and second edge position information for determining whether or not an inter-pattern distance between the edge position of the wafer pattern of the first divided pattern and the edge position of the wafer pattern of the second divided pattern calculated for the specific region is in an allowed range in a case where the edge position of the wafer pattern of the first divided pattern and the edge position of the wafer pattern of the second divided pattern calculated for the specific region are composed to be overlaid using the alignment marks of the first mask and the alignment marks of the second mask as a reference.

2. A method for repairing a pattern position, the method comprising:

using a pattern position repairing apparatus including a repairing mechanism configured to repair center positions of defected patterns in a specific region by repairing an edge position of a divided pattern formed on at least one mask of a first mask and a second mask different from the first mask by repairing a shape of the divided pattern formed on the at least one mask on which the defected patterns are formed using a charged particle beam, the specific region being determined to be out of an allowed range by a control computer programmed to determine whether or not an inter-pattern distance between an edge position of a wafer pattern of a first divided pattern of the first mask and an edge position a wafer pattern of a second divided pattern of the second mask in the specific region is in the allowed range in a case where the edge position of wafer pattern of the first divided pattern and the edge position of the wafer pattern of the second divided pattern in the specific region are composed so as to be overlaid using alignment marks of the first mask and alignment marks of the second mask as a reference, the first divided pattern being different from the second divided pattern, the first divided pattern and the second divided pattern being portions of a larger pattern, and the repairing of the edge position being based on:

specific region information output by a pattern inspection apparatus or a pattern position measurement apparatus configured to output the specific region information of the specific region having a difference value between a first position deviation amount and a second position deviation amount exceeding a threshold of distance between patterns laying side-by-side, the first position deviation amount acquired by comparing optical image data of the first divided pattern and design pattern data of the first divided pattern, the first mask being aligned to a coordinate defined by alignment marks formed as a part of the first divided pattern, the second position deviation amount acquired by comparing optical image data of a second divided pattern with design pattern data of the second divided pattern, and the second mask being aligned to a coordinate defined by alignment marks formed as a part of the second divided pattern;

aerial images captured for the specific region output by an aerial image measurement system configured to output:

aerial images of the first and second masks captured for the specific region specified based on the specific region information using a plurality of illumination conditions and a plurality of focus conditions, first edge position information defining the edge position of the wafer pattern acquired through lithographic processes with the first divided pattern based on the aerial images of the first mask for the specific region, and second edge position information defining the edge position of the wafer pattern acquired through lithographic processes with the second divided pattern based on the aerial images of the second mask for the specific region; and the first and second edge position information output by the aerial image measurement system.

3. A method for processing aerial image data, the method comprising:

receiving specific region information output by a pattern inspection apparatus or a pattern position measurement apparatus configured to output the specific region information of a specific region having a difference value between a first position deviation amount and a second position deviation amount exceeding a threshold of distance between patterns laying side-by-side, the first position deviation amount acquired by comparing optical image data of a first divided pattern of a first mask with design pattern data of the first divided pattern, the first mask being aligned to a coordinate defined by alignment marks formed as a part of the first divided pattern, the second position deviation amount acquired by comparing optical image data of a second divided pattern of a second mask with design pattern data of the second divided pattern, the second mask being aligned to a coordinate defined by alignment marks formed as a part of the second divided pattern, the first mask being different from the second mask, the first divided pattern being different from the second divided pattern, and the first divided pattern and the second divided pattern being portions of a larger pattern;

capturing aerial images of the first and second masks for the specific region specified based on the specific region information using a plurality of illumination conditions and a plurality of focus conditions;

calculating first edge position information defining an edge position of a wafer pattern acquired through lithographic processes with the first divided pattern based on the aerial images of the first mask captured for the specific region;

calculating second edge position information defining an edge position of a wafer pattern acquired through lithographic processes with the second divided pattern based on the aerial images of the second mask captured for the specific region;

determining whether or not an inter-pattern distance between the edge position of the wafer pattern of the first divided pattern and the edge position of the wafer pattern of the second divided pattern calculated in the specific region is in an allowed range in a case where the edge position of the wafer pattern of the first divided pattern and the edge position of the wafer pattern of the second divided pattern calculated in the specific region are composed so as to be overlaid using the alignment marks of the first mask and the alignment marks of the second as a reference; and outputting information of each combination of an illumination condition and a focus condition for the first and second divided patterns where the inter-pattern distance between the edge position of the wafer pattern of the first divided pattern and the edge position of the wafer pattern of the second divided pattern which is determined to be within the allowed range.

4. A method for exposing a pattern, the method comprising:

receiving information of combinations of an illumination condition and a focus condition for each of which can be applicable to one of a first divided pattern of a first mask and a second divided pattern of a second mask, the first mask being different from the second mask, the first divided pattern being different from the second divided pattern, and the first divided pattern and the second divided pattern being portions of a larger pattern, the combinations being combinations of the illumination condition and the focus condition where an inter-pattern distance between an edge position of a wafer pattern of the first divided pattern and an edge position of a wafer pattern of the second divided pattern is determined to be within an allowed range in a case where the edge position of the wafer pattern of the first divided pattern calculated based on aerial images of the first divided pattern and the edge position of the wafer pattern of the second divided pattern calculated based on aerial images of the second divided pattern, both captured using a plurality of illumination conditions and a plurality of focus conditions for the first and second masks, are composed to be overlaid using alignment marks of the first divided pattern and alignment marks of the second divided pattern; and executing exposure with the illumination condition or the focus condition for each of the first and second masks used for the exposure based on the information of the combinations in a case that the larger pattern is printed to a wafer using a multiple-patterning technique using the first and second masks.

5. A method for manufacturing a mask on which a divided pattern of divided patterns acquired by dividing a pattern into a plurality of parts for multiple patterning is formed, the method comprising:

receiving specific region information output by a pattern inspection apparatus or a pattern position measurement apparatus configured to output the specific region information of a specific region having a difference value between a first position deviation amount and a second position deviation amount exceeding a threshold of distance between patterns laying side-by-side, the first position deviation amount acquired by comparing optical image data of a first divided pattern of a first mask with design pattern data of the first divided pattern, the first mask being aligned to a coordinate defined by alignment marks formed as a part of the first divided pattern, the second position deviation amount acquired by comparing optical image data of a second divided pattern of a second mask with design pattern data of the second divided pattern, the second mask being aligned to a coordinate defined by alignment marks formed as a part of the second divided pattern, the first mask being different from the second mask, the first divided pattern being different from the second divided pattern, and the first divided pattern and the second divided pattern being portions of a larger pattern;

capturing aerial images of the first and second masks for the specific region specified based on the specific region information using a plurality of illumination conditions and a plurality of focus conditions;

calculating first edge position information defining an edge position of a wafer pattern acquired through lithographic processes with the first divided pattern based on the aerial images of the first mask captured for the specific region;

calculating second edge position information defining an edge position of a wafer pattern acquired through lithographic processes with the second divided pattern based on the aerial images of the second mask captured for the specific region;

determining whether or not an inter-pattern distance between the edge position of the wafer pattern of the first divided pattern and the edge position of the wafer pattern of the second divided pattern calculated for the specific region is in an allowed range in a case where the edge position of the wafer pattern of the first divided pattern and the edge position of the wafer pattern of the second divided pattern calculated for the specific region are composed to be overlaid using the alignment marks of the first mask and the alignment marks of the second mask as a reference; and outputting information of each combination of an illumination condition and a focus condition for the first and second divided patterns where the inter-pattern distance between the edge position of the wafer pattern of the first divided and the edge position of the wafer pattern of the second divided pattern is determined to be within the allowed range.

6. The method according to claim 5, wherein the first and second edge position information is calculated through an exposure simulation and a process simulation based on the aerial images of the specific region, and the method further comprises outputting the calculated first and second edge position information together with a result of the determination whether or not the inter-pattern distance is in the allowed range.

7. The method according to claim 6, wherein the aerial images of the specific region of each of the first and second masks are captured according to the plurality of illumination conditions and the plurality of focus conditions.

8. A method for manufacturing a mask, the method comprising:

acquiring optical image data of a first divided pattern of a first mask and a second divided pattern of a second mask, the first mask being different from the second mask, the first divided pattern being different from the second divided pattern, the first divided pattern and the second divided pattern being portions of a larger pattern, the first mask being aligned to a coordinate defined by alignment marks formed as a part of the first divided pattern, and the second mask being aligned to a coordinate defined by alignment marks formed as a part of the second divided pattern;

generating a first position deviation map in which a first position deviation at a center coordinate of each minimum element is defined for the first divided pattern, the first position deviation being represented as a deviation from the coordinate defined by the alignment marks formed as the part of the first divided pattern using a first position deviation amount of the first divided pattern acquired by comparing the optical image data of the first divided pattern with design pattern data of the first divided pattern;

generating a second position deviation map in which a second position deviation at a center coordinate of each minimum element is defined for the second divided pattern, the second position deviation being represented as a deviation from the coordinate defined by the alignment marks formed as the part of the second divided pattern using a second position deviation amount of the second divided pattern acquired by comparing the optical image data of the second divided pattern with design pattern data of the second divided pattern;

generating a difference position value map defining a difference value between the first position deviation amount and the second position deviation amount of each minimum element of the first and second position deviation maps;

specifying at least one specific region having the difference value exceeding a threshold of distance between patterns laying side-by-side using the difference position value map;

outputting specific region information of at least coordinates, a type of defect, and information of a reference image of each of the at least one specific region;

storing the specific region information of the specific region;

capturing aerial images of the first and second masks for the specific region specified based on the specific region information using a plurality of illumination conditions and a plurality of focus conditions;

calculating first edge position information defining an edge position of a wafer pattern acquired through lithographic processes with the first divided pattern based on the aerial images of first mask captured for the specific region;

calculating second edge position information defining an edge position of a wafer pattern acquired through lithographic processes with the second divided pattern based on the aerial images of second mask captured for the specific region;

determining whether or not an inter-pattern distance between the edge position of the wafer pattern of the first divided pattern and the edge position of the wafer pattern of the second divided pattern calculated for the specific region is in an allowed range in a case where the edge position of the wafer pattern of the first divided pattern and the edge position of the wafer pattern of the second divided pattern calculated for the specific region are composed to be overlaid using the alignment marks of the first mask and the alignment marks of the second mask as a reference, and repairing edge positions of defected patterns in the specific region by repairing a shape of a divided pattern formed on at least one mask determined to be repairable using a charged particle based on information of the defected patterns formed on the first and second masks and configuring the specific region, the first edge position information, and the second edge position information.

9. A method for manufacturing a mask, the method comprising:

acquiring optical image data of a first divided pattern of a first mask and a second divided pattern of a second mask, the first mask being different from the second mask, the first divided pattern being different from the second divided pattern, the first divided pattern and the second divided pattern being portions of a larger pattern, the first mask being aligned to a coordinate defined by alignment marks formed as a part of the first divided pattern, and the second mask being aligned to a coordinate defined by alignment marks formed as a part of the second divided pattern;

measuring, as a pattern position, a position of a center of gravity of a pattern acquired from position information of an arbitral pattern edge designated in advance as a measuring condition using the optical data of the first and second divided patterns;

generating a first position deviation map in which a first position deviation at a center coordinate of each minimum element is defined for the first divided pattern, the first position deviation being represented as a deviation from the coordinate defined by the alignment marks formed as the part of the first divided pattern using a first position deviation amount of the first divided pattern acquired by comparing a first position of a pattern included in the optical image data of the first divided pattern with a first position of a pattern acquired from design pattern data of the first divided pattern;

generating a second position deviation map in which a second position deviation at a center coordinate of each minimum element is defined for the second divided pattern, the second position deviation being represented as a deviation from the coordinate defined by the alignment marks formed as the part of the second divided pattern using a second position deviation amount of the second divided pattern acquired by comparing a second position of a pattern included in the optical image data of the second divided pattern with a second position of a pattern acquired from design pattern data of the second divided pattern;

generating a difference position value map defining a difference value between the first position deviation amount and the second position deviation amount of each minimum element of the first and second position deviation maps;

specifying at least one specific region having the difference value exceeding a threshold of distance between patterns laying side-by-side using the difference position value map;

outputting specific region information of at least design coordinates of an objective pattern for pattern position measurement, position deviation of a measured pattern against a design position of the objective pattern, and information of a captured image of each the at least one specific region;

storing the specific region information of the specific region for the first and second masks;

capturing aerial images of the first and second masks for the specific region specified based on the specific region information using a plurality of illumination conditions and a plurality of focus conditions;

calculating first edge position information defining an edge position of a wafer pattern acquired through lithographic processes with the first divided pattern based on the aerial images of the first mask captured for the specific region;

calculating second edge position information defining an edge position of a wafer pattern acquired through lithographic processes with the second divided pattern based on the aerial images of the second mask captured for the specific region;

determining whether or not an inter-pattern distance between the edge position of the wafer pattern of the first divided pattern and the edge position of the wafer pattern of the second divided pattern calculated for the specific region is in an allowed range in a case where the edge position of the wafer pattern of the first divided pattern and the edge position of the wafer pattern of the second divided pattern calculated for the specific region are composed to be overlaid using the alignment marks of the first mask and the alignment marks of the second mask as a reference, and repairing edge positions of defected patterns in the specific region by repairing a shape of a divided pattern formed on at least one mask determined to be repairable using a charged particle beam based on information of the defected patterns formed on the first and second masks and configuring the specific region, the first edge position information, and the second edge position information.

10. A method for manufacturing a mask on which a divided pattern of divided patterns acquired by dividing a pattern into a plurality of parts for multiple patterning is formed, the method comprising:

a step for capturing aerial images of a specific region common to a first mask having a first divided pattern formed thereon and a second mask having a second divided pattern formed therein using a plurality of illumination conditions and a plurality of focus conditions, the first mask being different from the second mask, the first divided pattern being different from the second divided pattern, the first divided pattern and the second divided pattern being portions of a larger pattern;

a step for calculating first edge position information defining an edge position of a wafer pattern acquired through lithographic processes with the first divided pattern based on the aerial images of the first mask captured for the specific region;

a step for calculating second edge position information defining an edge position of a wafer pattern acquired through lithographic processes with the second divided pattern based on the aerial images of the second mask captured for the specific region;

a step for determining whether or not an inter-pattern distance between the edge position of the wafer pattern of the first divided pattern and the edge position of the wafer pattern of the second divided pattern calculated for the specific region is in an allowed range in a case where the edge position of the wafer pattern of the first divided pattern and the edge position of the wafer pattern of the second divided pattern calculated for the specific region are composed to be overlaid using alignment marks of the first mask and alignment marks of the second mask as a reference; and a step for repairing a shape of a defected pattern in the specific region of a divided pattern formed on at least one mask among the first and second masks using a charged particle beam in a case where the inter-pattern distance is determined to be out of the allowed range, wherein each step is repeated at least two or more times.

11. A method for exposing a pattern, the method comprising:

a step for acquiring optical image data of a first divided pattern of a first mask and a second divided pattern of a second mask, the first mask being different from the second mask, the first divided pattern being different from the second divided pattern, the first divided pattern and the second divided pattern being portions of a larger pattern, the first mask being aligned to a coordinate defined by alignment marks formed as a part of the first divided pattern, and the second mask being aligned to a coordinate defined by alignment marks formed as a part of the second divided pattern;

a step for generating a first position deviation map in which a first position deviation at a center coordinate of each minimum element is defined for the first divided pattern, the first position deviation being represented as a deviation from the coordinate defined by the alignment marks formed as the part of the first divided pattern using a first position deviation amount of the first divided pattern acquired by comparing the optical image data of the first divided pattern with design pattern data of the first divided pattern;

a step for generating a second position deviation map in which a second position deviation at a center coordinate of each minimum element is defined for the second divided pattern, the second position deviation being represented as a deviation from the coordinate defined by the alignment marks formed as the part of the second divided pattern using a second position deviation amount of the second divided pattern acquired by comparing the optical image data of the second divided pattern with design pattern data of the second divided pattern;

a step for generating a difference position value map defining a difference value between the first position deviation amount and the second position deviation amount of each minimum element of the first and second position deviation maps;

a step for specifying at least one specific region having the difference value exceeding a threshold of distance between patterns laying side-by-side using the difference position value map;

a step for outputting specific region information of at least coordinates, a type of defect, and information of a reference image of each of the at least one specific region;

a step for receiving and storing the specific region information;

a step for capturing aerial images of the first and second masks for the specific region specified based on the specific region information using a plurality of illumination conditions and a plurality of focus conditions;

a step for outputting the aerial images for the specific region of the first and second masks; and a step for calculating first edge position information defining an edge position of a wafer pattern acquired through lithographic processes with the first divided pattern based on the aerial images of the first mask captured for the specific region;

a step for calculating second edge position information defining an edge position of a wafer pattern acquired through lithographic processes with the second divided pattern based on the aerial images of the second mask captured for the specific region;

a step for determining whether or not an inter-pattern distance between the edge position of the wafer pattern of the first divided pattern and the edge position of the wafer pattern of the second divided pattern calculated for the specific region is in an allowed range in a case where the edge position of the wafer pattern of the first divided pattern and the edge position of the wafer pattern of the second divided pattern calculated for the specific region are composed to be overlaid using the alignment marks of the first mask and the alignment marks of the second mask as a reference;

a step for inputting information of the first and second divided patterns, the first edge position information, and the second edge position information;

a step for selecting data of the first and second divided patterns and determining a repairability of a pattern shape for at least one mask among the first and second masks based on edge position information calculated in the plurality of illumination conditions and the plurality of focus conditions in a case where the inter-pattern distance is determined to be out of the allowed range in the plurality of illumination conditions and the plurality of focus conditions;

a step for repairing edge positions of defected patterns in the specific region by repairing a shape of a divided pattern formed on the at least one mask using a charged particle beam based on information of the defected patterns formed on the first and second masks and configuring the specific region, the first edge position information, and the second edge position information;

a step for acquiring a secondary electron image generated due to a charged particle beam for the defected patterns repaired and output the secondary electron image after the repairing;

a step for inputting information of each combination of an illumination condition and a focus condition for the first and second divided patterns where the inter-pattern distance is determined to be within the allowed range in a case where the edge position of the wafer pattern of the first divided pattern and the edge position of the wafer pattern of the second divided pattern calculated based on the aerial images of the first and second of masks captured for the specific region using the plurality of illumination conditions and the plurality of focus conditions are composed so as to be overlaid using the alignment marks of the first mask and the alignment marks of the second mask as a reference; and a step for executing exposure based on any one of the specific region information, the aerial images for the specific region of the first and second masks, each combination of the illumination condition and the focus condition for the first and second divided patterns, and the secondary electron image.

* * * * *